US006965141B2

(12) United States Patent
Mikawa

(10) Patent No.: US 6,965,141 B2
(45) Date of Patent: Nov. 15, 2005

(54) FERROELECTRIC MEMORY AND METHOD FOR MANUFACTURING THE SAME

(75) Inventor: Takumi Mikawa, Kyoto (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 10/957,618

(22) Filed: Oct. 5, 2004

(65) Prior Publication Data

US 2005/0041505 A1   Feb. 24, 2005

Related U.S. Application Data

(62) Division of application No. 09/968,948, filed on Oct. 3, 2001.

(30) Foreign Application Priority Data

Oct. 17, 2000   (JP) .............................. 2000-316033

(51) Int. Cl.[7] .................. H01L 21/8239; H01L 27/105
(52) U.S. Cl. ...................... 257/310; 257/295; 257/532
(58) Field of Search ............................... 257/295–313, 257/532

(56) References Cited

U.S. PATENT DOCUMENTS 5,567,636 A    10/1996   Jones, Jr.
5,773,314 A *   6/1998   Jiang et al. ..................... 438/3
5,796,133 A     8/1998   Kwon et al.
6,188,098 B1 *  2/2001   Amanuma .................. 257/306
6,211,035 B1 *  4/2001   Moise et al. ................ 438/396
6,313,539 B1   11/2001   Yokoyama et al.
6,459,111 B1   10/2002   Natori et al.

FOREIGN PATENT DOCUMENTS

JP          11-8355        1/1999
JP          11-121704      4/1999

* cited by examiner

*Primary Examiner*—Howard Weiss
*Assistant Examiner*—Marcos D. Pizarro-Crespo
(74) *Attorney, Agent, or Firm*—Nixon Peabody LLP; Donald R. Studebaker

(57) ABSTRACT

A capacitor upper electrode and a wiring are electrically connected to each other by using a plug and a conductive layer formed below a capacitive element without using a plug that directly connects the capacitor upper electrode to the wiring provided thereon via an interlayer insulating film therebetween. Alternatively, the capacitor upper electrode is covered by a conductive hydrogen barrier film, and the capacitor upper electrode and the wiring are electrically connected to each other via both a plug connecting the wiring and the conductive hydrogen barrier film to each other and the conductive hydrogen barrier film.

5 Claims, 37 Drawing Sheets

FERROELECTRIC MEMORY AND METHOD FOR MANUFACTURING THE SAME

BACKGROUND OF THE INVENTION

The present invention relates to a ferroelectric memory including a capacitive element in which a ferroelectric film is used as a capacitor insulative film, and a method for manufacturing the same.

It is most important for realizing a ferroelectric memory to develop a device structure and a manufacturing method therefor that allow for integration without deteriorating the characteristics of the capacitive element.

Particularly, since a ferroelectric film is a layered oxide film having oxygen atoms, it is easily reduced in a hydrogen atmosphere, thereby leading to deterioration of the characteristics of the ferroelectric film such as a reduction in polarizability or voltage endurance. Meanwhile, semiconductor memory manufacturing often employs integration processes that are performed in a hydrogen atmosphere or a reducing atmosphere. Therefore, in cases where a ferroelectric film is used as a capacitor insulative film of a capacitive element, it is important to construct a process that is highly resistant to reduction.

In view of this, various measures have been taken in the prior art to prevent the characteristics of a capacitive element from deteriorating during the manufacture of a ferroelectric memory, e.g., reducing the amount of hydrogen to be generated or suppressing the reducing atmosphere in subsequent steps after the formation of the capacitive element, or covering a capacitive element section by an insulative hydrogen barrier film.

A ferroelectric memory according to a first conventional example will now be described with reference to FIG. 36.

As illustrated in FIG. 36, a device isolation region 11 having an STI (shallow trench isolation) structure is formed in a surface portion of a semiconductor substrate 10, and a low-concentration impurity diffusion layer 12 to be the lower layer and a high-concentration impurity diffusion layer 13 to be the upper layer are formed in a surface portion of each region of the semiconductor substrate 10 surrounded by the device isolation region 11. The low-concentration impurity diffusion layer 12 and the high-concentration impurity diffusion layer 13 are to be a source region or a drain region of a transistor forming a part of a memory cell (hereinafter referred to as a "memory cell transistor").

Moreover, a first interlayer insulating film 14 is formed on the semiconductor substrate 10, on which the memory cell transistor has been formed, and a first plug 15 made of tungsten and connected to the high-concentration impurity diffusion layer 13 is formed through the first interlayer insulating film 14. A capacitor lower electrode 16 is formed on the first interlayer insulating film 14. The capacitor lower electrode 16 is made of a conductive film having an oxygen barrier property and covers the upper surface of the first plug 15. An insulative film 17 is formed in each region between adjacent capacitor lower electrodes 16 so that the upper surface thereof is coplanar with the upper surface of the capacitor lower electrode 16.

Moreover, a capacitor insulative film 18 made of a ferroelectric film is formed on the capacitor lower electrode 16 so as to cover the upper surface of the capacitor lower electrode 16, and a capacitor upper electrode 19 made of Pt (platinum) is formed on the capacitor insulative film 18 so as to cover the upper surface of the capacitor insulative film 18. Thus, a capacitive element, including the capacitor lower electrode 16, the capacitor insulative film 18 and the capacitor upper electrode 19, is formed.

Moreover, a second interlayer insulating film 20 is formed on the first interlayer insulating film 14 including the capacitive element, and a second plug 21 made of tungsten and connected to the capacitor upper electrode 19 is formed through the second interlayer insulating film 20.

Moreover, a wiring 22 made of aluminum, or the like, and connected to the second plug 21 is formed on the second interlayer insulating film 20, and a third interlayer insulating film 23 is formed on the second interlayer insulating film 20 including the wiring 22. A third plug 24 connected to the wiring 22 is formed through the third interlayer insulating film 23.

Although not shown, a further interlayer insulating film, a further wiring, a surface protection film, etc., are formed on the third interlayer insulating film 23 to complete the ferroelectric memory.

With the device structure of the ferroelectric memory according to the first conventional example, integration can be realized.

A ferroelectric memory according to a second conventional example will now be described with reference to FIG. 37.

The ferroelectric memory of the second conventional example differs from that of the first conventional example in that the capacitive element section, including the capacitor lower electrode 16, the capacitor insulative film 18 and the capacitor upper electrode 19, is covered by an insulative hydrogen barrier film 25, as illustrated in FIG. 37 (see Japanese Laid-Open Patent Publication No. 11-121704). Note that the insulative hydrogen barrier film 25 may be an SiN film, an SiON film, a $TiO_2$ film, $TaO_x$ (where x>0) film, or the like.

With the device structure of the ferroelectric memory according to the second conventional example, it is possible to prevent the characteristics of the capacitive element from deteriorating during the manufacturing process.

With the first conventional example, however, a portion of the capacitor upper electrode 19 is exposed upon formation of a contact hole through the second interlayer insulating film 20, in which the second plug 21 connecting the capacitor upper electrode 19 and the wiring 22 to each other is to be formed. As a result, hydrogen included in an etching gas or a resist is absorbed by the capacitor upper electrode 19, i.e., a Pt film. Also when a $WF_6$ (tungsten hexafluoride) gas is used with another gas such as a hydrogen gas or a silane gas (both of which reduce the $WF_6$ gas to produce W (tungsten)) in order to form the second plug 21 embedded in the contact hole, hydrogen (including hydrogen that is produced through decomposition of a silane gas) is absorbed by the Pt film of the capacitor upper electrode 19. Then, hydrogen absorbed by the Pt film is later discharged from the Pt film as highly active hydrogen (hereinafter referred to as "active hydrogen") in subsequent steps. In other words, the Pt film has a catalytic function. As a result, a portion of the ferroelectric film of the capacitor insulative film 18 in the vicinity of the second plug 21 is reduced, and deprived of oxygen, by the active hydrogen produced by the catalytic function of the Pt film, thereby deteriorating the characteristics of the ferroelectric film, which may lead to a bit failure, etc., in the ferroelectric memory.

In the second conventional example, although the capacitive element section is covered by the insulative hydrogen barrier film 25, as illustrated in FIG. 37, a portion of the capacitor upper electrode 19 will still be exposed upon formation of a lower part of the contact hole through the insulative hydrogen barrier film 25, in which the second plug 21 is to be formed. Therefore, problems as those encountered by the first conventional example are likely to occur.

Even if a Pt film, which is advantageous for the crystal growth of a ferroelectric film (typically performed after the formation of the capacitor upper electrode 19), is not used in the first or second conventional example, it is difficult to completely prevent a portion of the ferroelectric film of the capacitor insulative film 18 in the vicinity of the second plug 21 from being damaged by hydrogen.

SUMMARY OF THE INVENTION

In view of the above, an object of the present invention is to improve the reliability of a ferroelectric memory by preventing the characteristics of a ferroelectric film forming a capacitor insulative film from deteriorating.

In order to achieve the object, a first ferroelectric memory according to the present invention includes: a transistor formed in one region on a semiconductor substrate; a conductive layer formed in another region on the semiconductor substrate; a first interlayer insulating film formed on the semiconductor substrate including the transistor and the conductive layer; a capacitor lower electrode formed on the first interlayer insulating film; a capacitor insulative film made of a ferroelectric film and formed on the capacitor lower electrode; a capacitor upper electrode formed on the capacitor insulative film so as to extend beyond an area of the capacitor insulative film; a second interlayer insulating film formed on the first interlayer insulating film including the capacitor upper electrode; a wiring formed on the second interlayer insulating film; a first plug formed through the first interlayer insulating film so as to connect the transistor and the capacitor lower electrode to each other; a second plug formed through the first interlayer insulating film so as to electrically connect the conductive layer and the capacitor upper electrode to each other; and a third plug formed through the first interlayer insulating film and the second interlayer insulating film so as to connect the conductive layer and the wiring to each other.

In the first ferroelectric memory, the transistor formed on the semiconductor substrate is connected to the capacitor lower electrode on the first interlayer insulating film via the first plug formed through the first interlayer insulating film on the transistor. Moreover, the capacitor upper electrode formed on the capacitor insulative film so as to extend beyond the area of the capacitor insulative film is electrically connected to the conductive layer formed on the semiconductor substrate via the second plug formed through the first interlayer insulating film. Furthermore, the wiring formed on the capacitor upper electrode via the second interlayer insulating film is connected to the conductive layer via the third plug formed through the first interlayer insulating film and the second interlayer insulating film. Therefore, before the formation of the capacitor upper electrode, more specifically, simultaneously with the formation of the first plug connecting the transistor and the capacitor lower electrode to each other, the second plug electrically connecting the capacitor upper electrode and the conductive layer to each other can be formed through the first interlayer insulating film. Thus, the capacitor upper electrode and the wiring can be electrically connected to each other via the second plug, the conductive layer and the third plug. In other words, the capacitor upper electrode and the wiring can be electrically connected to each other by using the second plug and the conductive layer, which are formed in advance below the capacitive element. Therefore, it is not necessary, after the formation of the capacitor upper electrode, to form a contact hole for forming a plug therein that directly connects the capacitor upper electrode and the wiring to each other, thereby preventing the capacitor upper electrode from being exposed to a hydrogen atmosphere or a reducing atmosphere. As a result, even when a Pt film having a strong catalytic function is used as the capacitor upper electrode, deterioration of the characteristics of the ferroelectric film forming the capacitor insulative film is prevented, thereby improving the reliability of the ferroelectric memory.

A second ferroelectric memory according to the present invention includes: a transistor formed in one region on a semiconductor substrate; a conductive layer formed in another region on the semiconductor substrate; a first interlayer insulating film formed on the semiconductor substrate including the transistor and the conductive layer; a capacitor lower electrode formed on the first interlayer insulating film; a capacitor insulative film made of a ferroelectric film and formed on the capacitor lower electrode so as to extend beyond an area of the capacitor lower electrode; an opening provided in a portion of the capacitor insulative film that is outside the area of the capacitor lower electrode; a capacitor upper electrode formed on the capacitor insulative film including the opening; a second interlayer insulating film formed on the first interlayer insulating film including the capacitor upper electrode; a wiring formed on the second interlayer insulating film; a first plug formed through the first interlayer insulating film so as to connect the transistor and the capacitor lower electrode to each other; a second plug formed through the first interlayer insulating film so as to electrically connect the conductive layer and the capacitor upper electrode to each other via the opening; and a third plug formed through the first interlayer insulating film and the second interlayer insulating film so as to connect the conductive layer and the wiring to each other.

In the second ferroelectric memory, the transistor formed on the semiconductor substrate is connected to the capacitor lower electrode on the first interlayer insulating film via the first plug formed through the first interlayer insulating film on the transistor. Moreover, the capacitor upper electrode formed on the capacitor insulative film which extends beyond the area of the capacitor lower electrode and has an opening outside the area of the capacitor lower electrode is electrically connected to the conductive layer formed on the semiconductor substrate via the second plug formed through the first interlayer insulating film. Furthermore, the wiring formed on the capacitor upper electrode via the second interlayer insulating film is connected to the conductive layer via the third plug formed through the first interlayer insulating film and the second interlayer insulating film. Therefore, before the formation of the capacitor upper electrode, more specifically, simultaneously with the formation of the first plug connecting the transistor and the capacitor lower electrode to each other, the second plug electrically connecting the capacitor upper electrode and the conductive layer to each other can be formed through the first interlayer insulating film. Thus, the capacitor upper electrode and the wiring can be electrically connected to each other via the second plug, the conductive layer and the third plug. In other words, the capacitor upper electrode and the wiring can be electrically connected to each other by using the second plug and the conductive layer, which are formed in advance below the capacitive element. Therefore, it is not necessary, after the formation of the capacitor upper electrode, to form a contact hole for forming a plug therein that directly connects the capacitor upper electrode and the wiring to each other, thereby preventing the capacitor upper electrode from being exposed to a hydrogen atmosphere or a reducing atmosphere. As a result, even when a Pt film having a strong catalytic function is used as the capacitor upper electrode, deterioration of the characteristics of the ferroelectric film forming the capacitor insulative film is prevented, thereby improving the reliability of the ferroelectric memory.

Moreover, in the second ferroelectric memory, the capacitor upper electrode is connected to the second plug via the opening provided in the capacitor insulative film, whereby the capacitor upper electrode includes a stepped portion extending along the periphery of the opening. Specifically, when the opening has a square shape, for example, the capacitor upper electrode includes four stepped portions extending respectively in four directions along the four edges of the periphery of the opening. Therefore, even if the material of the capacitor upper electrode has a direction dependency in its step covering property, the current path between the capacitor upper electrode and the second plug is reliably ensured, as compared to a case where the capacitor upper electrode includes a stepped portion extending in one direction along an edge of the capacitor insulative film (e.g., the first ferroelectric memory). Moreover, an opening may be provided in an insulative film to be the capacitor insulative film and then the insulative film and a conductive film to be the capacitor upper electrode may be patterned simultaneously, in which case it is no longer necessary to consider a mask alignment margin between the mask pattern used for the formation of the capacitor insulative film and the mask pattern used for the formation of the capacitor upper electrode. As a result, it is possible to reduce the cell size of the ferroelectric memory, thereby reducing the total area to be occupied by the entire memory cell array.

A third ferroelectric memory according to the present invention includes: a transistor formed on a semiconductor substrate; a first interlayer insulating film formed on the semiconductor substrate including the transistor; a capacitor lower electrode formed on the first interlayer insulating film; a capacitor insulative film made of a ferroelectric film and formed on the capacitor lower electrode; a capacitor upper electrode formed on the capacitor insulative film; a conductive hydrogen barrier film formed on the capacitor upper electrode; a second interlayer insulating film formed on the first interlayer insulating film including the conductive hydrogen barrier film; a wiring formed on the second interlayer insulating film; a first plug formed through the first interlayer insulating film so as to connect the transistor and the capacitor lower electrode to each other; and a second plug formed through the second interlayer insulating film so as to connect the conductive hydrogen barrier film and the wiring to each other.

In the third ferroelectric memory, the transistor formed on the semiconductor substrate is connected to the capacitor lower electrode on the first interlayer insulating film via the first plug formed through the first interlayer insulating film on the transistor. Moreover, the capacitor upper electrode formed on the capacitor lower electrode via the capacitor insulative film is covered by the conductive hydrogen barrier film. Furthermore, the wiring formed on the conductive hydrogen barrier film via the second interlayer insulating film is connected to the conductive hydrogen barrier film via the second plug formed through the second interlayer insulating film. Thus, the capacitor upper electrode and the wiring can be electrically connected to each other via the conductive hydrogen barrier film and the second plug (connecting the conductive hydrogen barrier film and the wiring to each other). Therefore, it is not necessary, after the formation of the capacitor upper electrode, to form a contact hole for forming a plug therein that directly connects the capacitor upper electrode and the wiring to each other, thereby preventing the capacitor upper electrode from being exposed to a hydrogen atmosphere or a reducing atmosphere. As a result, even when a Pt film having a strong catalytic function is used as the capacitor upper electrode, deterioration of the characteristics of the ferroelectric film forming the capacitor insulative film is prevented, thereby improving the reliability of the ferroelectric memory.

Moreover, in the third ferroelectric memory, the capacitive element is covered by the conductive hydrogen barrier film, thereby improving the reduction resistance of the capacitive element.

A fourth ferroelectric memory according to the present invention includes: a transistor formed in one region on a semiconductor substrate; a conductive layer formed in another region on the semiconductor substrate; a first interlayer insulating film formed on the semiconductor substrate including the transistor and the conductive layer; a capacitor lower electrode formed on the first interlayer insulating film; a capacitor insulative film made of a ferroelectric film and formed on the capacitor lower electrode; a capacitor upper electrode formed on the capacitor insulative film; a conductive hydrogen barrier film formed on the capacitor upper electrode so as to extend beyond an area of the capacitor upper electrode; a second interlayer insulating film formed on the first interlayer insulating film including the conductive hydrogen barrier film; a wiring formed on the second interlayer insulating film; a first plug formed through the first interlayer insulating film so as to connect the transistor and the capacitor lower electrode to each other; a second plug formed through the first interlayer insulating film so as to electrically connect the conductive layer and the conductive hydrogen barrier film to each other; and a third plug formed through the first interlayer insulating film and the second interlayer insulating film so as to connect the conductive layer and the wiring to each other.

In the fourth ferroelectric memory, the transistor formed on the semiconductor substrate is connected to the capacitor lower electrode on the first interlayer insulating film via the first plug formed through the first interlayer insulating film on the transistor. Moreover, the capacitor upper electrode formed on the capacitor lower electrode via the capacitor insulative film is covered by the conductive hydrogen barrier film, and the conductive hydrogen barrier film is electrically connected to the conductive layer formed on the semiconductor substrate via the second plug formed through the first interlayer insulating film. Furthermore, the wiring formed on the conductive hydrogen barrier film via the second interlayer insulating film is connected to the conductive layer via the third plug formed through the first interlayer insulating film and the second interlayer insulating film. Therefore, before the formation of the capacitor upper electrode, more specifically, simultaneously with the formation of the first plug connecting the transistor and the capacitor lower electrode to each other, the second plug connecting the conductive hydrogen barrier film and the conductive layer to each other can be formed through the first interlayer insulating film. Thus, the capacitor upper electrode and the wiring can be electrically connected to each other via the conductive hydrogen barrier film, the second plug, the conductive layer and the third plug. In other words, the capacitor upper electrode and the wiring can be electrically connected to each other by using the second plug and the conductive layer, which are formed in advance below the capacitive element. Therefore, it is not necessary, after the formation of the capacitor upper electrode, to form a contact hole for forming a plug therein that directly connects the capacitor upper electrode and the wiring to each other, thereby preventing the capacitor upper electrode from being exposed to a hydrogen atmosphere or a reducing atmosphere. As a result, even when a Pt film having a strong catalytic function is used as the capacitor upper electrode, deterioration of the characteristics of the ferroelectric film forming the capacitor insulative film is prevented, thereby improving the reliability of the ferroelectric memory.

Moreover, in the fourth ferroelectric memory, the capacitive element is covered by the conductive hydrogen barrier film, thereby improving the reduction resistance of the capacitive element.

In the first, second or fourth ferroelectric memory, it is preferred that the conductive layer is an impurity diffusion layer formed in a surface portion of the semiconductor substrate, or a silicide layer formed in a surface portion of the impurity diffusion layer.

In this way, the resistance of the conductive layer can be reduced as compared to a case where a polysilicon layer formed on the semiconductor substrate, or the like, is used as the conductive layer.

In the first, second or fourth ferroelectric memory, it is preferred that: the first interlayer insulating film includes a lower layer film and an upper layer film formed on the lower layer film; and the conductive layer is formed between the lower layer film and the upper layer film.

In this way, the substrate potential can be set easily and the cell size of the ferroelectric memory can be reduced, as compared to a case where an impurity diffusion layer formed in a surface portion of the semiconductor substrate is used as the conductive layer. Moreover, the aspect ratio of the hole in which the second or third plug connected to the conductive layer is to be embedded is reduced, thereby preventing a failure in the formation of each plug or an increase in the resistance thereof.

In the first, second, third or fourth ferroelectric memory, it is preferred that at least a portion of the capacitor upper electrode is made of a Pt film or a Pt-containing alloy film.

In this way, it is possible to sufficiently grow the crystal of the ferroelectric film forming the capacitor insulative film from a lattice-matched Pt crystal face.

In the third or fourth ferroelectric memory, it is preferred that the conductive hydrogen barrier film is made of a Ti film, a Ta film, a TiON film, a TiN film, a TaN film, a TiAlN film, a TiAlON film, or an alloy film containing Ti, Ta, TiON, TiN, TaN, TiAlN, or TiAlON.

In this way, it is possible to reliably improve the reduction resistance of the capacitive element, while it is possible to reliably ensure that the capacitor upper electrode and a plug, etc., are electrically connected to each other via the conductive hydrogen barrier film.

A first method for manufacturing a ferroelectric memory according to the present invention includes the steps of: forming a transistor in one region on a semiconductor substrate; forming a conductive layer in another region on the semiconductor substrate; forming a first interlayer insulating film on the semiconductor substrate including the transistor and the conductive layer; forming a first plug connected to the transistor and a second plug connected to the conductive layer through the first interlayer insulating film; forming a capacitor lower electrode on the first interlayer insulating film so as to be connected to the first plug; forming a capacitor insulative film made of a ferroelectric film on the capacitor lower electrode; forming a capacitor upper electrode on the capacitor insulative film so as to extend beyond an area of the capacitor insulative film and to be electrically connected to the second plug; forming a second interlayer insulating film on the first interlayer insulating film including the capacitor upper electrode; forming a third plug connected to the conductive layer through the first interlayer insulating film and the second interlayer insulating film; and forming a wiring on the second interlayer insulating film so as to be connected to the third plug.

In the first method for manufacturing a ferroelectric memory, the first interlayer insulating film is formed on the semiconductor substrate, on which the transistor and the conductive layer have been formed, and the first plug connected to the transistor and the second plug connected to the conductive layer are formed through the first interlayer insulating film. Then, the capacitor lower electrode connected to the first plug is formed on the first interlayer insulating film, after which the capacitor insulative film made of a ferroelectric film, and the capacitor upper electrode extending beyond the area of the capacitor insulative film and electrically connected to the second plug, are formed successively on the capacitor lower electrode. Then, the second interlayer insulating film is formed on the first interlayer insulating film including the capacitor upper electrode, and the third plug connecting the conductive layer and the wiring on the second interlayer insulating film to each other is formed through the first interlayer insulating film and the second interlayer insulating film. Therefore, before the formation of the capacitor upper electrode, more specifically, simultaneously with the formation of the first plug connecting the memory cell transistor and the capacitor lower electrode to each other, the second plug electrically connecting the capacitor upper electrode and the conductive layer to each other can be formed through the first interlayer insulating film. Thus, the capacitor upper electrode and the wiring can be electrically connected to each other via the second plug, the conductive layer and the third plug. In other words, the capacitor upper electrode and the wiring can be electrically connected to each other by using the second plug and the conductive layer, which are formed in advance below the capacitive element. Therefore, it is not necessary, after the formation of the capacitor upper electrode, to form a contact hole for forming a plug therein that directly connects the capacitor upper electrode and the wiring to each other, thereby preventing the capacitor upper electrode from being exposed to a hydrogen atmosphere or a reducing atmosphere. As a result, even when a Pt film having a strong catalytic function is used as the capacitor upper electrode, deterioration of the characteristics of the ferroelectric film forming the capacitor insulative film is prevented, thereby improving the reliability of the ferroelectric memory.

In the first method for manufacturing a ferroelectric memory, it is preferred that: the step of forming the capacitor lower electrode includes the step of forming a connection pad on the first interlayer insulating film so as to be connected to the second plug; and the step of forming the capacitor upper electrode includes the step of forming the capacitor upper electrode so as to be connected to the connection pad.

In this way, the connection pad can be formed simultaneously with the formation of the capacitor lower electrode by patterning a conductive film used as a material of the capacitor lower electrode and having an oxygen barrier property so as to cover the entire upper surface of the second plug. Therefore, without increasing the number of manufacturing steps, it is possible to prevent the second plug from being oxidized and to connect the capacitor upper electrode and the second plug to each other via the connection pad.

In a case where the step of forming the capacitor lower electrode includes the step of forming a connection pad, it is preferred that the step of forming the capacitor insulative film includes the step of forming the capacitor insulative film so that an edge thereof is located within an area of the connection pad.

In this way, it is possible to form the capacitor insulative film while preventing step formation due to over-etching, by using, as the material of the connection pad, a conductive film having a large etching selectivity ratio with respect to the insulative film to be the capacitor insulative film, and patterning the insulative film using the connection pad as an etching stopper.

In the first method for manufacturing a ferroelectric memory, it is preferred that the step of forming the capacitor upper electrode includes the step of patterning a conductive film to be the capacitor upper electrode using a mask pattern that is used for patterning an insulative film to be the capacitor insulative film, and then forming a conductive side wall on a side surface of the capacitor upper electrode so as to be electrically connected to the second plug.

In this way, the number of mask patterns to be used in the manufacturing process can be reduced, and the capacitor upper electrode and the second plug can be electrically connected to each other via the side wall.

In a case where the step of forming the capacitor upper electrode includes the step of forming a side wall, it is preferred that: the step of forming the capacitor lower electrode includes the step of forming a connection pad on the first interlayer insulating film so as to be connected to the second plug; and the step of forming the capacitor upper electrode includes the step of forming the side wall so as to be connected to the connection pad.

In this way, the connection pad can be formed simultaneously with the formation of the capacitor lower electrode by patterning a conductive film used as a material of the capacitor lower electrode and having an oxygen barrier property so as to cover the entire upper surface of the second plug. Therefore, without increasing the number of manufacturing steps, it is possible to prevent the second plug from being oxidized and to connect the side wall and the second plug to each other via the connection pad.

In a case where the step of forming the capacitor upper electrode includes the step of forming a side wall, and the step of forming the capacitor lower electrode includes the step of forming a connection pad, it is preferred that the step of forming the capacitor insulative film includes the step of forming the capacitor insulative film so that an edge thereof is located within an area of the connection pad.

In this way, it is possible to form the capacitor insulative film while preventing step formation due to over-etching, by using, as the material of the connection pad, a conductive film having a large etching selectivity ratio with respect to the insulative film to be the capacitor insulative film, and patterning the insulative film using the connection pad as an etching stopper.

A second method for manufacturing a ferroelectric memory according to the present invention includes the steps of: forming a transistor in one region on a semiconductor substrate; forming a conductive layer in another region on the semiconductor substrate; forming a first interlayer insulating film on the semiconductor substrate including the transistor and the conductive layer; forming a first plug connected to the transistor and a second plug connected to the conductive layer through the first interlayer insulating film; forming a capacitor lower electrode on the first interlayer insulating film so as to be connected to the first plug; forming a capacitor insulative film made of a ferroelectric film on the capacitor lower electrode so as to extend at least over an area above the second plug; forming an opening in a portion of the capacitor insulative film that is above the second plug; forming a capacitor upper electrode on the capacitor insulative film including the opening so as to be electrically connected to the second plug via the opening; forming a second interlayer insulating film on the first interlayer insulating film including the capacitor upper electrode; forming a third plug connected to the conductive layer through the first interlayer insulating film and the second interlayer insulating film; and forming a wiring on the second interlayer insulating film so as to be connected to the third plug.

In the second method for manufacturing a ferroelectric memory, the first interlayer insulating film is formed on the semiconductor substrate, on which the transistor and the conductive layer have been formed, and the first plug connected to the transistor and the second plug connected to the conductive layer are formed through the first interlayer insulating film. Then, the capacitor lower electrode connected to the first plug is formed on the first interlayer insulating film, after which the capacitor insulative film made of a ferroelectric film and extending over an area above the second plug is formed on the capacitor lower electrode. Then, an opening is formed in a portion of the capacitor insulative film above the second plug, and the capacitor upper electrode is formed so as to be electrically connected to the second plug via the opening. Then, the second interlayer insulating film is formed on the first interlayer insulating film including the capacitor upper electrode, and the third plug connecting the conductive layer and the wiring on the second interlayer insulating film to each other is formed through the first interlayer insulating film and the second interlayer insulating film. Therefore, before the formation of the capacitor upper electrode, more specifically, simultaneously with the formation of the first plug connecting the transistor and the capacitor lower electrode to each other, the second plug electrically connecting the capacitor upper electrode and the conductive layer to each other can be formed through the first interlayer insulating film. Thus, the capacitor upper electrode and the wiring can be electrically connected to each other via the second plug, the conductive layer and the third plug. In other words, the capacitor upper electrode and the wiring can be electrically connected to each other by using the second plug and the conductive layer, which are formed in advance below the capacitive element. Therefore, it is not necessary, after the formation of the capacitor upper electrode, to form a contact hole for forming a plug therein that directly connects the capacitor upper electrode and the wiring to each other, thereby preventing the capacitor upper electrode from being exposed to a hydrogen atmosphere or a reducing atmosphere. As a result, even when a Pt film having a strong catalytic function is used as the capacitor upper electrode, deterioration of the characteristics of the ferroelectric film forming the capacitor insulative film is prevented, thereby improving the reliability of the ferroelectric memory.

Moreover, in the second method for manufacturing a ferroelectric memory, the capacitor upper electrode is connected to the second plug via the opening provided in the capacitor insulative film, whereby the capacitor upper electrode includes a stepped portion extending along the periphery of the opening. Specifically, when the opening has a square shape, for example, the capacitor upper electrode includes four stepped portions extending respectively in four directions along the four edges of the periphery of the opening. Therefore, even if the material of the capacitor upper electrode has a direction dependency in its step covering property, the current path between the capacitor upper electrode and the second plug is reliably ensured, as compared to a case where the capacitor upper electrode includes a stepped portion extending in one direction along an edge of the capacitor insulative film (e.g., the first method for manufacturing a ferroelectric memory).

In the second method for manufacturing a ferroelectric memory, it is preferred that: the step of forming the capacitor lower electrode includes the step of forming a connection pad on the first interlayer insulating film so as to be connected to the second plug; and the step of forming the capacitor upper electrode includes the step of forming the capacitor upper electrode so as to be connected to the connection pad.

In this way, the connection pad can be formed simultaneously with the formation of the capacitor lower electrode by patterning a conductive film used as a material of the capacitor lower electrode and having an oxygen barrier property so as to cover the entire upper surface of the second plug. Therefore, without increasing the number of manufacturing steps, it is possible to prevent the second plug from being oxidized and to connect the capacitor upper electrode and the second plug to each other via the connection pad.

In the second method for manufacturing a ferroelectric memory, it is preferred that: the step of forming the opening is performed before patterning an insulative film to be the capacitor insulative film; and the step of forming the capacitor upper electrode includes the step of simultaneously patterning the insulative film to be the capacitor insulative film and a conductive film to be the capacitor upper electrode.

In this way, it is no longer necessary to consider a mask alignment margin between the mask pattern used for the formation of the capacitor insulative film and the mask pattern used for the formation of the capacitor upper electrode. As a result, it is possible to reduce the cell size of the ferroelectric memory, thereby reducing the total area to be occupied by the entire memory cell array.

A third method for manufacturing a ferroelectric memory according to the present invention includes the steps of: forming a transistor on a semiconductor substrate; forming a first interlayer insulating film on the semiconductor substrate including the transistor; forming a first plug connected to the transistor through the first interlayer insulating film; forming a capacitor lower electrode on the first interlayer insulating film so as to be connected to the first plug; forming a capacitor insulative film made of a ferroelectric film on the capacitor lower electrode; forming a capacitor upper electrode on the capacitor insulative film; forming a conductive hydrogen barrier film on the capacitor upper electrode; forming a second interlayer insulating film on the first interlayer insulating film including the conductive hydrogen barrier film; forming a second plug connected to the conductive hydrogen barrier film through the second interlayer insulating film; and forming a wiring on the second interlayer insulating film so as to be connected to the second plug.

In the third method for manufacturing a ferroelectric memory, the first interlayer insulating film is formed on the semiconductor substrate, on which the transistor has been formed, and the first plug connected to the transistor is formed through the first interlayer insulating film, after which the capacitor lower electrode connected to the first plug is formed on the first interlayer insulating film. Then, the capacitor insulative film made of a ferroelectric film and the capacitor upper electrode are formed successively on the capacitor lower electrode, and the conductive hydrogen barrier film is formed on the capacitor upper electrode. Then, the second interlayer insulating film is formed on the first interlayer insulating film including the conductive hydrogen barrier film, and the second plug connecting the wiring on the second interlayer insulating film and the conductive hydrogen barrier film to each other is formed through the second interlayer insulating film. Thus, the capacitor upper electrode and the wiring can be electrically connected to each other via the conductive hydrogen barrier film and the second plug. Therefore, it is not necessary, after the formation of the capacitor upper electrode, to form a contact hole for forming a plug therein that directly connects the capacitor upper electrode and the wiring to each other, thereby preventing the capacitor upper electrode from being exposed to a hydrogen atmosphere or a reducing atmosphere. As a result, even when a Pt film having a strong catalytic function is used as the capacitor upper electrode, deterioration of the characteristics of the ferroelectric film forming the capacitor insulative film is prevented, thereby improving the reliability of the ferroelectric memory.

Moreover, in the third method for manufacturing a ferroelectric memory, the capacitive element is always covered by the conductive hydrogen barrier film, thereby improving the reduction resistance of the capacitive element.

A fourth method for manufacturing a ferroelectric memory according to the present invention includes the steps of: forming a transistor in one region on a semiconductor substrate; forming a conductive layer in another region on the semiconductor substrate; forming a first interlayer insulating film on the semiconductor substrate including the transistor and the conductive layer; forming a first plug connected to the transistor and a second plug connected to the conductive layer through the first interlayer insulating film; forming a capacitor lower electrode on the first interlayer insulating film so as to be connected to the first plug; forming a capacitor insulative film made of a ferroelectric film on the capacitor lower electrode; forming a capacitor upper electrode on the capacitor insulative film; forming a conductive hydrogen barrier film on the capacitor upper electrode so as to extend beyond an area of the capacitor upper electrode and to be electrically connected to the second plug; forming a second interlayer insulating film on the first interlayer insulating film including the conductive hydrogen barrier film; forming a third plug connected to the conductive layer through the first interlayer insulating film and the second interlayer insulating film; and forming a wiring on the second interlayer insulating film so as to be connected to the third plug.

In the fourth method for manufacturing a ferroelectric memory, the first interlayer insulating film is formed on the semiconductor substrate, on which the transistor and the conductive layer have been formed, and the first plug connected to the transistor and the second plug connected to the conductive layer are formed through the first interlayer insulating film. Then, the capacitor lower electrode connected to the first plug is formed on the first interlayer insulating film, and the capacitor insulative film made of a ferroelectric film and the capacitor upper electrode are formed successively on the capacitor lower electrode, after which the conductive hydrogen barrier film extending beyond the area of the capacitor upper electrode and electrically connected to the second plug is formed on the capacitor upper electrode. Then, the second interlayer insulating film is formed on the first interlayer insulating film including the conductive hydrogen barrier film, and the third plug connecting the conductive layer and the wiring on the second interlayer insulating film to each other is formed through the first interlayer insulating film and the second interlayer insulating film. Therefore, before the formation of the capacitor upper electrode, more specifically, simultaneously with the formation of the first plug connecting the transistor and the capacitor lower electrode to each other, the second plug connecting the conductive hydrogen barrier film and the conductive layer to each other can be formed through the first interlayer insulating film. Thus, the capacitor upper electrode and the wiring can be electrically connected to each other via the conductive hydrogen barrier film, the second plug, the conductive layer and the third plug. In other words, the capacitor upper electrode and the wiring can be electrically connected to each other by using the second plug and the conductive layer, which are formed in advance below the capacitive element. Therefore, it is not necessary, after the formation of the capacitor upper electrode, to form a contact hole for forming a plug therein that directly connects the capacitor upper electrode and the wiring to each other, thereby preventing the capacitor upper electrode from being exposed to a hydrogen atmosphere or a reducing atmosphere. As a result, even when a Pt film having a strong catalytic function is used as the capacitor upper electrode, deterioration of the characteristics of the ferroelectric film forming the capacitor insulative film is prevented, thereby improving the reliability of the ferroelectric memory.

Moreover, in the fourth method for manufacturing a ferroelectric memory, the capacitive element is always covered by the conductive hydrogen barrier film, thereby improving the reduction resistance of the capacitive element.

In the fourth method for manufacturing a ferroelectric memory, it is preferred that: the step of forming the capacitor lower electrode includes the step of forming a connection pad on the first interlayer insulating film so as to be connected to the second plug; and the step of forming the conductive hydrogen barrier film includes the step of forming the conductive hydrogen barrier film so as to be connected to the connection pad.

In this way, the connection pad can be formed simultaneously with the formation of the capacitor lower electrode by patterning a conductive film used as a material of the capacitor lower electrode and having an oxygen barrier property so as to cover the entire upper surface of the second plug. Therefore, without increasing the number of manufacturing steps, it is possible to prevent the second plug from being oxidized and to connect the conductive hydrogen barrier film and the second plug to each other via the connection pad.

In a case where the step of forming the capacitor lower electrode includes the step of forming a connection pad, it is preferred that the step of forming the capacitor insulative film includes the step of forming the capacitor insulative film so that an edge thereof is located within an area of the connection pad.

In this way, it is possible to form the capacitor insulative film while preventing step formation due to over-etching, by using, as the material of the connection pad, a conductive film having a large etching selectivity ratio with respect to the insulative film to be the capacitor insulative film, and patterning the insulative film using the connection pad as an etching stopper.

In the fourth method for manufacturing a ferroelectric memory, it is preferred that the step of forming the conductive hydrogen barrier film includes the step of patterning a second conductive film to be the conductive hydrogen barrier film using a mask pattern that is used for patterning an insulative film to be the capacitor insulative film and a first conductive film to be the capacitor upper electrode, and then forming a conductive side wall on a side surface of the conductive hydrogen barrier film so as to be electrically connected to the second plug.

In this way, the number of mask patterns to be used in the manufacturing process can be reduced, and the conductive hydrogen barrier film and the second plug can be electrically connected to each other via the side wall.

In a case where the step of forming the conductive hydrogen barrier film includes the step of forming a side wall, it is preferred that the side wall has a hydrogen barrier property.

In this way, the entire capacitive element can be reliably covered by the hydrogen barrier film, thereby improving the reduction resistance of the capacitive element.

Moreover, in a case where the step of forming the conductive hydrogen barrier film includes the step of forming a side wall, it is preferred that: the step of forming the capacitor lower electrode includes the step of forming a connection pad on the first interlayer insulating film so as to be connected to the second plug; and the step of forming the conductive hydrogen barrier film includes the step of forming the side wall so as to be connected to the connection pad.

In this way, the connection pad can be formed simultaneously with the formation of the capacitor lower electrode by patterning a conductive film used as a material of the capacitor lower electrode and having an oxygen barrier property so as to cover the entire upper surface of the second plug. Therefore, without increasing the number of manufacturing steps, it is possible to prevent the second plug from being oxidized and to connect the side wall and the second plug to each other via the connection pad.

In a case where the step of forming the conductive hydrogen barrier film includes the step of forming a side wall, and the step of forming the capacitor lower electrode includes the step of forming a connection pad, it is preferred that the step of forming the capacitor insulative film includes the step of forming the capacitor insulative film so that an edge thereof is located within an area of the connection pad.

In this way, it is possible to form the capacitor insulative film while preventing step formation due to over-etching, by using, as the material of the connection pad, a conductive film having a large etching selectivity ratio with respect to the insulative film to be the capacitor insulative film, and patterning the insulative film using the connection pad as an etching stopper.

In the first, second or fourth method for manufacturing a ferroelectric memory, it is preferred that the conductive layer is an impurity diffusion layer formed in a surface portion of the semiconductor substrate, or a silicide layer formed in a surface portion of the impurity diffusion layer.

In this way, the resistance of the conductive layer can be reduced as compared to a case where a polysilicon layer formed on the semiconductor substrate, or the like, is used as the conductive layer.

In the first, second or fourth method for manufacturing a ferroelectric memory, it is preferred that: the first interlayer insulating film includes a lower layer film and an upper layer film formed on the lower layer film; and the conductive layer is formed between the lower layer film and the upper layer film.

In this way, the substrate potential can be set easily and the cell size of the ferroelectric memory can be reduced, as compared to a case where an impurity diffusion layer formed in a surface portion of the semiconductor substrate is used as the conductive layer. Moreover, the aspect ratio of the hole in which the second or third plug connected to the conductive layer is to be embedded is reduced, thereby preventing a failure in the formation of each plug or an increase in the resistance thereof.

In the first, second, third or fourth method for manufacturing a ferroelectric memory, it is preferred that at least a portion of the capacitor upper electrode is made of a Pt film or a Pt-containing alloy film.

In this way, it is possible to sufficiently grow the crystal of the ferroelectric film forming the capacitor insulative film from a lattice-matched Pt crystal face.

In the third or fourth method for manufacturing a ferroelectric memory, it is preferred that the conductive hydrogen barrier film is made of a Ti film, a Ta film, a TiON film, a TiN film, a TaN film, a TiAlN film, a TiAlON film, or an alloy film containing Ti, Ta, TiON, TiN, TaN, TiAlN, or TiAlON.

In this way, it is possible to reliably improve the reduction resistance of the capacitive-element, while it is possible to reliably ensure that the capacitor upper electrode and a plug, etc., are electrically connected to each other via the conductive hydrogen barrier film.

DETAILED DESCRIPTION OF THE INVENTION (First Embodiment)

A ferroelectric memory according to a first embodiment of the present invention, and a method for manufacturing the same, will now be described with reference to the drawings.

Figure 1A:
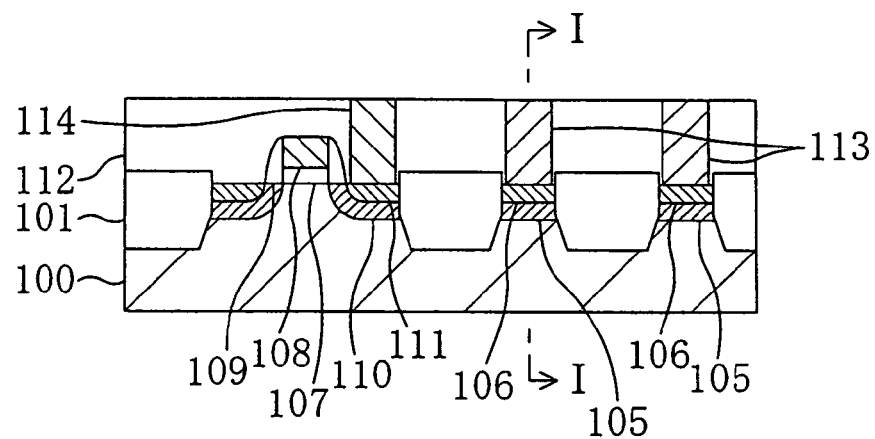
FIG. 1A is a cross-sectional view illustrating a step in a method for manufacturing a ferroelectric memory according to a first embodiment of the present invention.
Figure 1B:
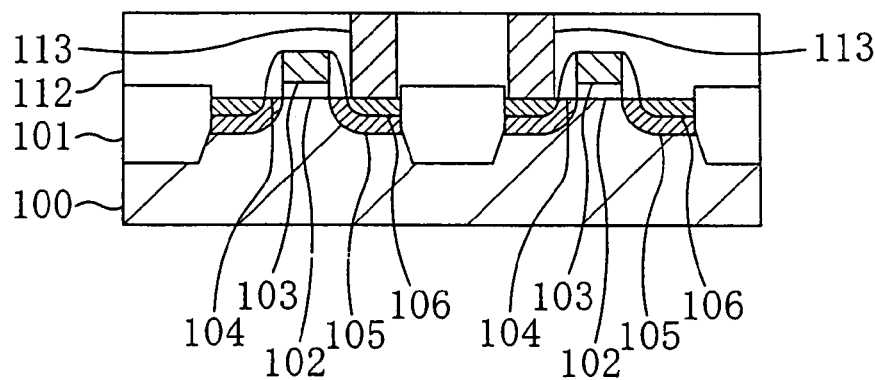
FIG. 1B is a cross-sectional view taken along line I—I in FIG. 1A.
Figure 2A:
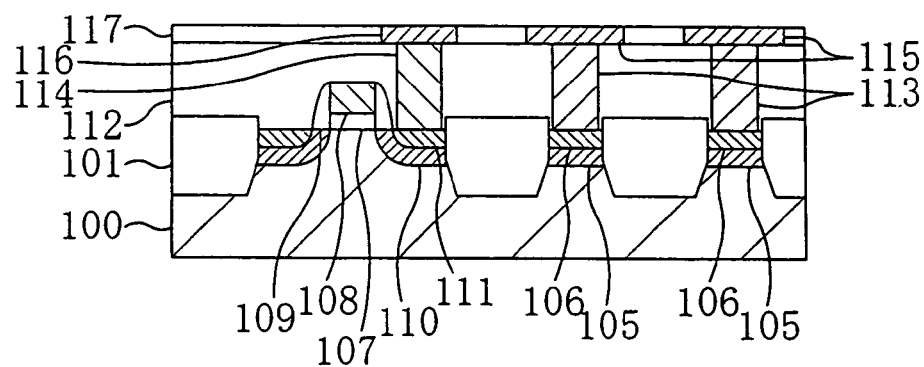
FIG. 2A and FIG. 2B are cross-sectional views each illustrating a step in the method for manufacturing a ferroelectric memory according to the first embodiment of the present invention.
Figure 2B:
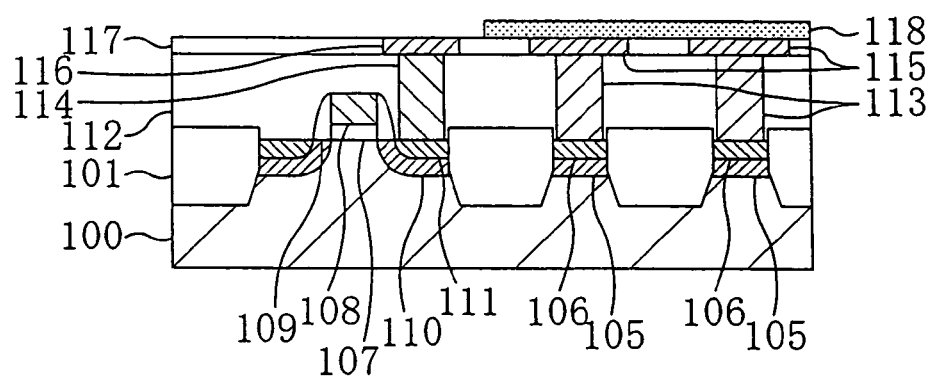
Figure 3A:
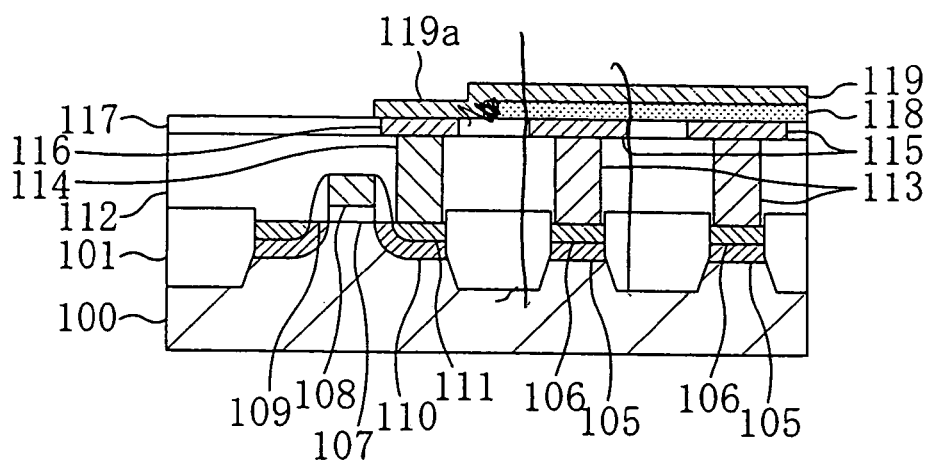
FIG. 3A to FIG. 3C are cross-sectional views each illustrating a step in the method for manufacturing a ferroelectric memory according to the first embodiment of the present invention.
Figure 3B:
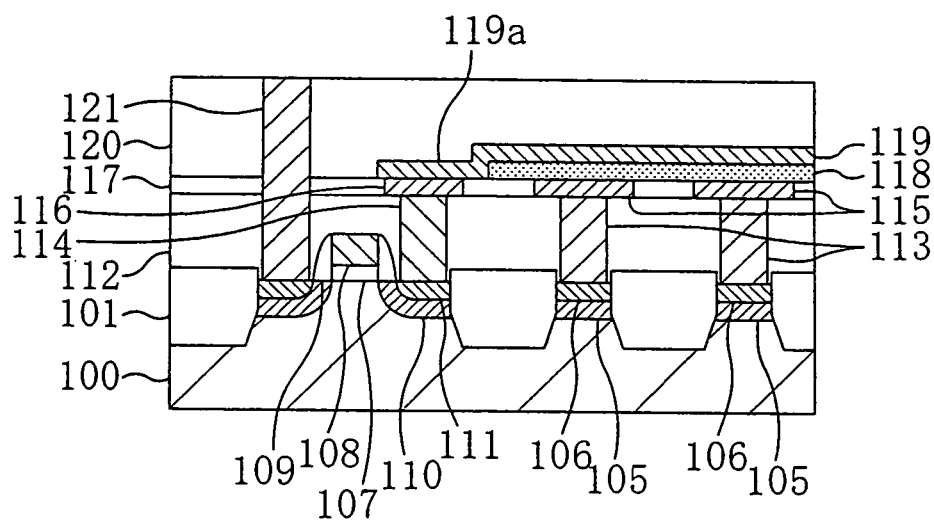
Figure 3C:
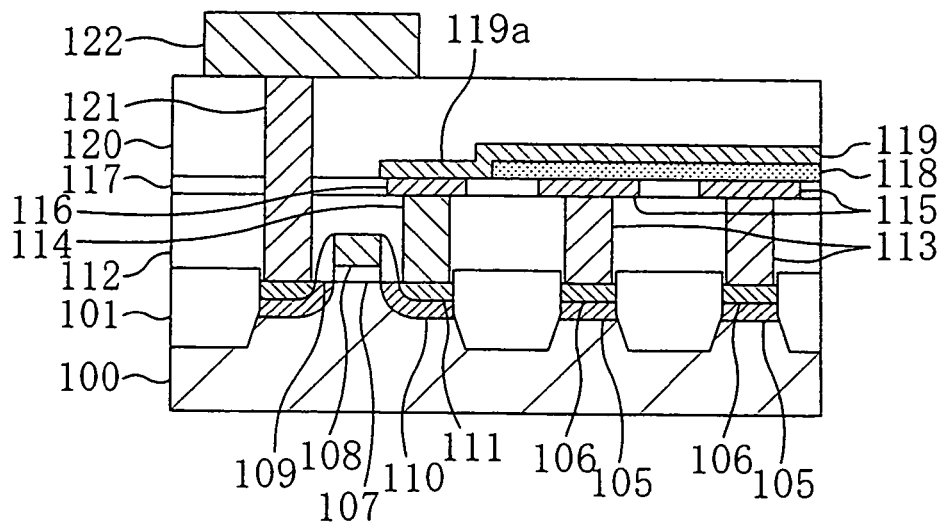
Figure 4A:
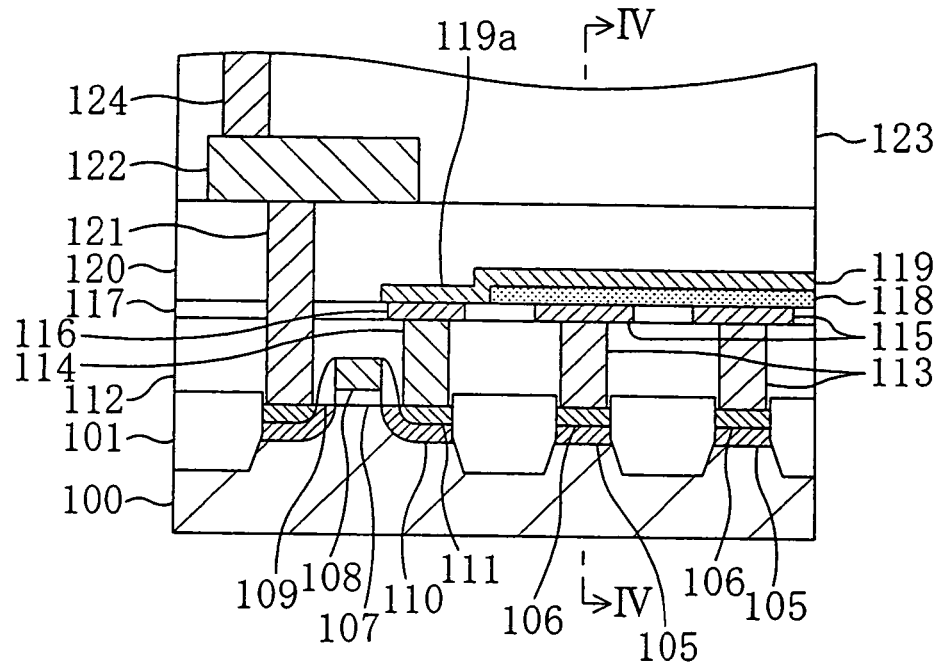
FIG. 4A is a cross-sectional view illustrating a step in the method for manufacturing a ferroelectric memory according to the first embodiment of the present invention.
Figure 4B:
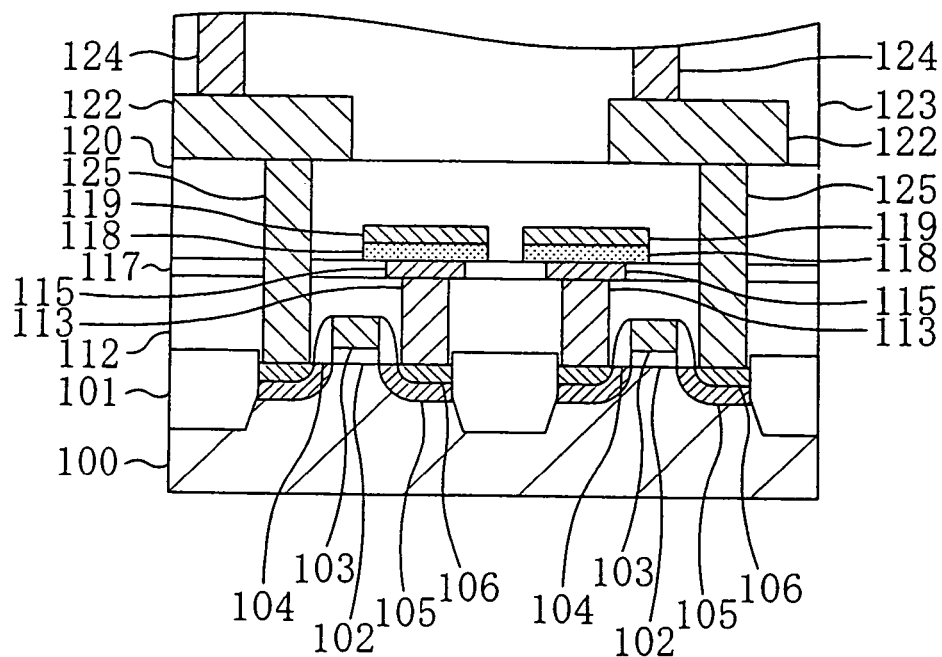
FIG. 4B is a cross-sectional view taken along line IV—IV in FIG. 4A.

FIG. 1A, FIG. 1B, FIG. 2A, FIG. 2B, FIG. 3A to FIG. 3C, FIG. 4A and FIG. 4B are cross-sectional views each illustrating a step in a method for manufacturing a ferroelectric memory according to the first embodiment. Note that FIG. 1B is a cross-sectional view taken along line I—I in FIG. 1A, and FIG. 4B is a cross-sectional view taken along line IV—IV in FIG. 4A.

First, as illustrated in FIG. 1A and FIG. 1B, a device isolation region 101 having an STI structure is formed on the surface of a semiconductor substrate 100. Then, in a region where a memory cell is to be formed (hereafter referred to as a "memory cell region") within each region of the semiconductor substrate 100 surrounded by the device isolation region 101, a first gate electrode 103 forming a part of a memory cell transistor is formed via a first gate insulating film 102. Then, an insulative first side wall 104 is formed on the side surface of the first gate electrode 103, and a first low-concentration impurity diffusion layer 105 to be the lower layer and a first high-concentration impurity diffusion layer 106 to be the upper layer are formed in a surface portion of each memory cell region of the semiconductor substrate 100. The first low-concentration impurity diffusion layer 105 and the first high-concentration impurity diffusion layer 106 are to be a source region or a drain region of the memory cell transistor.

Moreover, as illustrated in FIG. 1A, a second gate electrode 108 forming a part of a control transistor is formed via a second gate insulating film 107 on a region other than the memory cell region (hereinafter referred to as a "non-memory cell region") within each region of the semiconductor substrate 100 surrounded by the device isolation region 101. Then, an insulative second side wall 109 is formed on the side surface of the second gate electrode 108, and a second low-concentration impurity diffusion layer 110 to be the lower layer and a second high-concentration impurity diffusion layer 111 to be the upper layer are formed in a surface portion of a non-memory cell region of the semiconductor substrate 100. The second low-concentration impurity diffusion layer 110 and the second high-concentration impurity diffusion layer 111 are to be a source region or a drain region of the control transistor.

Note that in the first embodiment, each of various elements, e.g., a gate electrode, of the memory cell transistor may be formed simultaneously with its counterpart element of the control transistor.

Then, as illustrated in FIG. 1A and FIG. 1B, a first interlayer insulating film 112 is formed on the semiconductor substrate 100, on which the memory cell transistor and the control transistor have been formed. Then, a first plug 113 made of tungsten and connected to the first high-concentration impurity diffusion layer 106 (a portion to be a source region), and a second plug 114 made of tungsten and connected to the second high-concentration impurity diffusion layer 111 (either a portion to be a source region or a portion to be a drain region), are formed through the first interlayer insulating film 112.

Then, a conductive film having an oxygen barrier property (e.g., an Ir film, an $IrO_2$ film, or the like) is deposited across the entire surface of the first interlayer insulating film 112, and the conductive film is patterned, thereby forming a capacitor lower electrode 115 and a connection pad 116, as illustrated in FIG. 2A. The capacitor lower electrode 115 is made of a conductive film having an oxygen barrier property and covers the upper surface of the first plug 113, and the connection pad 116 is made of a conductive film having an oxygen barrier property and covers the upper surface of the second plug 114. Thus, the memory cell transistor and the capacitor lower electrode 115 are connected to each other via the first plug 113. Then, an insulative film 117 is embedded in a region between adjacent capacitor lower electrodes 115 or a region between the capacitor lower electrode 115 and the connection pad 116 so that the upper surface thereof is coplanar with the upper surfaces of the capacitor lower electrode 115 and the connection pad 116.

Then, a ferroelectric film made of a PZT ($PbZr_xTi_{1-x}O_3$, where $0 \leq x \leq 1$) type material or an SBT ($SrBi_2Ta_2O_9$) type material is deposited across the entire surface of the first interlayer insulating film 112, on which the insulative film 117 has been formed, and the ferroelectric film is patterned, thereby forming a capacitor insulative film 118 covering the upper surface of the capacitor lower electrode 115, as illustrated in FIG. 2B.

Then, a conductive film made of Pt or a Pt-containing alloy is deposited across the entire surface of the first interlayer insulating film 112, on which the capacitor insulative film 118 has been formed, and the conductive film is patterned, thereby forming a capacitor upper electrode 119 covering the upper surface of the capacitor insulative film 118 and extending beyond the area of the capacitor insulative film 118, as illustrated in FIG. 3A. Specifically, the capacitor upper electrode 119 includes an extension 119a covering at least a portion of the upper surface of the connection pad 116, and the extension 119a is formed when patterning the conductive film to be the capacitor upper electrode 119. Thus, the capacitor upper electrode 119 and the second plug 114 are connected to each other via the connection pad 116, whereby the capacitor upper electrode 119 and the second high-concentration impurity diffusion layer 111 are electrically connected to each other via the second plug 114. Note that the capacitor lower electrode 115, the capacitor insulative film 118 and the capacitor upper electrode 119 together form a capacitive element.

Then, as illustrated in FIG. 3B, a second interlayer insulating film 120 is formed on the first interlayer insulating film 112, on which the capacitive element has been formed. Then, a third plug 121 made of tungsten is formed through the first interlayer insulating film 112, the insulative film 117 and the second interlayer insulating film 120 so as to be connected to the second high-concentration impurity diffusion layer 111 (one of a portion to be a source region and a portion to be a drain region to which the second plug 114 is not connected).

Then, as illustrated in FIG. 3C, a wiring 122 made of aluminum, or the like, is formed on the second interlayer insulating film 120 so as to be connected to the third plug 121. Thus, the wiring 122 and the second high-concentration impurity diffusion layer 111 are connected to each other via the third plug 121. Then, as illustrated in FIG. 4A and FIG. 4B, a third interlayer insulating film 123 is formed on the second interlayer insulating film 120 including the wiring 122, and a fourth plug 124 made of tungsten is formed through the third interlayer insulating film 123 so as to be connected to the wiring 122. Note that a fifth plug 125 is formed through the first interlayer insulating film 112, the insulative film 117 and the second interlayer insulating film 120, as illustrated in FIG. 4B, whereby the first high-concentration impurity diffusion layer 106 (a portion to be a drain region) and the wiring 122 are connected to each other. Then, although not shown, a further interlayer insulating film, a further wiring, a surface protection film, etc., are formed on the third interlayer insulating film 123 to complete the ferroelectric memory.

As described above, according to the first embodiment, the first interlayer insulating film 112 is formed on the semiconductor substrate 100, on which a memory cell transistor and a control transistor including the second high-concentration impurity diffusion layer 111 have been formed, and the first plug 113 connected to the memory cell transistor and the second plug 114 connected to the second high-concentration impurity diffusion layer 111 are formed through the first interlayer insulating film 112. Then, the capacitor lower electrode 115 connected to the first plug 113 is formed on the first interlayer insulating film 112, after which the capacitor insulative film 118 made of a ferroelectric film, and the capacitor upper electrode 119 extending beyond the area of the capacitor insulative film 118 and electrically connected to the second plug 114, are formed successively on the capacitor lower electrode 115. Then, the second interlayer insulating film 120 is formed on the first interlayer insulating film 112 including the capacitor upper electrode 119, and the third plug 121 connecting the second high-concentration impurity diffusion layer 111 and the wiring 122 on the second interlayer insulating film 120 to each other is formed through the first interlayer insulating film 112 and the second interlayer insulating film 120. Therefore, before the formation of the capacitor upper electrode 119, more specifically, simultaneously with the formation of the first plug 113 connecting the memory cell transistor and the capacitor lower electrode 115 to each other, the second plug 114 connecting the capacitor upper electrode 119 and the second high-concentration impurity diffusion layer 111 to each other can be formed through the first interlayer insulating film 112. Thus, the capacitor upper electrode 119 and the wiring 122 can be electrically connected to each other via the second plug 114, the second high-concentration impurity diffusion layer 111 and the third plug 121. In other words, the capacitor upper electrode 119 and the wiring 122 can be electrically connected to each other by using the second plug 114 and the second high-concentration impurity diffusion layer 111, which are formed in advance below the capacitive element. Therefore, it is not necessary, after the formation of the capacitor upper electrode 119, to form a contact hole for forming a plug therein that directly connects the capacitor upper electrode 119 and the wiring 122 to each other, thereby preventing the capacitor upper electrode 119 from being exposed to a hydrogen atmosphere or a reducing atmosphere. As a result, even when a Pt film having a strong catalytic function is used as the capacitor upper electrode 119, deterioration of the characteristics of the ferroelectric film forming the capacitor insulative film 118 is prevented, thereby improving the reliability of the ferroelectric memory.

Moreover, according to the first embodiment, the capacitor lower electrode 115 having an oxygen barrier property covers the upper surface of the first plug 113, while the connection pad 116 having an oxygen barrier property covers the upper surface of the second plug 114. Thus, it is possible to prevent the first plug 113 and the second plug 114 from being oxidized when sintering the ferroelectric film forming the capacitor insulative film 118 in an oxygen atmosphere.

Moreover, according to the first embodiment, the connection pad 116 is formed simultaneously with the formation of the capacitor lower electrode 115 by patterning a conductive film used as a material of the capacitor lower electrode 115 and having an oxygen barrier property so as to cover the entire upper surface of the second plug 114, thereby preventing the second plug 114 from being oxidized, without increasing the number of manufacturing steps. Moreover, since the capacitor upper electrode 119 is formed so as to be connected to the connection pad 116, the capacitor upper electrode 119 and the second plug 114 can be connected to each other via the connection pad 116.

Moreover, according to the first embodiment, the insulative film 117 is embedded in a region between adjacent capacitor lower electrodes 115 or a region between the capacitor lower electrode 115 and the connection pad 116 so that the upper surface thereof is coplanar with the upper surfaces of the capacitor lower electrode 115 and the connection pad 116. Therefore, the step of depositing the capacitor insulative film 118, etc., can be performed on a flat base surface, thereby improving the reliability of the capacitive element, i.e., the reliability of the ferroelectric memory.

Moreover, in the first embodiment, if a surface portion of the second high-concentration impurity diffusion layer 111 is silicified into a silicide layer, and the silicide layer is used as the conductive layer connecting the second plug 114 and the third plug 121 to each other, the following effect can be obtained. That is, the resistance of the conductive layer can be reduced as compared to a case where a polysilicon layer formed on the semiconductor substrate 100, or the like, is used as the conductive layer connecting the second plug 114 and the third plug 121 to each other.

Note that while tungsten is used as a material of the first plug 113, the second plug 114 or the third plug 121, etc., in the first embodiment, polysilicon, or the like, may alternatively be used.

Moreover, in the first embodiment, it is preferred that the capacitor lower electrode 115 is a layered film including a lower layer film (functioning as an adhesion layer) and an upper layer film, wherein the lower layer film is a TiON film having a low oxygen content, a TiN film, a Ti-containing alloy film, or the like, and the upper layer film is a Pt film or a Pt-containing alloy film that is highly resistant to oxidization, an Ru film or an Ir film whose oxide has an oxygen barrier property and is electrically conductive, an $RuO_2$ film or an $IrO_2$ film, or the like.

Moreover, in the first embodiment, it is preferred that the insulative film 117 embedded between adjacent capacitor lower electrodes 115 is an $SiO_2$ film, an $Si_3N_4$ film, SiON film, or the like.

Moreover, in the first embodiment, it is preferred that a PZT type material, an SBT type material, or the like, is used as the material of the ferroelectric film forming the capacitor insulative film 118.

Moreover, in the first embodiment, it is preferred that the capacitor upper electrode 119 is at least partially a Pt film or: a Pt-containing alloy film that is highly resistant to oxidization, an Ru film or an Ir film whose oxide has an oxygen barrier property and is electrically conductive, an $RuO_2$ film or an $IrO_2$ film, or the like. In this way, it is possible to sufficiently grow the crystal of the ferroelectric film forming the capacitor insulative film 118.

Figure 5:
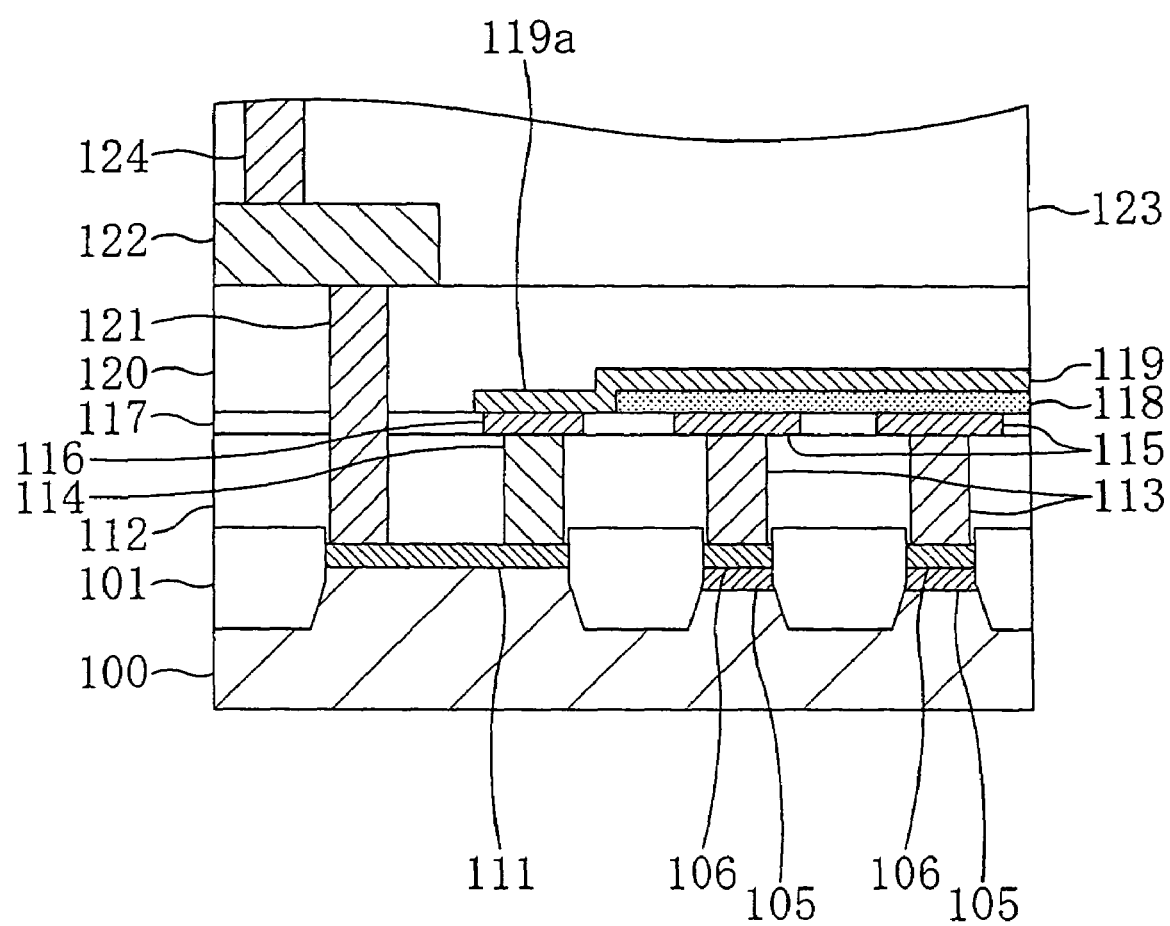
FIG. 5 is a cross-sectional view illustrating an example of a ferroelectric memory according to the first embodiment of the present invention.

Moreover, in the first embodiment, a control transistor including the second gate electrode 108, etc., (having a function as a driver for turning ON/OFF the capacitor upper electrode 119, i.e., a memory cell plate) is formed in a non-memory cell region on the semiconductor substrate 100. Thus, in the first embodiment, the capacitor upper electrode 119 and the wiring 122 are electrically connected to each other via the second plug 114, the second high-concentration impurity diffusion layer 111 (i.e., a source region or a drain region of the control transistor) and the third plug 121 only when the control transistor is ON. In contrast, in a ferroelectric memory whose circuit configuration does not require a control transistor, only the second high-concentration impurity diffusion layer 111 may be formed in the non-memory cell region on the semiconductor substrate 100, as illustrated in FIG. 5, for example. In such a case, the capacitor upper electrode 119 and the wiring 122 are always electrically connected to each other via the second plug 114, the second high-concentration impurity diffusion layer 111 and the third plug 121. Moreover, in such a case, a silicide layer may be formed in a surface portion of the second high-concentration impurity diffusion layer 111.

Moreover, in the first embodiment, the upper surface of the second plug 114 is covered by the connection pad 116 having an oxygen barrier property. Alternatively, the connection pad 116 may be omitted when, for example, the second plug 114 is made of a material having an oxygen barrier property. In this way, the degree of integration of the ferroelectric memory can be improved. In such a case, it is preferred that the extension 119a of the capacitor upper electrode 119 covers at least a portion of the upper surface of the second plug 114.

Moreover, in the first embodiment, the insulative film 117 is embedded in a region between adjacent capacitor lower electrodes 115 or a region between the capacitor lower electrode 115 and the connection pad 116. Alternatively, the insulative film 117 may be omitted.

Moreover, in the first embodiment, it is preferred that a side wall is formed on the side surface of the capacitor insulative film 118 before the formation of the capacitor upper electrode 119. In this way, the step covering property of the conductive film to be the capacitor upper electrode 119 is improved, and it is possible to prevent disconnection from occurring in the extension 119a of the capacitor upper electrode 119, thereby improving the reliability of the ferroelectric memory.

Moreover, in the first embodiment, the wiring 122 is formed on the second interlayer insulating film 120 so as to be connected to the third plug 121. Alternatively, the wiring 122 may be embedded in the second interlayer insulating film 120 so as to be connected to the third plug 121.

(First Variation of First Embodiment)

A ferroelectric memory according to a first variation of the first embodiment of the present invention, and a method for manufacturing the same, will now be described with reference to the drawings.

FIG. 6A to FIG. 6C, FIG. 7A, FIG. 7B, FIG. 8A and FIG. 8B are cross-sectional views each illustrating a step in a method for manufacturing a ferroelectric memory according to the first variation of the first embodiment.

Figure 6A:
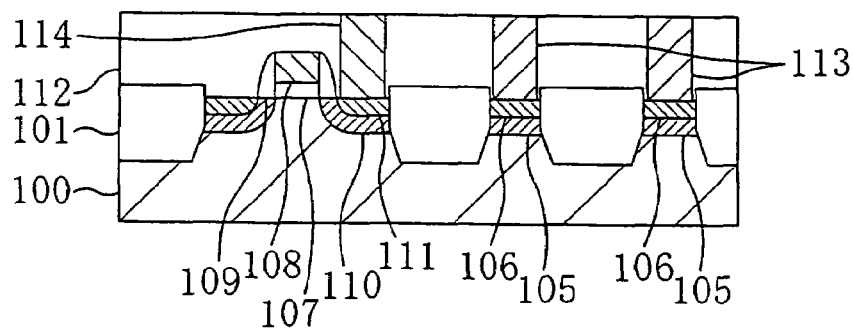
FIG. 6A to FIG. 6C are cross-sectional views each illustrating a step in a method for manufacturing a ferroelectric memory according to a first variation of the first embodiment of the present invention.

First, as illustrated in FIG. 6A, a device isolation region 101 having an STI structure is formed on the surface of a semiconductor substrate 100. Then, in a surface portion of a memory cell region within each region of the semiconductor substrate 100 surrounded by the device isolation region 101, a first low-concentration impurity diffusion layer 105 to be the lower layer and a first high-concentration impurity diffusion layer 106 to be the upper layer are formed. The first low-concentration impurity diffusion layer 105 and the first high-concentration impurity diffusion layer 106 are to be a source region or a drain region of the memory cell transistor (the gate electrode, etc., are not shown).

Moreover, as illustrated in FIG. 6A, a second gate electrode 108 forming a part of a control transistor is formed via a second gate insulating film 107 on a non-memory cell region of the semiconductor substrate 100. Then, an insulative second side wall 109 is formed on the side surface of the second gate electrode 108, and a second low-concentration impurity diffusion layer 110 to be the lower layer and a second high-concentration impurity diffusion layer 111 to be the upper layer are formed in a surface portion of a non-memory cell region of the semiconductor substrate 100. The second low-concentration impurity diffusion layer 110 and the second high-concentration impurity diffusion layer 111 are to be a source region or a drain region of the control transistor.

Note that in the first variation of the first embodiment, each of various elements, e.g., a gate electrode, of the memory cell transistor may be formed simultaneously with its counterpart element of the control transistor.

Then, as illustrated in FIG. 6A, a first interlayer insulating film 112 is formed on the semiconductor substrate 100, on which the memory cell transistor and the control transistor have been formed. Then, a first plug 113 made of tungsten and connected to the first high-concentration impurity diffusion layer 106 (a portion to be a source region), and a second plug 114 made of tungsten and connected to the second high-concentration impurity diffusion layer 111 (either a portion to be a source region or a portion to be a drain region), are formed through the first interlayer insulating film 112.

Figure 6B:
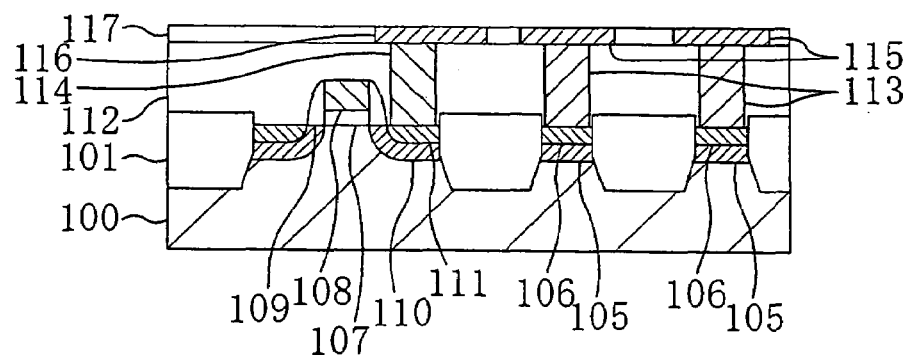

Then, a conductive film having an oxygen barrier property (e.g., an Ir film, an $IrO_2$ film, or the like) is deposited across the entire surface of the first interlayer insulating film 112, and the conductive film is patterned, thereby forming a capacitor lower electrode 115 and a connection pad 116, as illustrated in FIG. 6B. The capacitor lower electrode 115 is made of a conductive film having an oxygen barrier property and covers the upper surface of the first plug 113, and the connection pad 116 is made of a conductive film having an oxygen barrier property and covers the upper surface of the second plug 114. Thus, the memory cell transistor and the capacitor lower electrode 115 are connected to each other via the first plug 113. Then, an insulative film 117 is embedded in a region between adjacent capacitor lower electrodes 115 or a region between the capacitor lower electrode 115 and the connection pad 116 so that the upper surface thereof is coplanar with the upper surfaces of the capacitor lower electrode 115 and the connection pad 116.

Figure 6C:
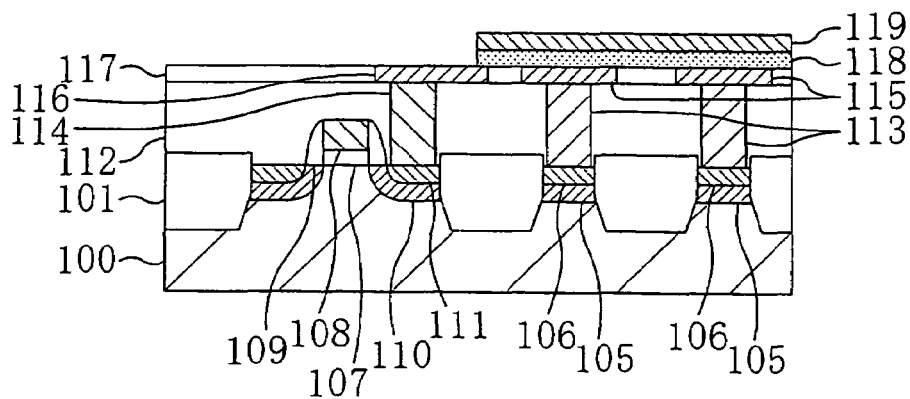

Then, a ferroelectric film made of a PZT type material or an SBT type material, and a conductive film made of Pt or a Pt-containing alloy, are successively deposited across the entire surface of the first interlayer insulating film 112, on which the insulative film 117 has been formed, after which the conductive film and the ferroelectric film are patterned using the same mask pattern (not shown). Thus, a capacitor insulative film 118 covering the upper surface of the capacitor lower electrode 115, and a capacitor upper electrode 119 covering the upper surface of the capacitor insulative film 118, are formed as illustrated in FIG. 6C. In this process, the capacitor insulative film 118 and the capacitor upper electrode 119 are formed so that the edges thereof are located within the area of the connection pad 116. Note that the capacitor lower electrode 115, the capacitor insulative film 118 and the capacitor upper electrode 119 together form a capacitive element.

Figure 7A:
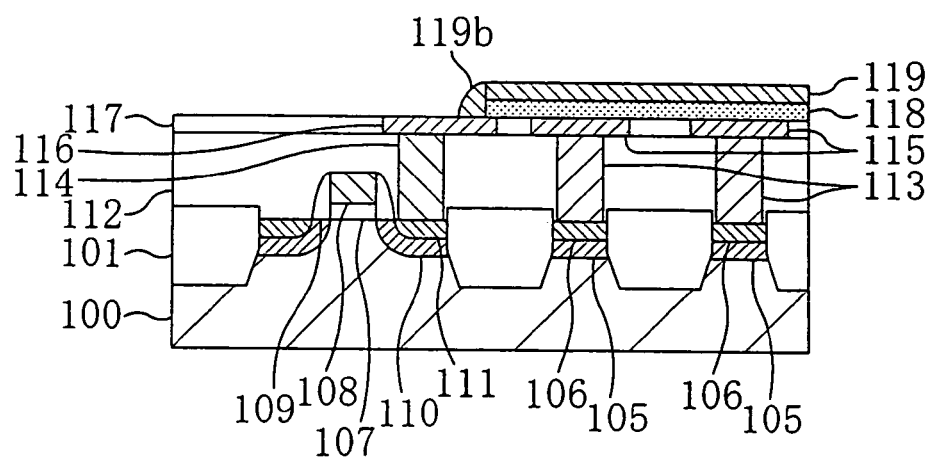
FIG. 7A and FIG. 7B are cross-sectional views each illustrating a step in the method for manufacturing a ferroelectric memory according to the first variation of the first embodiment of the present invention.

Then, a conductive film (not shown) is deposited across the entire surface of the first interlayer insulating film 112, on which the capacitive element has been formed, and the conductive film is etched back to form a conductive third side wall 119b on the side surface of the capacitor upper electrode 119 so that the conductive third side wall 119b is connected to the connection pad 116, as illustrated in FIG. 7A. Thus, the capacitor upper electrode 119 and the second high-concentration impurity diffusion layer 111 are electrically connected to each other via the second plug 114.

Figure 7B:
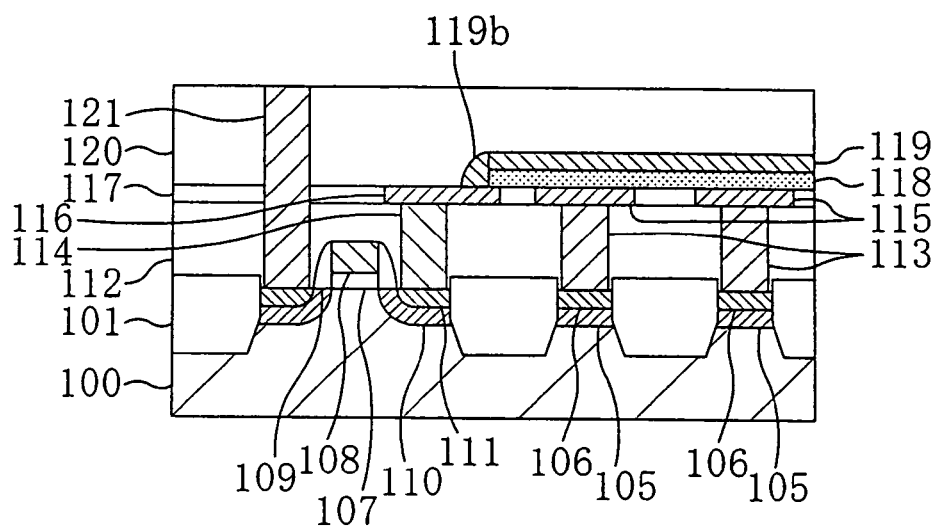

Then, as illustrated in FIG. 7B, a second interlayer insulating film 120 is formed on the first interlayer insulating film 112, on which the capacitive element has been formed. Then, a third plug 121 made of tungsten is formed through the first interlayer insulating film 112, the insulative film 117 and the second interlayer insulating film 120 so as to be connected to the second high-concentration impurity diffusion layer 111 (one of a portion to be a source region and a portion to be a drain region to which the second plug 114 is not connected).

Figure 8A:
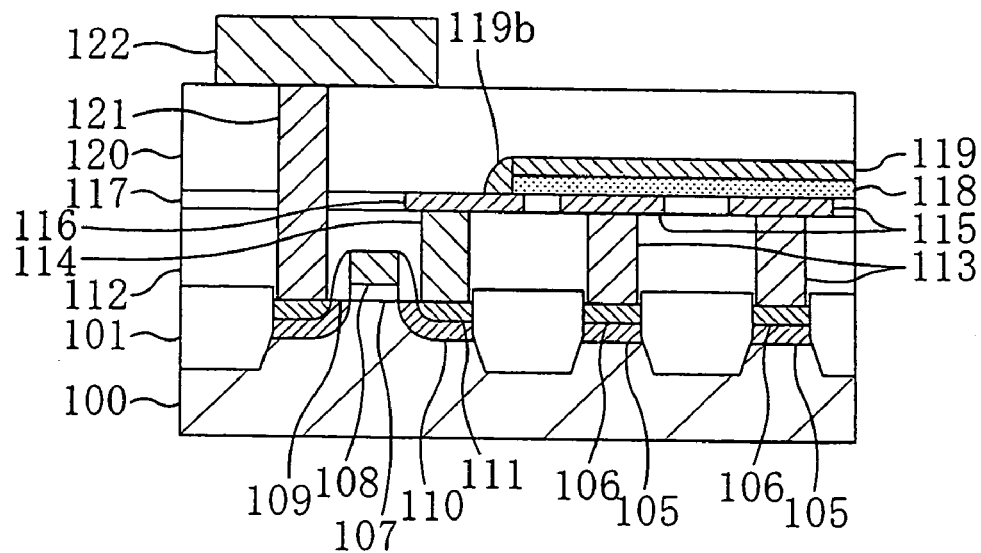
FIG. 8A and FIG. 8B are cross-sectional views each illustrating a step in the method for manufacturing a ferroelectric memory according to the first variation of the first embodiment of the present invention.
Figure 8B:
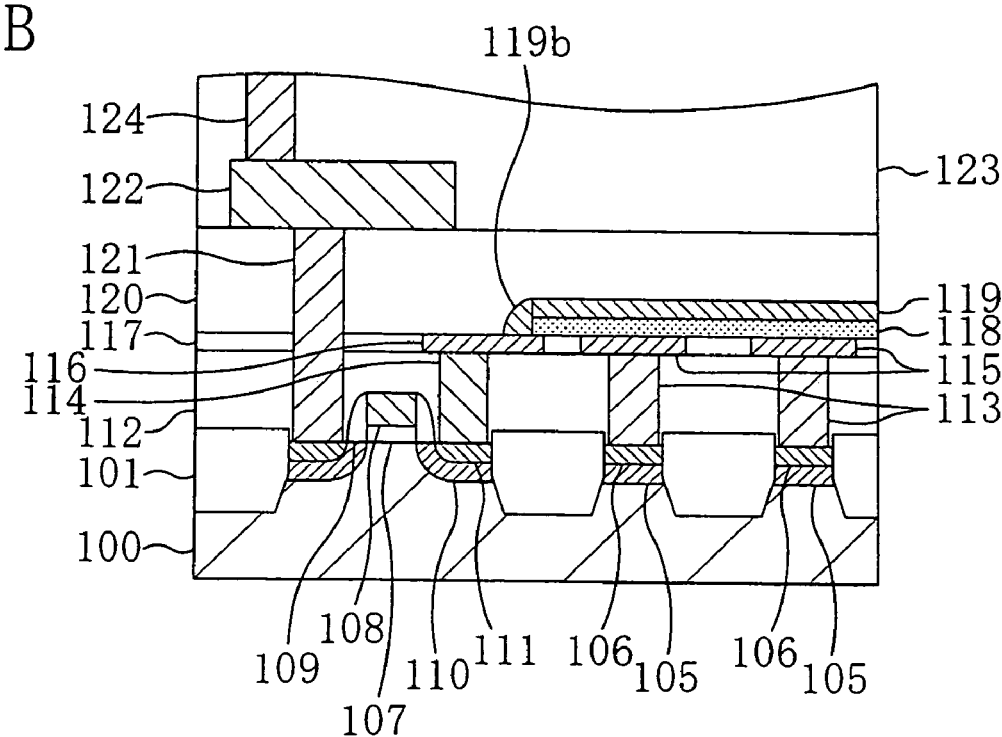

Then, as illustrated in FIG. 8A, a wiring 122 made of aluminum, or the like, is formed on the second interlayer insulating film 120 so as to be connected to the third plug 121. Thus, the wiring 122 and the second high-concentration impurity diffusion layer 111 are connected to each other via the third plug 121. Then, as illustrated in FIG. 8B, a third interlayer insulating film 123 is formed on the second interlayer insulating film 120 including the wiring 122, and a fourth plug 124 made of tungsten is formed through the third interlayer insulating film 123 so as to be connected to the wiring 122. Then, although not shown, a further interlayer insulating film, a further wiring, a surface protection film, etc., are formed on the third interlayer insulating film 123 to complete the ferroelectric memory.

As described above, according to the first variation of the first embodiment, the first interlayer insulating film 112 is formed on the semiconductor substrate 100, on which a memory cell transistor and a control transistor including the second high-concentration impurity diffusion layer 111 have been formed, and the first plug 113 connected to the memory cell transistor and the second plug 114 connected to the second high-concentration impurity diffusion layer 111 are formed through the first interlayer insulating film 112. Then, the capacitor lower electrode 115 connected to the first plug 113 is formed on the first interlayer insulating film 112, after which the ferroelectric film to be the capacitor insulative film 118 and the conductive film to be the capacitor upper electrode 119 are patterned using the same mask pattern, thereby forming the capacitor insulative film 118 covering the upper surface of the capacitor lower electrode 115, and the capacitor upper electrode 119 covering the upper surface of the capacitor insulative film 118. Then, the conductive third side wall 119b is formed on the side surface of the capacitor upper electrode 119 so as to be electrically connected to the second plug 114. Then, the second interlayer insulating film 120 is formed on the first interlayer insulating film 112 including the capacitor upper electrode 119, and the third plug 121 connecting the second high-concentration impurity diffusion layer 111 and the wiring 122 on the second interlayer insulating film 120 to each other is formed through the first interlayer insulating film 112 and the second interlayer insulating film 120. Therefore, before the formation of the capacitor upper electrode 119, more specifically, simultaneously with the formation of the first plug 113 connecting the memory cell transistor and the capacitor lower electrode 115 to each other, the second plug 114 connecting the capacitor upper electrode 119 and the second high-concentration impurity diffusion layer 111 to each other via the third side wall 119b can be formed through the first interlayer insulating film 112. Thus, the capacitor upper electrode 119 and the wiring 122 can be electrically connected to each other via the second plug 114, the second high-concentration impurity diffusion layer 111 and the third plug 121. In other words, the capacitor upper electrode 119 and the wiring 122 can be electrically connected to each other by using the second plug 114 and the second high-concentration impurity diffusion layer 111, which are formed in advance below the capacitive element. Therefore, it is not necessary, after the formation of the capacitor upper electrode 119, to form a contact hole for forming a plug therein that directly connects the capacitor upper electrode 119 and the wiring 122 to each other, thereby preventing the capacitor upper electrode 119 from being exposed to a hydrogen atmosphere or a reducing atmosphere. As a result, even when a Pt film having a strong catalytic function is used as the capacitor upper electrode 119, deterioration of the characteristics of the ferroelectric film forming the capacitor insulative film 118 is prevented, thereby improving the reliability of the ferroelectric memory.

Moreover, according to the first variation of the first embodiment, the capacitor lower electrode 115 having an oxygen barrier property covers the upper surface of the first plug 113, while the connection pad 116 having an oxygen barrier property covers the upper surface of the second plug 114. Thus, it is possible to prevent the first plug 113 and the second plug 114 from being oxidized when sintering the ferroelectric film forming the capacitor insulative film 118 in an oxygen atmosphere.

Moreover, according to the first variation of the first embodiment, the connection pad 116 is formed simultaneously with the formation of the capacitor lower electrode 115 by patterning a conductive film used as a material of the capacitor lower electrode 115 and having an oxygen barrier property so as to cover the entire upper surface of the second plug 114, thereby preventing the second plug 114 from being oxidized, without increasing the number of manufacturing steps. Moreover, since the conductive third side wall 119b is formed on the side surface of the capacitor upper electrode 119 so as to be connected to the connection pad 116, the capacitor upper electrode 119 and the second plug 114 can be connected to each other via the third side wall 119b and the connection pad 116.

Moreover, according to the first variation of the first embodiment, the capacitor insulative film 118 is formed so that the edge thereof is located within the area of the connection pad 116. Therefore, it is possible to form the capacitor insulative film 118 while preventing step formation due to over-etching, by using, as the material of the connection pad 116, a conductive film having a large etching selectivity ratio with respect to the insulative film to be the capacitor insulative film 118, and patterning the insulative film using the connection pad 116 as an etching stopper.

Moreover, according to the first variation of the first embodiment, the conductive film to be the capacitor upper electrode 119 is patterned using the same mask pattern that is used for patterning the insulative film to be the capacitor insulative film 118, thereby reducing the number of mask patterns to be used in the manufacturing process.

Moreover, according to the first variation of the first embodiment, the insulative film 117 is embedded in a region between adjacent capacitor lower electrodes 115 or a region between the capacitor lower electrode 115 and the connection pad 116 so that the upper surface thereof is coplanar with the upper surfaces of the capacitor lower electrode 115 and the connection pad 116. Therefore, the step of depositing the capacitor insulative film 118, etc., can be performed on a flat base surface, thereby improving the reliability of the capacitive element, i.e., the reliability of the ferroelectric memory.

Moreover, in the first variation of the first embodiment, if a surface portion of the second high-concentration impurity diffusion layer 111 is silicified into a silicide layer, and the silicide layer is used as the conductive layer connecting the second plug 114 and the third plug 121 to each other, the following effect can be obtained. That is, the resistance of the conductive layer can be reduced as compared to a case where a polysilicon layer formed on the semiconductor substrate 100, or the like, is used as the conductive layer connecting the second plug 114 and the third plug 121 to each other.

Note that in the first variation of the first embodiment, it is preferred that the conductive film forming the third side wall 119b is a conductive film having a large etching selectivity ratio with respect to the conductive film forming the capacitor upper electrode 119 or the capacitor lower electrode 115, e.g., a TiN film, a TaN film, or the like. In this way, it is possible to suppress the damage to the capacitor upper electrode 119 or the capacitor lower electrode 115 occurring when forming the third side wall 119b.

Moreover, while tungsten is used as a material of the first plug 113, the second plug 114 or the third plug 121, etc., in the first variation of the first embodiment, polysilicon, or the like, may alternatively be used.

Moreover, in the first variation of the first embodiment, it is preferred that the capacitor lower electrode 115 is a layered film including a lower layer film (functioning as an adhesion layer) and an upper layer film, wherein the lower layer film is a TiON film having a low oxygen content, a TiN film, a Ti-containing alloy film, or the like, and the upper layer film is a Pt film or a Pt-containing alloy film that is highly resistant to oxidization, an Ru film or an Ir film whose oxide has an oxygen barrier property and is electrically conductive, an $RuO_2$ film or an $IrO_2$ film, or the like.

Moreover, in the first variation of the first embodiment, it is preferred that the insulative film 117 embedded between adjacent capacitor lower electrodes 115 is an $SiO_2$ film, an $Si_3N_4$ film, an SiON film, or the like.

Moreover, in the first variation of the first embodiment, it is preferred that a PZT type material, an SBT type material, or the like, is used as the material of the ferroelectric film forming the capacitor insulative film 118.

Moreover, in the first variation of the first embodiment, it is preferred that the capacitor upper electrode 119 is at least partially a Pt film or a Pt-containing alloy film that is highly resistant to oxidization, an Ru film or an Ir film whose oxide has an oxygen barrier property and is electrically conductive, an $RuO_2$ film or an $IrO_2$ film, or the like. In this way, it is possible to sufficiently grow the crystal of the ferroelectric film forming the capacitor insulative film 118.

Moreover, in the first variation of the first embodiment, a control transistor including the second gate electrode 108, etc., is formed in a non-memory cell region on the semiconductor substrate 100. However, in a ferroelectric memory whose circuit configuration does not require a control transistor, only the second high-concentration impurity diffusion layer 111 may be formed in the non-memory cell region on the semiconductor substrate 100. In such a case, a silicide layer may be formed in a surface portion of the second high-concentration impurity diffusion layer 111.

Moreover, in the first variation of the first embodiment, the upper surface of the second plug 114 is covered by the connection pad 116 having an oxygen barrier property. Alternatively, the connection pad 116 may be omitted when, for example, the second plug 114 is made of a material having an oxygen barrier property. In this way, the degree of integration of the ferroelectric memory can be improved. In such a case, it is preferred that the third side wall 119b covers at least a portion of the upper surface of the second plug 114.

Moreover, in the first variation of the first embodiment, the insulative film 117 is embedded in a region between adjacent capacitor lower electrodes 115 or a region between the capacitor lower electrode 115 and the connection pad 116. Alternatively, the insulative film 117 may be omitted.

Moreover, in the first variation of the first embodiment, the wiring 122 is formed on the second interlayer insulating film 120 so as to be connected to the third plug 121. Alternatively, the wiring 122 may be embedded in the second interlayer insulating film 120 so as to be connected to the third plug 121.

(Second Variation of First Embodiment)

A ferroelectric memory according to a second variation of the first embodiment of the present invention, and a method for manufacturing the same, will now be described with reference to the drawings.

FIG. 9A to FIG. 9C, FIG. 10A to FIG. 10C and FIG. 11A to FIG. 11C are cross-sectional views each illustrating a step in a method for manufacturing a ferroelectric memory according to the second variation of the first embodiment.

Figure 9A:
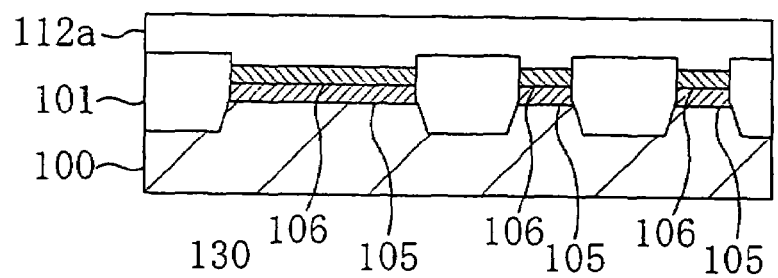
FIG. 9A to FIG. 9C are cross-sectional views each illustrating a step in a method for manufacturing a ferroelectric memory according to a second variation of the first embodiment of the present invention.

First, as illustrated in FIG. 9A, a device isolation region 101 having an STI structure is formed on the surface of a semiconductor substrate 100. Then, in a surface portion of a memory cell region within each region of the semiconductor substrate 100 surrounded by the device isolation region 101, a first low-concentration impurity diffusion layer 105 to be the lower layer and a first high-concentration impurity diffusion layer 106 to be the upper layer are formed. The first low-concentration impurity diffusion layer 105 and the first high-concentration impurity diffusion layer 106 are to be a source region or a drain region of the memory cell transistor (the gate electrode, etc., are not shown). The first low-concentration impurity diffusion layer 105 and the first high-concentration impurity diffusion layer 106 may be formed in a surface portion of a non-memory cell region of the semiconductor substrate 100. Then, a lower layer film 112a of a first interlayer insulating film 112 is formed on the semiconductor substrate 100, on which the memory cell transistor has been formed.

Figure 9B:
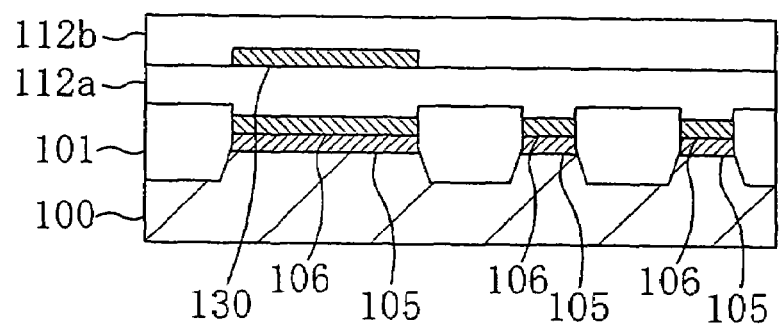

Then, as illustrated in FIG. 9B, a conductive layer 130 made of polysilicon, for example, is formed on a non-memory cell region of the semiconductor substrate 100, on which the lower layer film 112a has been formed, and an upper layer film 112b of the first interlayer insulating film 112 is formed on the conductive layer 130 and the lower layer film 112a.

Figure 9C:
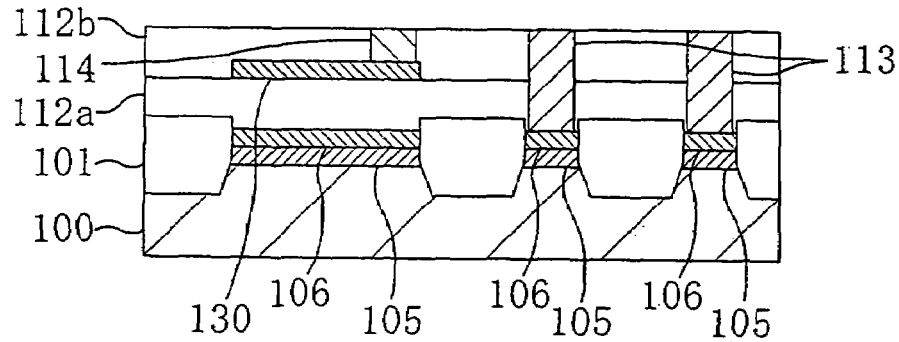

Then, as illustrated in FIG. 9C, a first plug 113 made of tungsten and connected to the first high-concentration impurity diffusion layer 106 (a portion to be a source region) is formed through the upper layer film 112b and the lower layer film 112a of the first interlayer insulating film 112, and a second plug 114 made of tungsten and connected to the conductive layer 130 is formed through the upper layer film 112b of the first interlayer insulating film 112.

Figure 10A:
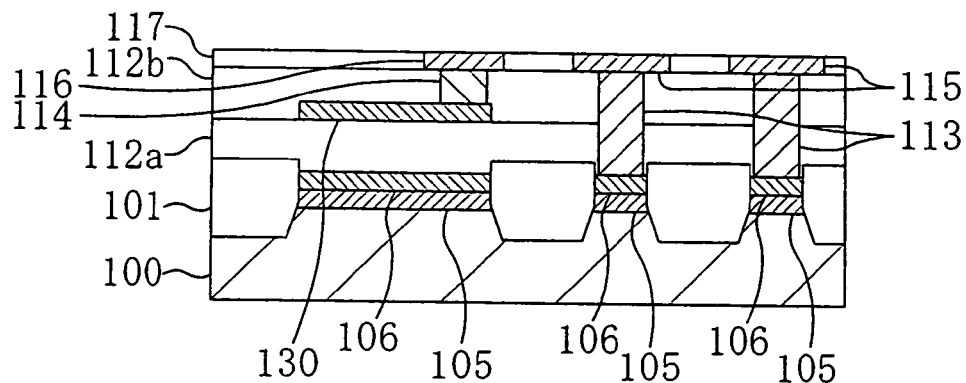
FIG. 10A to FIG. 10C are cross-sectional views each illustrating a step in the method for manufacturing a ferroelectric memory according to the second variation of the first embodiment of the present invention.

Then, a conductive film having an oxygen barrier property (e.g., an Ir film, an $IrO_2$ film, or the like) is deposited across the entire surface of the first interlayer insulating film 112, and the conductive film is patterned, thereby forming a capacitor lower electrode 115 and a connection pad 116, as illustrated in FIG. 10A. The capacitor lower electrode 115 is made of a conductive film having an oxygen barrier property and covers the upper surface of the first plug 113, and the connection pad 116 is made of a conductive film having an oxygen barrier property and covers the upper surface of the second plug 114. Thus, the memory cell transistor and the capacitor lower electrode 115 are connected to each other via the first plug 113. Then, an insulative film 117 is embedded in a region between adjacent capacitor lower electrodes 115 or a region between the capacitor lower electrode 115 and the connection pad 116 so that the upper surface thereof is coplanar with the upper surfaces of the capacitor lower electrode 115 and the connection pad 116.

Figure 10B:
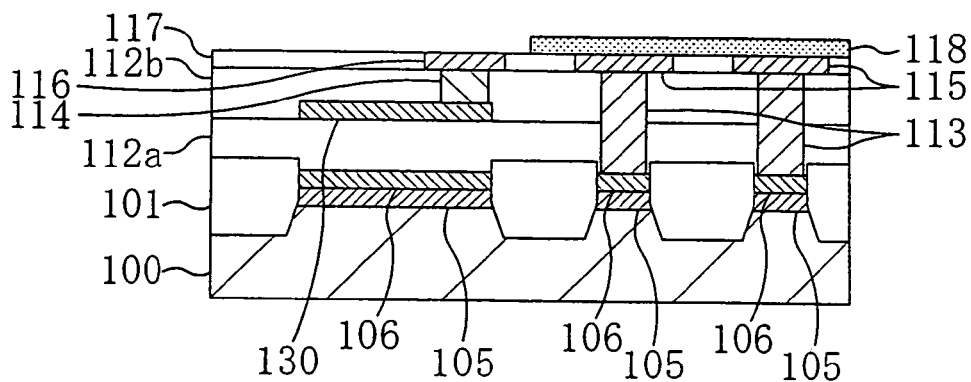

Then, a ferroelectric film made of a PZT type material or an SBT type material is deposited across the entire surface of the first interlayer insulating film 112, on which the insulative film 117 has been formed, after which the ferroelectric film is patterned, thereby forming a capacitor insulative film 118 covering the upper surface of the capacitor lower electrode 115, as illustrated in FIG. 10B.

Figure 10C:
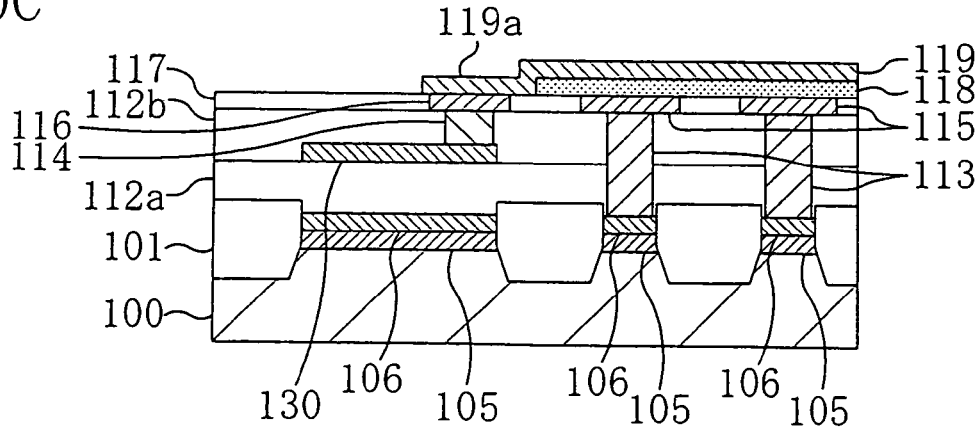

Then, a conductive film made of Pt or a Pt-containing alloy is deposited across the entire surface of the first interlayer insulating film 112, on which the capacitor insulative film 118 has been formed, and the conductive film is patterned, thereby forming a capacitor upper electrode 119 covering the upper surface of the capacitor insulative film 118 and extending beyond the area of the capacitor insulative film 118, as illustrated in FIG. 10C. Specifically, the capacitor upper electrode 119 includes an extension 119a covering at least a portion of the upper surface of the connection pad 116, and the extension 119a is formed when patterning the conductive film to be the capacitor upper electrode 119. Thus, the capacitor upper electrode 119 and the second plug 114 are connected to each other via the connection pad 116, whereby the capacitor upper electrode 119 and the conductive layer 130 are electrically connected to each other via the second plug 114. Note that the capacitor lower electrode 115, the capacitor insulative film 118 and the capacitor upper electrode 119 together form a capacitive element.

Figure 11A:
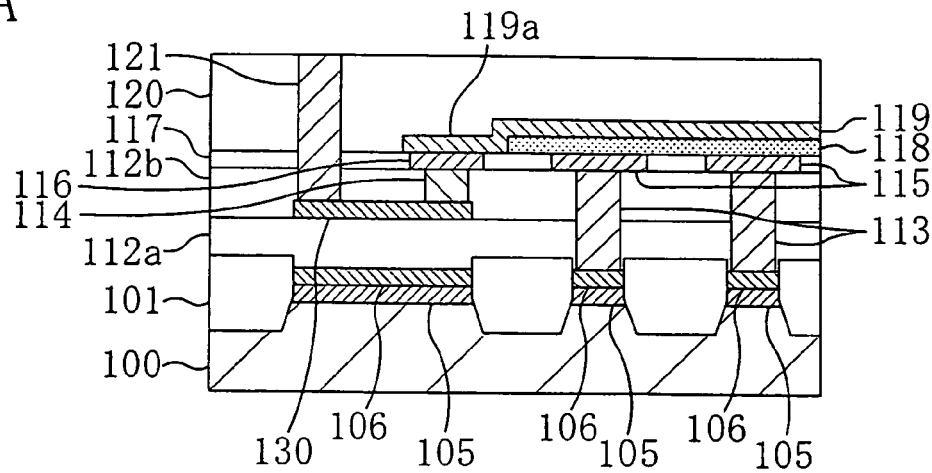
FIG. 11A to FIG. 11C are cross-sectional views each illustrating a step in the method for manufacturing a ferroelectric memory according to the second variation of the first embodiment of the present invention.

Then, as illustrated in FIG. 11A, a second interlayer insulating film 120 is formed on the first interlayer insulating film 112, on which the capacitive element has been formed. Then, a third plug 121 made of tungsten is formed through the upper layer film 112b of the first interlayer insulating film 112, the insulative film 117 and the second interlayer insulating film 120 so as to be connected to the conductive layer 130.

Figure 11B:
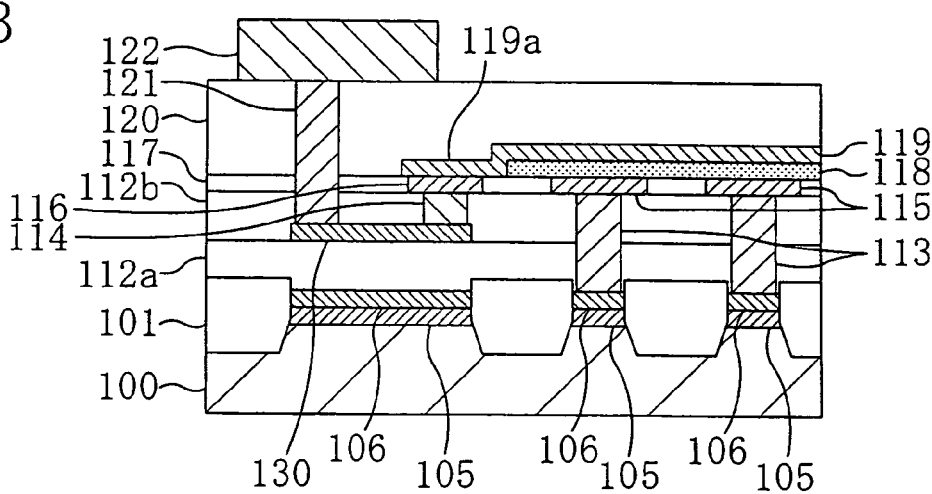
Figure 11C:
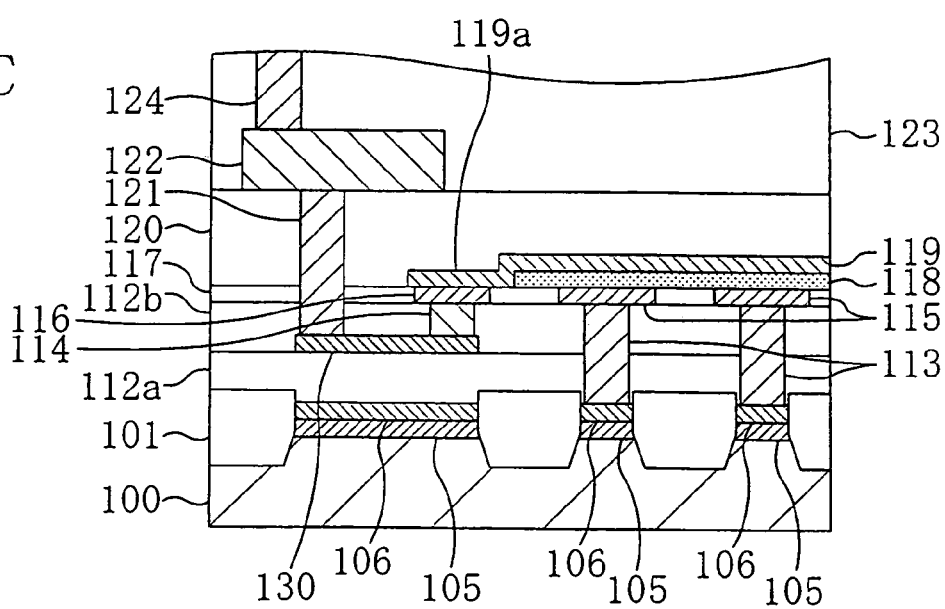

Then, as illustrated in FIG. 11B, a wiring 122 made of aluminum, or the like, is formed on the second interlayer insulating film 120 so as to be connected to the third plug 121. Thus, the wiring 122 and the conductive layer 130 are connected to each other via the third plug 121. Then, as illustrated in FIG. 1C, a third interlayer insulating film 123 is formed on the second interlayer insulating film 120 including the wiring 122, and a fourth plug 124 made of tungsten is formed through the third interlayer insulating film 123 so as to be connected to the wiring 122. Then, although not shown, a further interlayer insulating film, a further wiring, a surface protection film, etc., are formed on the third interlayer insulating film 123 to complete the ferroelectric memory.

As described above, according to the second variation of the first embodiment, the lower layer film 112a of the first interlayer insulating film 112 is formed on the semiconductor substrate 100, on which a memory cell transistor has been formed, and the conductive layer 130 is formed on the lower layer film 112a in a non-memory cell region, after which the upper layer film 112b of the first interlayer insulating film 112 is formed. Then, the first plug 113 connected to the memory cell transistor and the second plug 114 connected to the conductive layer 130 are formed through the first interlayer insulating film 112. Then, the capacitor lower electrode 115 connected to the first plug 113 is formed on the first interlayer insulating film 112, after which the capacitor insulative film 118 made of a ferroelectric film, and the capacitor upper electrode 119 extending beyond the area of the capacitor insulative film 118 and electrically connected to the second plug 114, are formed successively on the capacitor lower electrode 115. Then, the second interlayer insulating film 120 is formed on the first interlayer insulating film 112 including the capacitor upper electrode 119, and the third plug 121 connecting the conductive layer 130 and the wiring 122 on the second interlayer insulating film 120 to each other is formed through the first interlayer insulating film 112 and the second interlayer insulating film 120. Therefore, before the formation of the capacitor upper electrode 119, more specifically, simultaneously with the formation of the first plug 113 connecting the memory cell transistor and the capacitor lower electrode 115 to each other, the second plug 114 connecting the capacitor upper electrode 119 and the conductive layer 130 to each other can be formed through the first interlayer insulating film 112. Thus, the capacitor upper electrode 119 and the wiring 122 can be electrically connected to each other via the second plug 114, the conductive layer 130 and the third plug 121. In other words, the capacitor upper electrode 119 and the wiring 122 can be electrically connected to each other by using the second plug 114 and the conductive layer 130, which are formed in advance below the capacitive element. Therefore, it is not necessary, after the formation of the capacitor upper electrode 119, to form a contact hole for forming a plug therein that directly connects the capacitor upper electrode 119 and the wiring 122 to each other, thereby preventing the capacitor upper electrode 119 from being exposed to a hydrogen atmosphere or a reducing atmosphere. As a result, even when a Pt film having a strong catalytic function is used as the capacitor upper electrode 119, deterioration of the characteristics of the ferroelectric film forming the capacitor insulative film 118 is prevented, thereby improving the reliability of the ferroelectric memory.

Moreover, according to the second variation of the first embodiment, the capacitor lower electrode 115 having an oxygen barrier property covers the upper surface of the first plug 113, while the connection pad 116 having an oxygen barrier property covers the upper surface of the second plug 114. Thus, it is possible to prevent the first plug 113 and the second plug 114 from being oxidized when sintering the ferroelectric film forming the capacitor insulative film 118 in an oxygen atmosphere.

Moreover, according to the second variation of the first embodiment, the connection pad 116 is formed simultaneously with the formation of the capacitor lower electrode 115 by patterning a conductive film used as a material of the capacitor lower electrode 115 and having an oxygen barrier property so as to cover the entire upper surface of the second plug 114, thereby preventing the second plug 114 from being oxidized, without increasing the number of manufacturing steps. Moreover, since the capacitor upper electrode 119 is formed so as to be connected to the connection pad 116, the capacitor upper electrode 119 and the second plug 114 can be connected to each other via the connection pad 116.

Moreover, according to the second variation of the first embodiment, the insulative film 117 is embedded in a region between adjacent capacitor lower electrodes 115 or a region between the capacitor lower electrode 115 and the connection pad 116 so that the upper surface thereof is coplanar with the upper surfaces of the capacitor lower electrode 115 and the connection pad 116. Therefore, the step of depositing the capacitor insulative film 118, etc., can be performed on a flat base surface, thereby improving the reliability of the capacitive element, i.e., the reliability of the ferroelectric memory.

Moreover, according to the second variation of the first embodiment, the conductive layer 130 connecting the second plug 114 and the third plug 121 to each other is formed between the lower layer film 112a and the upper layer film 112b of the first interlayer insulating film 112. Therefore, the substrate potential can be set easily and the cell size of the ferroelectric memory can be reduced, as compared to a case where an impurity diffusion layer formed in a surface portion of the semiconductor substrate 100 is used as the conductive layer connecting the second plug 114 and the third plug 121 to each other. Moreover, the aspect ratio of the hole in which the second plug 114 or the third plug 121 connected to the conductive layer 130 is to be embedded is reduced, thereby preventing a failure in the formation of each plug or an increase in the resistance thereof.

Note that while the material of the conductive layer 130 is not limited to any particular material in the second variation of the first embodiment, it is preferred to use a low resistance material, e.g., polysilicon, silicide, tungsten, or the like, as the material of the conductive layer 130, in view of the fact that the conductive layer 130 is used as an extraction line for the capacitor upper electrode 119 as in the present variation.

Figure 12:
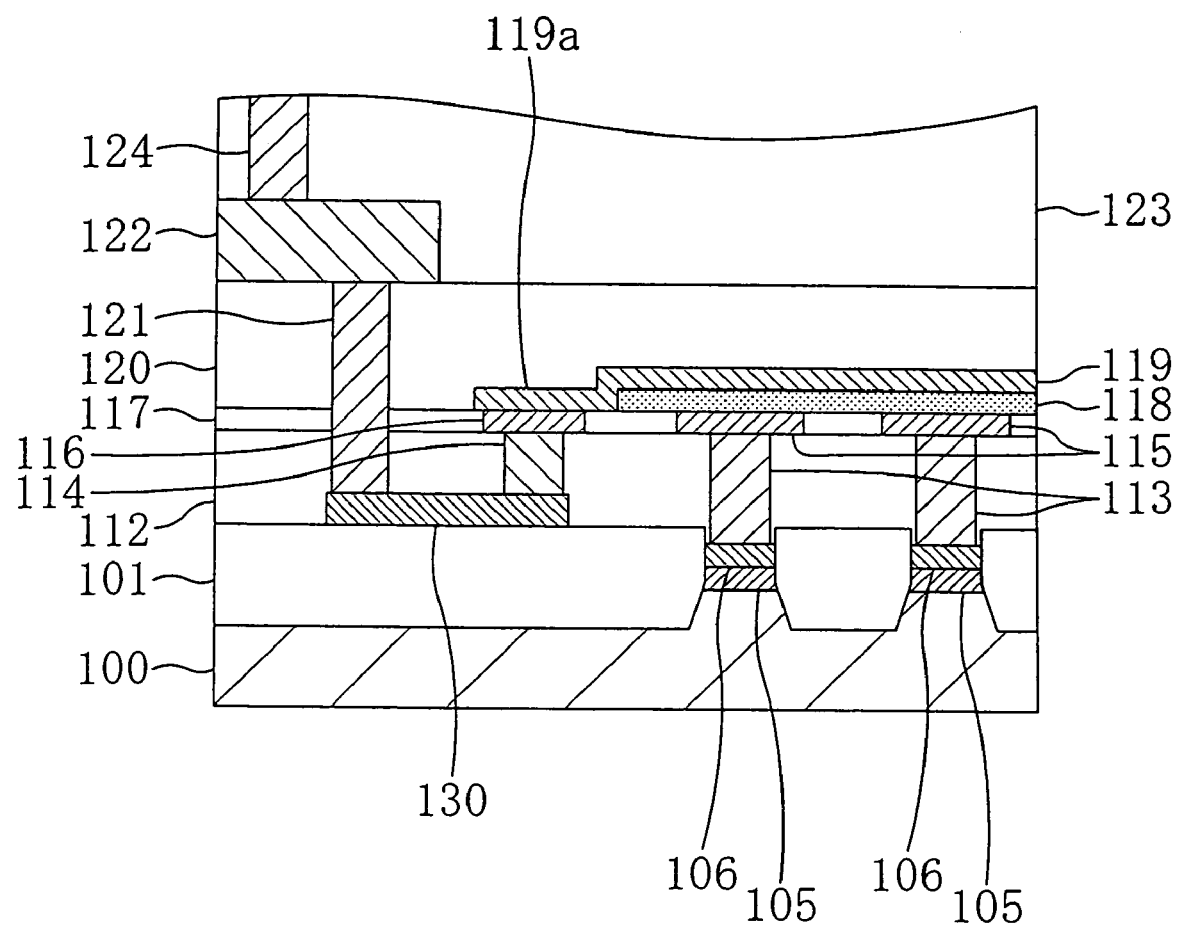
FIG. 12 is a cross-sectional view illustrating an example of a ferroelectric memory according to the second variation of the first embodiment of the present invention.

Moreover, in the second variation of the first embodiment, a wiring layer below the ferroelectric capacitor (a capacitive element including the capacitor lower electrode 115, the capacitor insulative film 118 and the capacitor upper electrode 119), e.g., a wiring layer used as a bit line, may be used as the conductive layer 130. Alternatively, a wiring layer formed on the semiconductor substrate 100 with no interlayer insulating film therebetween, e.g., a wiring layer that is formed simultaneously with the gate electrode of a memory cell transistor or a control transistor, may be used as the conductive layer 130, as illustrated in FIG. 12, for example. In such a case, the wiring layer may be formed on the device isolation region 101 or on a region of the semiconductor substrate 100 where the device isolation region 101 is not formed.

Moreover, while tungsten is used as a material of the first plug 113, the second plug 114 or the third plug 121, etc., in the second variation of the first embodiment, polysilicon, or the like, may alternatively be used.

Moreover, in the second variation of the first embodiment, it is preferred that the capacitor lower electrode 115 is a layered film including a lower layer film (functioning as an adhesion layer) and an upper layer film, wherein the lower layer film is a TiON film having a low oxygen content, a TiN film, a Ti-containing alloy film, or the like, and the upper layer film is a Pt film or a Pt-containing alloy film that is highly resistant to oxidization, an Ru film or an Ir film whose oxide has an oxygen barrier property and is electrically conductive, an $RuO_2$ film or an $IrO_2$ film, or the like.

Moreover, in the second variation of the first embodiment, it is preferred that the insulative film 117 embedded between adjacent capacitor lower electrodes 115 is an $SiO_2$ film, an $Si_3N_4$ film, an SiON film, or the like.

Moreover, in the second variation of the first embodiment, it is preferred that a PZT type material, an SBT type material, or the like, is used as the material of the ferroelectric film forming the capacitor insulative film 118.

Moreover, in the second variation of the first embodiment, it is preferred that the capacitor upper electrode 119 is at least partially a Pt film or a Pt-containing alloy film that is highly resistant to oxidization, an Ru film or an Ir film whose oxide has an oxygen barrier property and is electrically conductive, an $RuO_2$ film or an $IrO_2$ film, or the like. In this way, it is possible to sufficiently grow the crystal of the ferroelectric film forming the capacitor insulative film 118.

Moreover, in the second variation of the first embodiment, the upper surface of the second plug 114 is covered by the connection pad 116 having an oxygen barrier property. Alternatively, the connection pad 116 may be omitted when, for example, the second plug 114 is made of a material having an oxygen barrier property. In this way, the degree of integration of the ferroelectric memory can be improved. In such a case, it is preferred that the extension 119a of the capacitor upper electrode 119 covers at least a portion of the upper surface of the second plug 114.

Moreover, in the second variation of the first embodiment, the insulative film 117 is embedded in a region between adjacent capacitor lower electrodes 115 or a region between the capacitor lower electrode 115 and the connection pad 116. Alternatively, the insulative film 117 may be omitted.

Moreover, in the second variation of the first embodiment, it is preferred that a side wall is formed on the side surface of the capacitor insulative film 118 before the formation of the capacitor upper electrode 119. In this way, the step covering property of the conductive film to be the capacitor upper electrode 119 is improved, and it is possible to prevent disconnection from occurring in the extension 119a of the capacitor upper electrode 119, thereby improving the reliability of the ferroelectric memory.

Moreover, in the second variation of the first embodiment, the wiring 122 is formed on the second interlayer insulating film 120 so as to be connected to the third plug 121. Alternatively, the wiring 122 may be embedded in the second interlayer insulating film 120 so as to be connected to the third plug 121.

(Second Embodiment)

A ferroelectric memory according to a second embodiment of the present invention, and a method for manufacturing the same, will now be described with reference to the drawings.

Figure 13A:
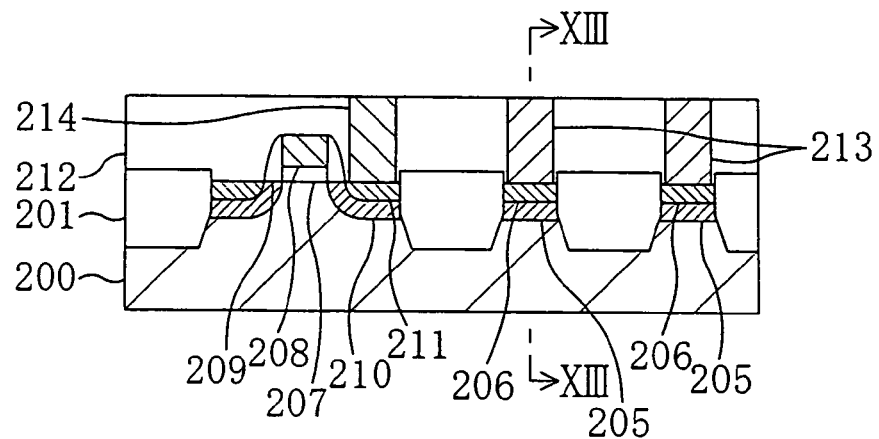
FIG. 13A is a cross-sectional view illustrating a step in a method for manufacturing a ferroelectric memory according to a second embodiment of the present invention.
Figure 13B:
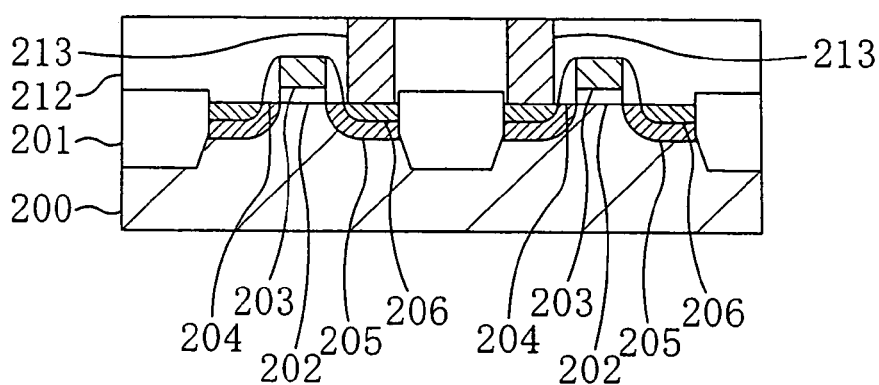
FIG. 13B is a cross-sectional view taken along line XIII—XIII in FIG. 13A.
Figure 14A:
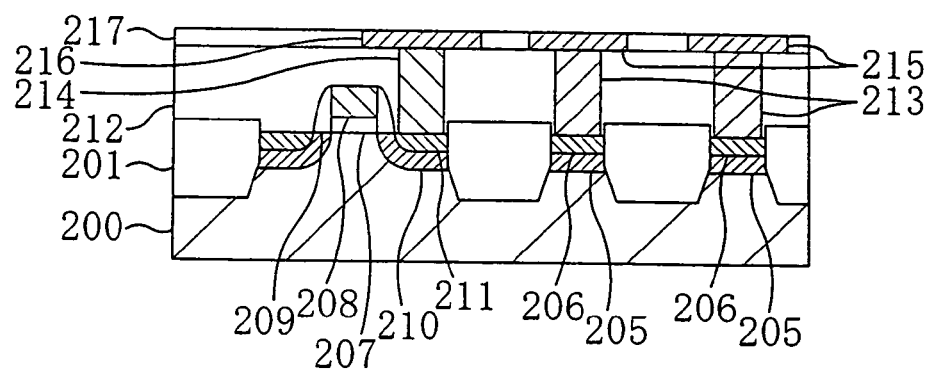
FIG. 14A and FIG. 14B are cross-sectional views each illustrating a step in the method for manufacturing a ferroelectric memory according to the second embodiment of the present invention.
Figure 14B:
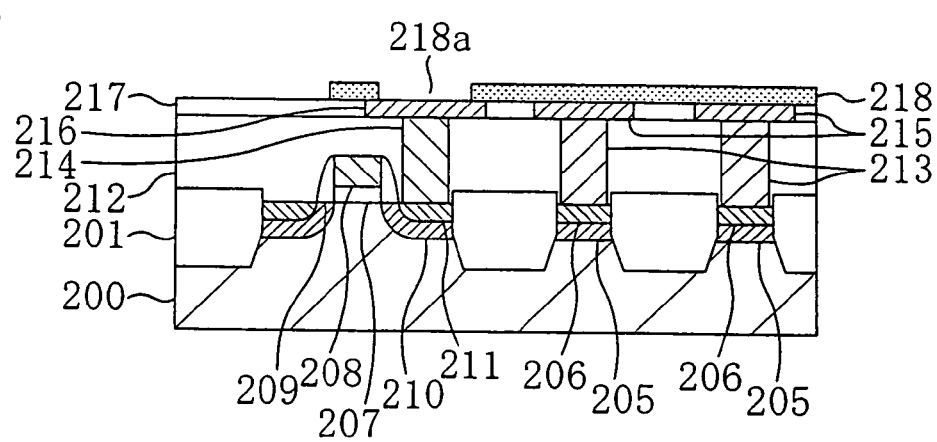
Figure 15A:
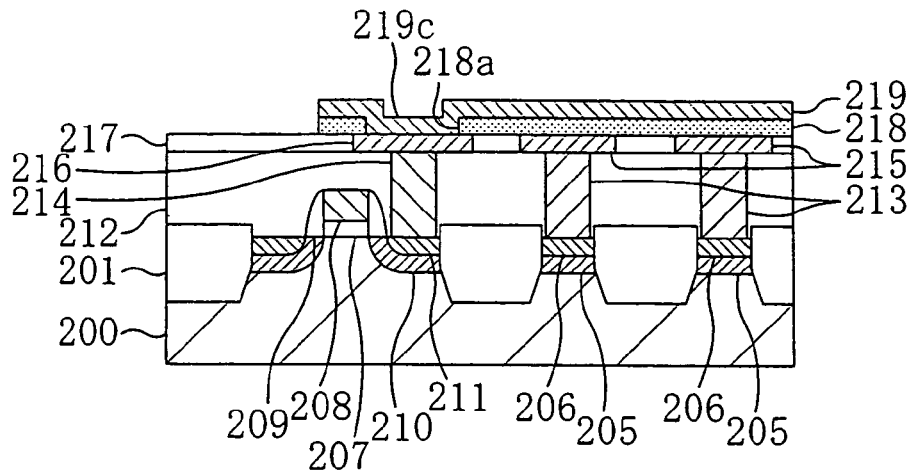
FIG. 15A to FIG. 15C are cross-sectional views each illustrating a step in the method for manufacturing a ferroelectric memory according to the second embodiment of the present invention.
Figure 15B:
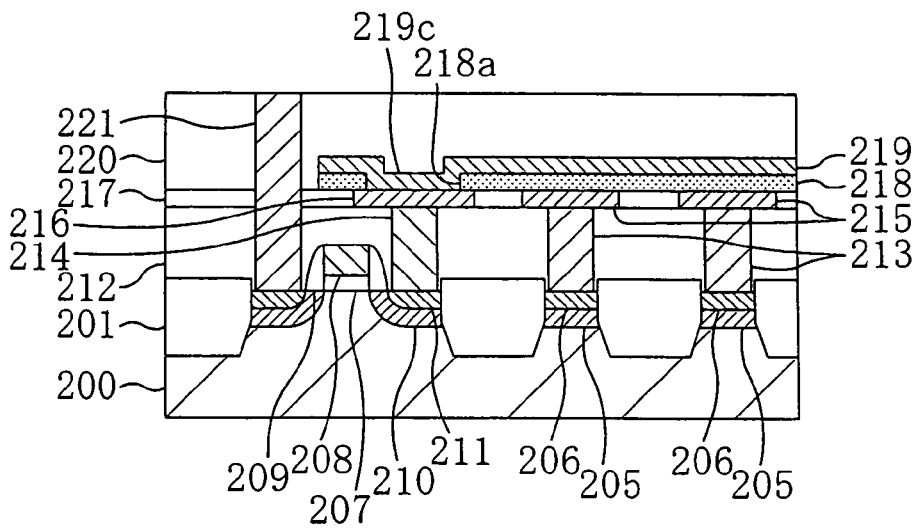
Figure 15C:
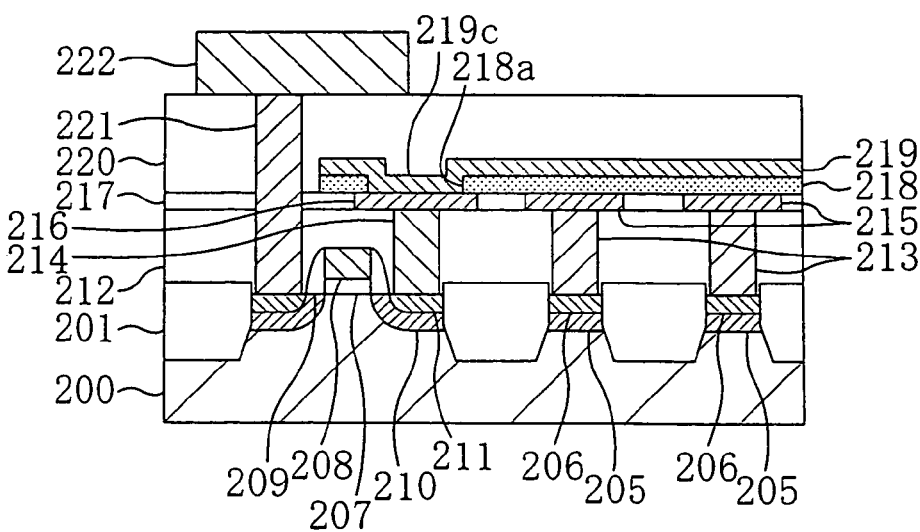
Figure 16A:
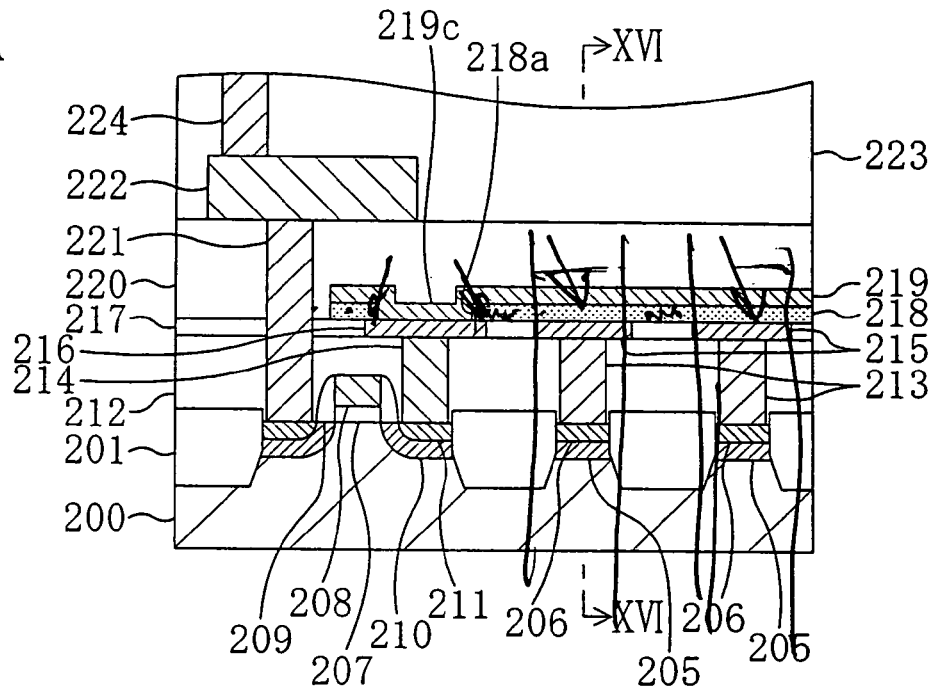
FIG. 16A is a cross-sectional view illustrating a step in the method for manufacturing a ferroelectric memory according to the second embodiment of the present invention.
Figure 16B:
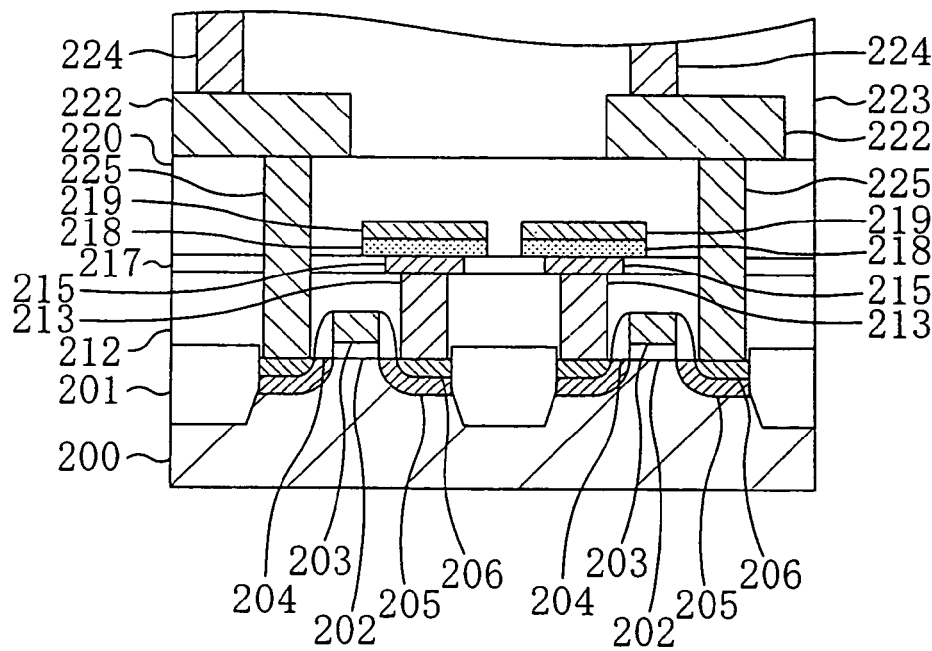
FIG. 16B is a cross-sectional view taken along line XVI—XVI in FIG. 16A.

FIG. 13A, FIG. 13B, FIG. 14A, FIG. 14B, FIG. 15A to FIG. 15C, FIG. 16A and FIG. 16B are cross-sectional views each illustrating a step in a method for manufacturing a ferroelectric memory according to the second embodiment. Note that FIG. 13B is a cross-sectional view taken along line XIII—XIII in FIG. 13A, and FIG. 16B is a cross-sectional view taken along line XVI—XVI in FIG. 16A.

First, as illustrated in FIG. 13A and FIG. 13B, a device isolation region 201 having an STI structure is formed on the surface of a semiconductor substrate 200. Then, on a memory cell region within each region of the semiconductor substrate 200 surrounded by the device isolation region 201, a first gate electrode 203 forming a part of a memory cell transistor is formed via a first gate insulating film 202. Then, an insulative first side wall 204 is formed on the side surface of the first gate electrode 203, and a first low-concentration impurity diffusion layer 205 to be the lower layer and a first high-concentration impurity diffusion layer 206 to be the upper layer are formed in a surface portion of each memory cell region of the semiconductor substrate 200. The first low-concentration impurity diffusion layer 205 and the first high-concentration impurity diffusion layer 206 are to be a source region or a drain region of the memory cell transistor.

Moreover, as illustrated in FIG. 13A, a second gate electrode 208 forming a part of a control transistor is formed via a second gate insulating film 207 on a non-memory cell region of the semiconductor substrate 200. Then, an insulative second side wall 209 is formed on the side surface of the second gate electrode 208, and a second low-concentration impurity diffusion layer 210 to be the lower layer and a second high-concentration impurity diffusion layer 211 to be the upper layer are formed in a surface portion of a non-memory cell region of the semiconductor substrate 200. The second low-concentration impurity diffusion layer 210 and the second high-concentration impurity diffusion layer 211 are to be a source region or a drain region of the control transistor.

Note that in the second embodiment, each of various elements, e.g., a gate electrode, of the memory cell transistor may be formed simultaneously with its counterpart element of the control transistor.

Then, as illustrated in FIG. 13A and FIG. 13B, a first interlayer insulating film 212 is formed on the semiconductor substrate 200, on which the memory cell transistor and the control transistor have been formed. Then, a first plug 213 made of tungsten and connected to the first high-concentration impurity diffusion layer 206 (a portion to be a source region), and a second plug 214 made of tungsten and connected to the second high-concentration impurity diffusion layer 211 (either a portion to be a source region or a portion to be a drain region), are formed through the first interlayer insulating film 212.

Then, a conductive film having an oxygen barrier property (e.g., an Ir film, an $IrO_2$ film, or the like) is deposited across the entire surface of the first interlayer insulating film 212, and the conductive film is patterned, thereby forming a capacitor lower electrode 215 and a connection pad 216, as illustrated in FIG. 14A. The capacitor lower electrode 215 is made of a conductive film having an oxygen barrier property and covers the upper surface of the first plug 213, and the connection pad 216 is made of a conductive film having an oxygen barrier property and covers the upper surface of the second plug 214. Thus, the memory cell transistor and the capacitor lower electrode 215 are connected to each other via the first plug 213. Then, an insulative film 217 is embedded in a region between adjacent capacitor lower electrodes 215 or a region between the capacitor lower electrode 215 and the connection pad 216 so that the upper surface thereof is coplanar with the upper surfaces of the capacitor lower electrode 215 and the connection pad 216.

Then, a ferroelectric film made of a PZT type material or an SBT type material is deposited across the entire surface of the first interlayer insulating film 212, on which the insulative film 217 has been formed, after which the ferroelectric film is patterned, thereby forming a capacitor insulative film 218 covering the upper surface of the capacitor lower electrode 215, as illustrated in FIG. 14B. In this process, the capacitor insulative film 218 is formed so as to extend over the area of the connection pad 216, i.e., above the second plug 214, with the ferroelectric film to be the capacitor insulative film 218 including an opening 218a in an area over the connection pad 216.

Then, a conductive film made of Pt or a Pt-containing alloy is deposited across the entire surface of the first interlayer insulating film 212, on which the capacitor insulative film 218 including the opening 218a has been formed, and the conductive film is patterned, thereby forming a capacitor upper electrode 219 covering the upper surface of the capacitor insulative film 218 and connected to the connection pad 216 via the opening 218a, as illustrated in FIG. 15A. Specifically, the capacitor upper electrode 219 includes, in the opening 218a, a connection 219c covering at least a portion of the upper surface of the connection pad 216. Thus, the capacitor upper electrode 219 and the second plug 214 are electrically connected to each other via the connection pad 216, whereby the capacitor upper electrode 219 and the second high-concentration impurity diffusion layer 211 are electrically connected to each other via the second plug 214. Note that the capacitor lower electrode 215, the capacitor insulative film 218 and the capacitor upper electrode 219 together form a capacitive element.

Then, as illustrated in FIG. 15B, a second interlayer insulating film 220 is formed on the first interlayer insulating film 212, on which the capacitive element has been formed. Then, a third plug 221 made of tungsten is formed through the first interlayer insulating film 212, the insulative film 217 and the second interlayer insulating film 220 so as to be connected to the second high-concentration impurity diffusion layer 211 (one of a portion to be a source region and a portion to be a drain region to which the second plug 214 is not connected).

Then, as illustrated in FIG. 15C, a wiring 222 made of aluminum, or the like, is formed on the second interlayer insulating film 220 so as to be connected to the third plug 221. Thus, the wiring 222 and the second high-concentration impurity diffusion layer 211 are connected to each other via the third plug 221. Then, as illustrated in FIG. 16A and FIG. 16B, a third interlayer insulating film 223 is formed on the second interlayer insulating film 220 including the wiring 222, and a fourth plug 224 made of tungsten is formed through the third interlayer insulating film 223 so as to be connected to the wiring 222. Note that a fifth plug 225 is formed through the first interlayer insulating film 212, the insulative film 217 and the second interlayer insulating film 220, as illustrated in FIG. 16B, whereby the first high-concentration impurity diffusion layer 206 (a portion to be a drain region) and the wiring 222 are connected to each other. Then, although not shown, a further interlayer insulating film, a further wiring, a surface protection film, etc., are formed on the third interlayer insulating film 223 to complete the ferroelectric memory.

As described above, according to the second embodiment, the first interlayer insulating film 212 is formed on the semiconductor substrate 200, on which a memory cell transistor and a control transistor including the second high-concentration impurity diffusion layer 211 have been formed, and the first plug 213 connected to the memory cell transistor and the second plug 214 connected to the second high-concentration impurity diffusion layer 211 are formed through the first interlayer insulating film 212. Then, the capacitor lower electrode 215 connected to the first plug 213 is formed on the first interlayer insulating film 212, after which the capacitor insulative film 218 made of a ferroelectric film and extending over an area above the second plug 214 is formed on the capacitor lower electrode 215. Then, the opening 218a is formed in a portion of the capacitor insulative film 218 above the second plug 214, and the capacitor upper electrode 219 is formed so as to be electrically connected to the second plug 214 via the opening 218a. Then, the second interlayer insulating film 220 is formed on the first interlayer insulating film 212 including the capacitor upper electrode 219, and the third plug 221 connecting the second high-concentration impurity diffusion layer 211 and the wiring 222 on the second interlayer insulating film 220 to each other is formed through the first interlayer insulating film 212 and the second interlayer insulating film 220. Therefore, before the formation of the capacitor upper electrode 219, more specifically, simultaneously with the formation of the first plug 213 connecting the memory cell transistor and the capacitor lower electrode 215 to each other, the second plug 214 connecting the capacitor upper electrode 219 and the second high-concentration impurity diffusion layer 211 to each other can be formed through the first interlayer insulating film 212. Thus, the capacitor upper electrode 219 and the wiring 222 can be electrically connected to each other via the second plug 214, the second high-concentration impurity diffusion layer 211 and the third plug 221. In other words, the capacitor upper electrode 219 and the wiring 222 can be electrically connected to each other by using the second plug 214 and the second high-concentration impurity diffusion layer 211, which are formed in advance below the capacitive element. Therefore, it is not necessary, after the formation of the capacitor upper electrode 219, to form a contact hole for forming a plug therein that directly connects the capacitor upper electrode 219 and the wiring 222 to each other, thereby preventing the capacitor upper electrode 219 from being exposed to a hydrogen atmosphere or a reducing atmosphere. As a result, even when a Pt film having a strong catalytic function is used as the capacitor upper electrode 219, deterioration of the characteristics of the ferroelectric film forming the capacitor insulative film 218 is prevented, thereby improving the reliability of the ferroelectric memory.

Moreover, according to the second embodiment, the capacitor lower electrode 215 having an oxygen barrier property covers the upper surface of the first plug 213, while the connection pad 216 having an oxygen barrier property covers the upper surface of the second plug 214. Thus, it is possible to prevent the first plug 213 and the second plug 214 from being oxidized when sintering the ferroelectric film forming the capacitor insulative film 218 in an oxygen atmosphere.

Moreover, according to the second embodiment, the connection pad 216 is formed simultaneously with the formation of the capacitor lower electrode 215 by patterning a conductive film used as a material of the capacitor lower electrode 215 and having an oxygen barrier property so as to cover the entire upper surface of the second plug 214, thereby preventing the second plug 214 from being oxidized, without increasing the number of manufacturing steps. Moreover, since the capacitor upper electrode 219 is formed so as to be connected to the connection pad 216, the capacitor upper electrode 219 and the second plug 214 can be connected to each other via the connection pad 216.

Moreover, according to the second embodiment, the insulative film 217 is embedded in a region between adjacent capacitor lower electrodes 215 or a region between the capacitor lower electrode 215 and the connection pad 216 so that the upper surface thereof is coplanar with the upper surfaces of the capacitor lower electrode 215 and the connection pad 216. Therefore, the step of depositing the capacitor insulative film 218, etc., can be performed on a flat base surface, thereby improving the reliability of the capacitive element, i.e., the reliability of the ferroelectric memory.

Moreover, in the second embodiment, if a surface portion of the second high-concentration impurity diffusion layer 211 is silicified into a silicide layer, and the silicide layer is used as the conductive layer connecting the second plug 214 and the third plug 221 to each other, the following effect can be obtained. That is, the resistance of the conductive layer can be reduced as compared to a case where a polysilicon layer formed on the semiconductor substrate 200, or the like, is used as the conductive layer connecting the second plug 214 and the third plug 221 to each other.

Furthermore, according to the second embodiment, the following effects can be obtained.

Figure 17A:
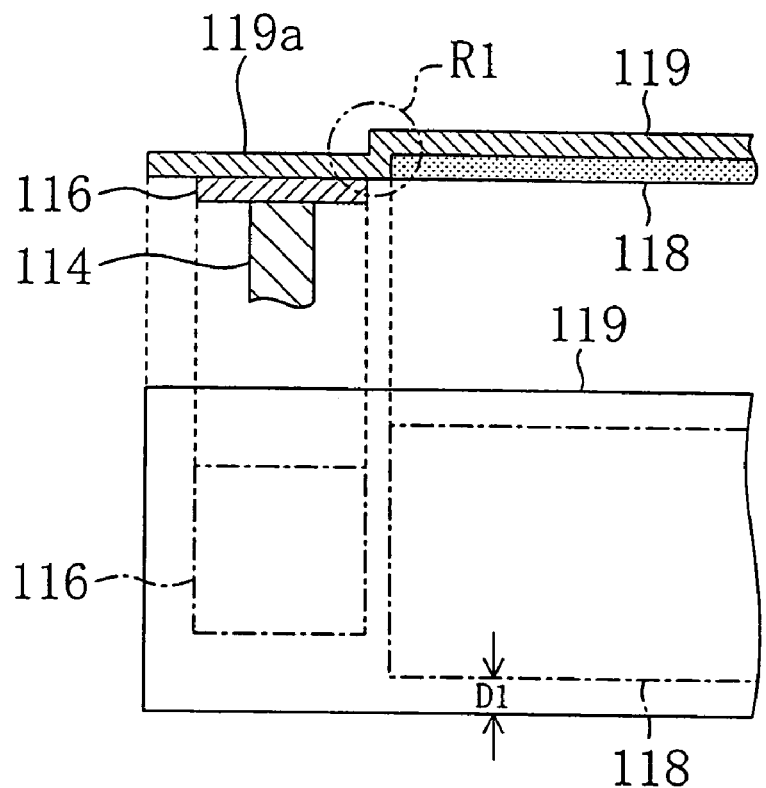
FIG. 17A shows a cross-sectional view illustrating a layered structure including a second plug, a connection pad, a capacitor insulative film and a capacitor upper electrode in a ferroelectric memory according to the first embodiment of the present invention, as a first comparative example, and a plan view corresponding to the cross-sectional view.

FIG. 17A shows a cross-sectional view illustrating a layered structure including the second plug 114, the connection pad 116, the capacitor insulative film 118 and the capacitor upper electrode 119 in a ferroelectric memory according to the first embodiment, as a first comparative example, and a plan view corresponding to the cross-sectional view.

Figure 17B:
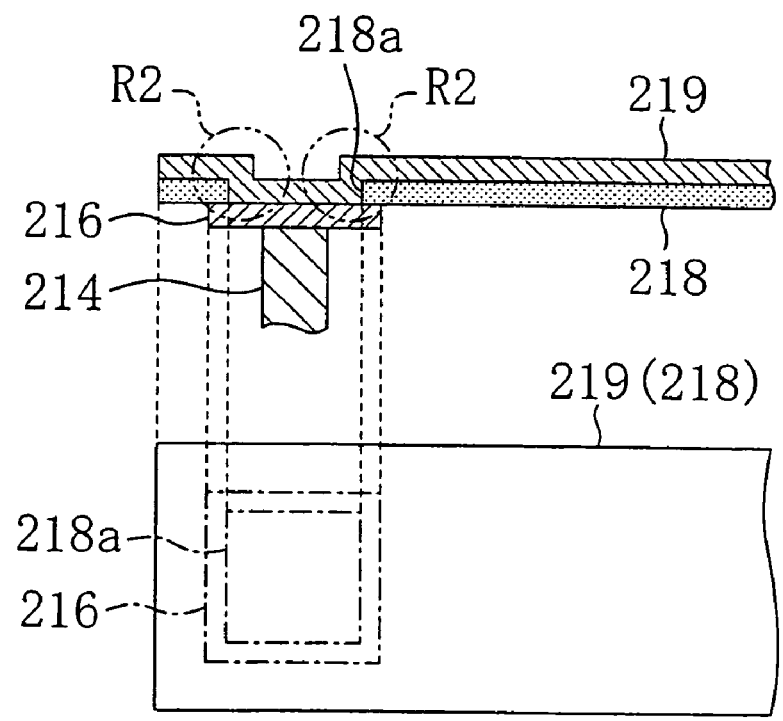
FIG. 17B shows a cross-sectional view illustrating a layered structure including a second plug, a connection pad, a capacitor insulative film and a capacitor upper electrode in a ferroelectric memory according to the second embodiment of the present invention, and a plan view corresponding to the cross-sectional view.

FIG. 17B shows a cross-sectional view illustrating a layered structure including the second plug 214, the connection pad 216, the capacitor insulative film 218 and the capacitor upper electrode 219 in a ferroelectric memory according to the second embodiment, and a plan view corresponding to the cross-sectional view.

In the first comparative example, the capacitor upper electrode 119 includes a stepped portion extending in one direction along an edge of the capacitor insulative film 118 (see region R1), as illustrated in FIG. 17A. Moreover, since the insulative film to be the capacitor insulative film 118 and the conductive film to be the capacitor upper electrode 119 are patterned separately, it is necessary to consider a mask alignment margin D1 between the mask pattern used for the formation of the capacitor insulative film and the mask pattern used for the formation of the capacitor upper electrode.

In contrast, in the second embodiment, the capacitor upper electrode 219 is connected to the connection pad 216, i.e., the second plug 214, via the opening 218a provided in the capacitor insulative film 218, whereby the capacitor upper electrode 219 includes a stepped portion extending along the periphery of the opening 218a (see region R2), as illustrated in FIG. 17B. Specifically, when the opening 218a has a square shape, for example, the capacitor upper electrode 219 includes four stepped portions extending respectively in four directions along the four edges of the periphery of the opening 218a. Therefore, even if the material of the capacitor upper electrode has a direction dependency in its step covering property, the current path between the capacitor upper electrode 219 and the second plug 214 is reliably ensured, as compared to the first comparative example (where the capacitor upper electrode 119 includes a stepped portion extending in one direction along an edge of the capacitor insulative film 118).

Note that in the steps of FIG. 14B and FIG. 15A in the second embodiment, it is preferred to provide the opening 218a in an insulative film to be the capacitor insulative film 218 before patterning the insulative film, and then simultaneously pattern the insulative film and a conductive film to be the capacitor upper electrode 219. In this way, it is not necessary to consider a mask alignment margin between the mask pattern used for the formation of the capacitor insulative film and the mask pattern used for the formation of the capacitor upper electrode. As a result, it is possible to reduce the cell size of the ferroelectric memory, thereby reducing the total area to be occupied by the entire memory cell array.

Moreover, while tungsten is used as a material of the first plug 213, the second plug 214 or the third plug 221, etc., in the second embodiment, polysilicon, or the like, may alternatively be used.

Moreover, in the second embodiment, it is preferred that the capacitor lower electrode 215 is a layered film including a lower layer film (functioning as an adhesion layer) and an upper layer film, wherein the lower layer film is a TiON film having a low oxygen content, a TiN film, a Ti-containing alloy film, or the like, and the upper layer film is a Pt film or a Pt-containing alloy film that is highly resistant to oxidization, an Ru film or an Ir film whose oxide has an oxygen barrier property and is electrically conductive, an $RuO_2$ film or an $IrO_2$ film, or the like.

Moreover, in the second embodiment, it is preferred that the insulative film 217 embedded between adjacent capacitor lower electrodes 215 is an $SiO_2$ film, an $Si_3N_4$ film, an SiON film, or the like.

Moreover, in the second embodiment, it is preferred that a PZT type material, an SBT type material, or the like, is used as the material of the ferroelectric film forming the capacitor insulative film 218.

Moreover, in the second embodiment, it is preferred that the capacitor upper electrode 219 is at least partially a Pt film or a Pt-containing alloy film that is highly resistant to oxidization, an Ru film or an Ir film whose oxide has an oxygen barrier property and is electrically conductive, an $RuO_2$ film or an $IrO_2$ film, or the like. In this way, it is possible to sufficiently grow the crystal of the ferroelectric film forming the capacitor insulative film 218.

Figure 18:
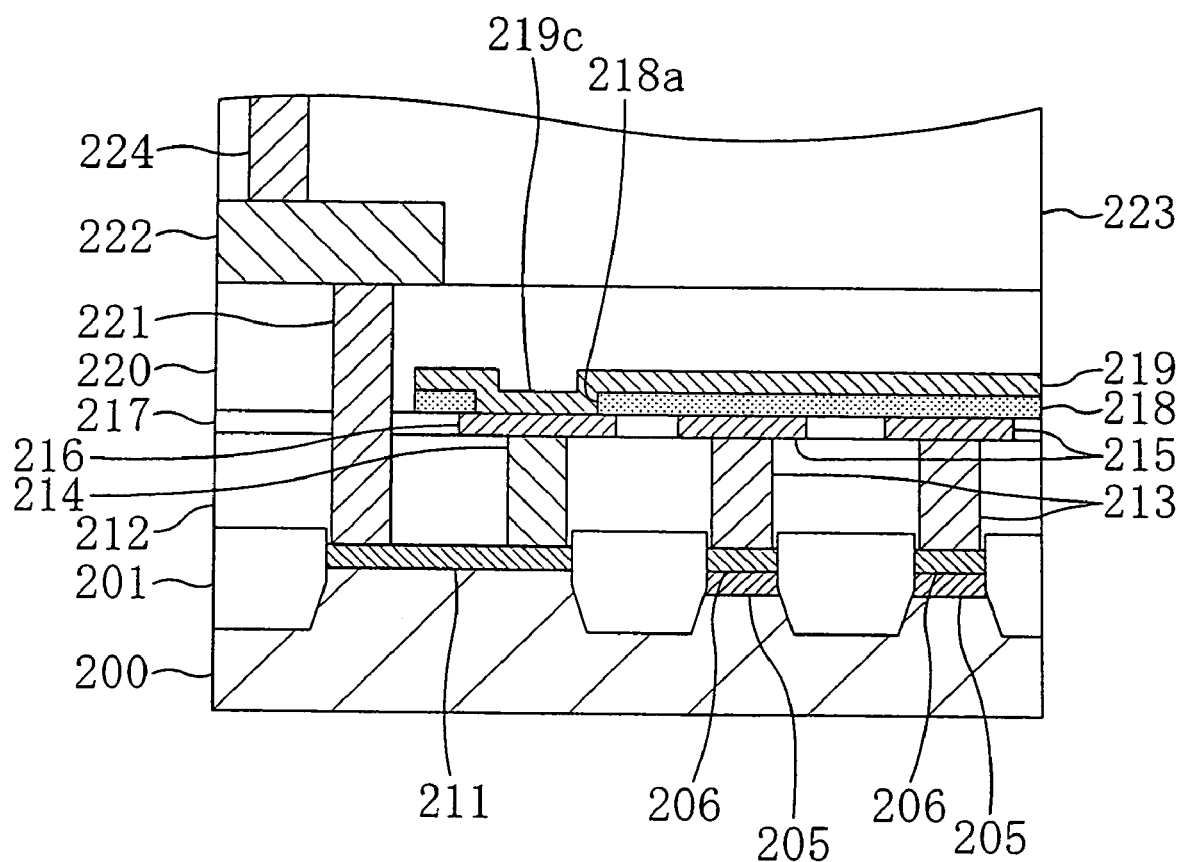
FIG. 18 is a cross-sectional view illustrating an example of a ferroelectric memory according to the second embodiment of the present invention.

Moreover, in the second embodiment, a control transistor including the second gate electrode 208, etc., (having a function as a driver for turning ON/OFF the capacitor upper electrode 219, i.e., a memory cell plate) is formed in a non-memory cell region on the semiconductor substrate 200. Thus, in the second embodiment, the capacitor upper electrode 219 and the wiring 222 are electrically connected to each other via the second plug 214, the second high-concentration impurity diffusion layer 211 (i.e., a source region or a drain region of the control transistor) and the third plug 221 only when the control transistor is ON. In contrast, in a ferroelectric memory whose circuit configuration does not require a control transistor, only the second high-concentration impurity diffusion layer 211 may be formed in the non-memory cell region on the semiconductor substrate 200, as illustrated in FIG. 18, for example. In such a case, the capacitor upper electrode 219 and the wiring 222 are always electrically connected to each other via the second plug 214, the second high-concentration impurity diffusion layer 211 and the third plug 221. Moreover, in such a case, a silicide layer may be formed in a surface portion of the second high-concentration impurity diffusion layer 211.

Figure 19:
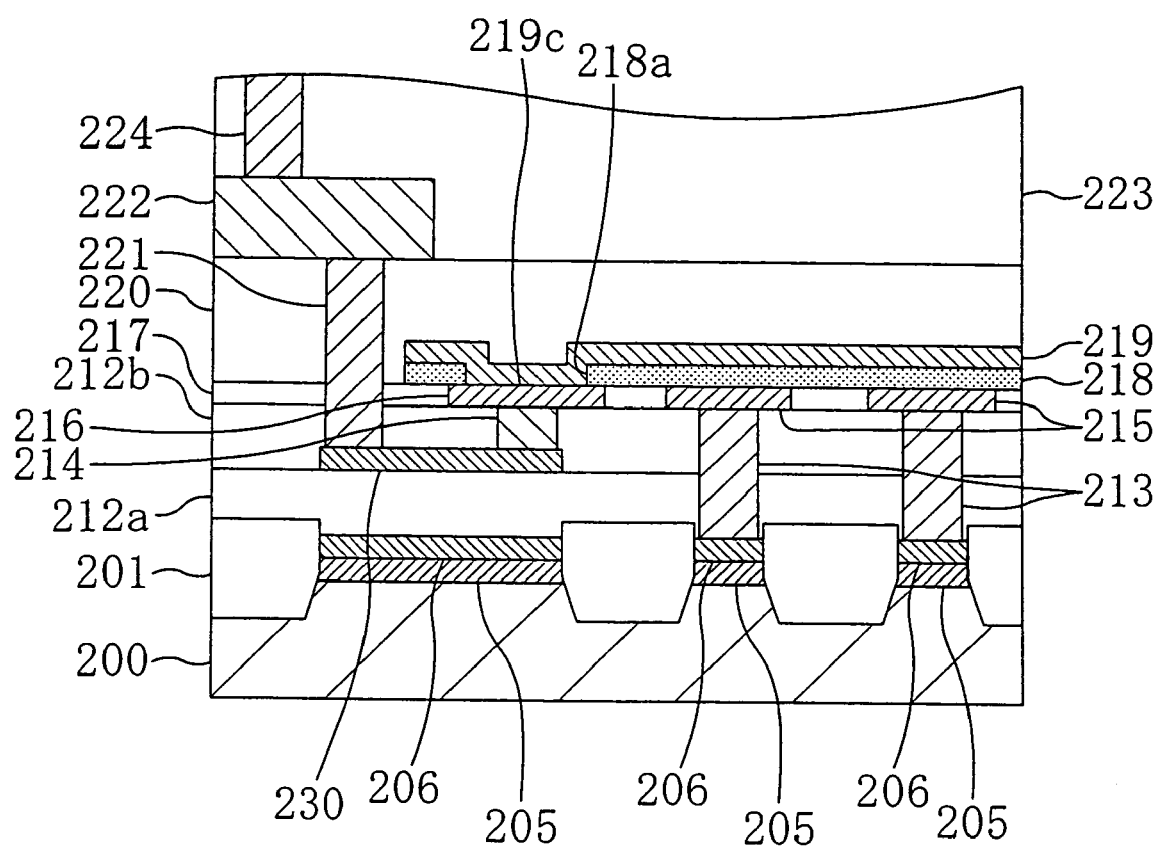
FIG. 19 is a cross-sectional view illustrating an example of a ferroelectric memory according to the second embodiment of the present invention.
Figure 20:
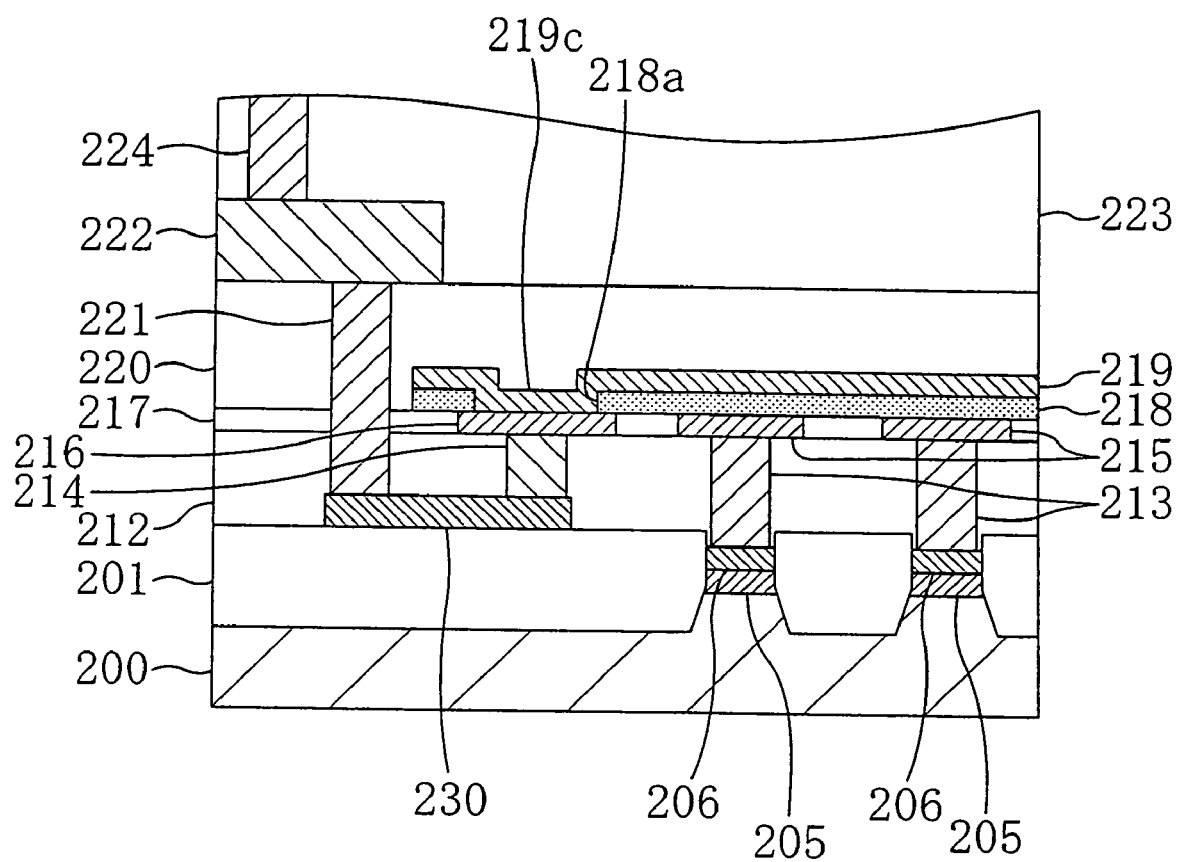
FIG. 20 is a cross-sectional view illustrating an example of a ferroelectric memory according to the second embodiment of the present invention.

Moreover, while the second high-concentration impurity diffusion layer 211 is used as a conductive layer connecting the second plug 214 and the third plug 221 to each other in the second embodiment, a conductive layer 230 formed between a lower layer film 212a and an upper layer film 212b of the first interlayer insulating film 212 may alternatively be used, as illustrated in FIG. 19, for example. A primary difference between a method for forming the device structure illustrated in FIG. 19 (for details, see the second variation of the first embodiment) and the method of the present embodiment is as follows. The lower layer film 212a of the first interlayer insulating film 212 is formed on the semiconductor substrate 200, on which a memory cell transistor has been formed, and the conductive layer 230 is formed on the lower layer film 212a in a non-memory cell region, after which the upper layer film 212b of the first interlayer insulating film 212 is formed. Then, the first plug 213 connected to the memory cell transistor and the second plug 214 connected to the conductive layer 230 are formed through the first interlayer insulating film 212. While the material of the conductive layer 230 is not limited to any particular material, it is preferred to use a low resistance material, e.g., polysilicon, silicide, tungsten, or the like, as the material of the conductive layer 230, in view of the fact that the conductive layer 230 is used as an extraction line for the capacitor upper electrode 219. Moreover, a wiring layer below the ferroelectric capacitor (a capacitive element including the capacitor lower electrode 215, the capacitor insulative film 218 and the capacitor upper electrode 219), e.g., a wiring layer used as a bit line, may be used as the conductive layer 230. Alternatively, a wiring layer formed on the semiconductor substrate 200 with no interlayer insulating film therebetween, e.g., a wiring layer that is formed simultaneously with the gate electrode of a memory cell transistor or a control transistor, may be used as the conductive layer 230, as illustrated in FIG. 20, for example. In such a case, the wiring layer may be formed on the device isolation region 201 or on a region of the semiconductor substrate 200 where the device isolation region 201 is not formed.

Moreover, in the second embodiment, the upper surface of the second plug 214 is covered by the connection pad 216 having an oxygen barrier property. Alternatively, the connection pad 216 may be omitted when, for example, the second plug 214 is made of a material having an oxygen barrier property. In this way, the degree of integration of the ferroelectric memory can be improved. In such a case, it is preferred that the connection 219c of the capacitor upper electrode 219 covers at least a portion of the upper surface of the second plug 214.

Moreover, in the second embodiment, the insulative film 217 is embedded in a region between adjacent capacitor lower electrodes 215 or a region between the capacitor lower electrode 215 and the connection pad 216. Alternatively, the insulative film 217 may be omitted.

Moreover, in the second embodiment, it is preferred that a side wall is formed on the side surface of the opening 218a before the formation of the capacitor upper electrode 219. In this way, the step covering property of the conductive film to be the capacitor upper electrode 219 is improved, and it is possible to prevent disconnection from occurring in the connection 219c of the capacitor upper electrode 219, thereby improving the reliability of the ferroelectric memory.

Moreover, in the second embodiment, the wiring 222 is formed on the second interlayer insulating film 220 so as to be connected to the third plug 221. Alternatively, the wiring 222 may be embedded in the second interlayer insulating film 220 so as to be connected to the third plug 221.

(Third Embodiment)

A ferroelectric memory according to a third embodiment of the present invention, and a method for manufacturing the same, will now be described with reference to the drawings.

Figure 21A:
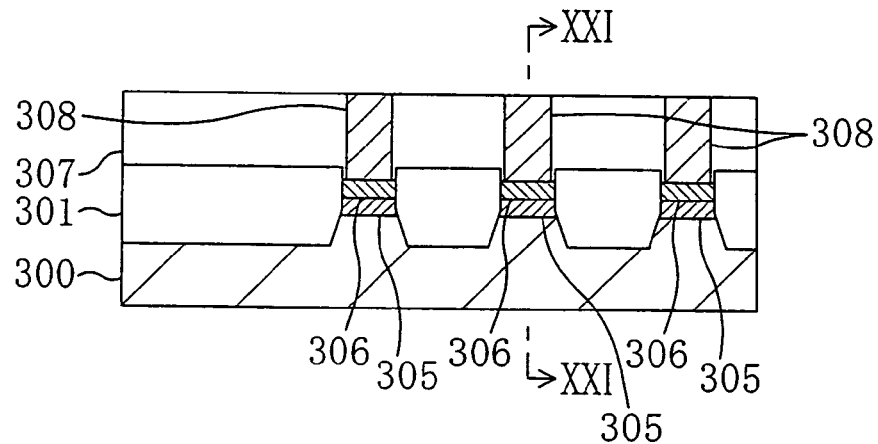
FIG. 21A is a cross-sectional view illustrating a step in a method for manufacturing a ferroelectric memory according to a third embodiment of the present invention.
Figure 21B:
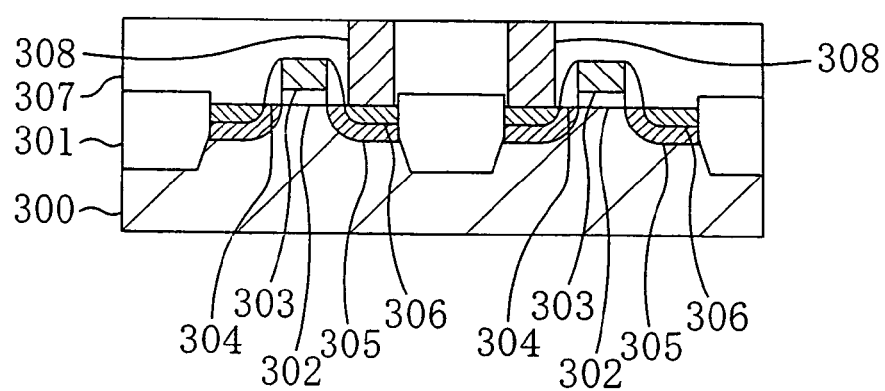
FIG. 21B is a cross-sectional view taken along line XXI—XXI in FIG. 21A.
Figure 22A:
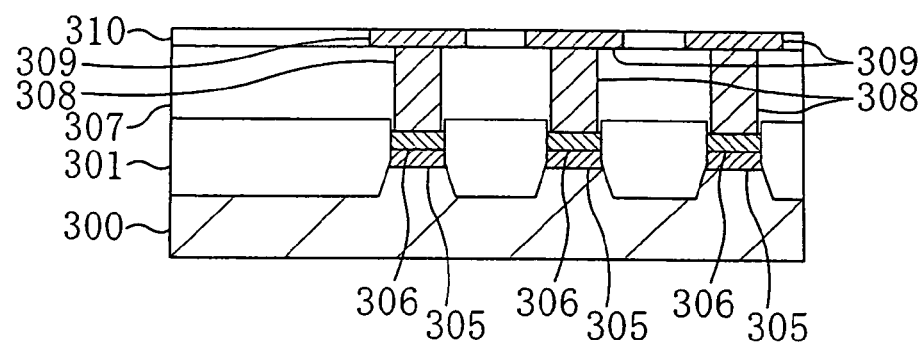
FIG. 22A and FIG. 22B are cross-sectional views each illustrating a step in the method for manufacturing a ferroelectric memory according to the third embodiment of the present invention.
Figure 22B:
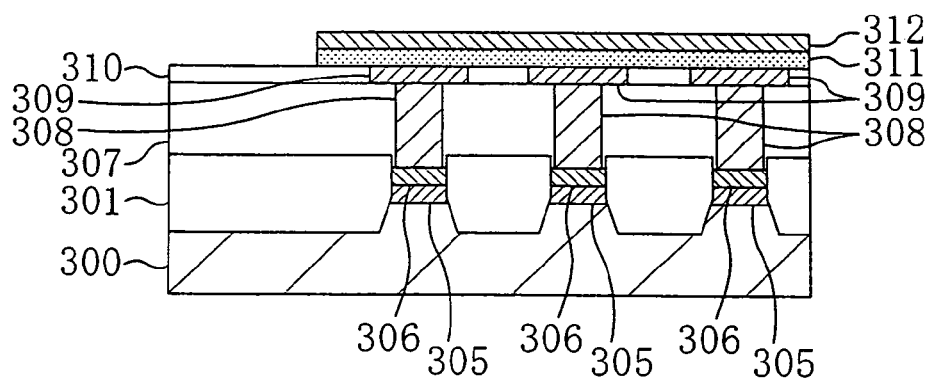
Figure 23A:
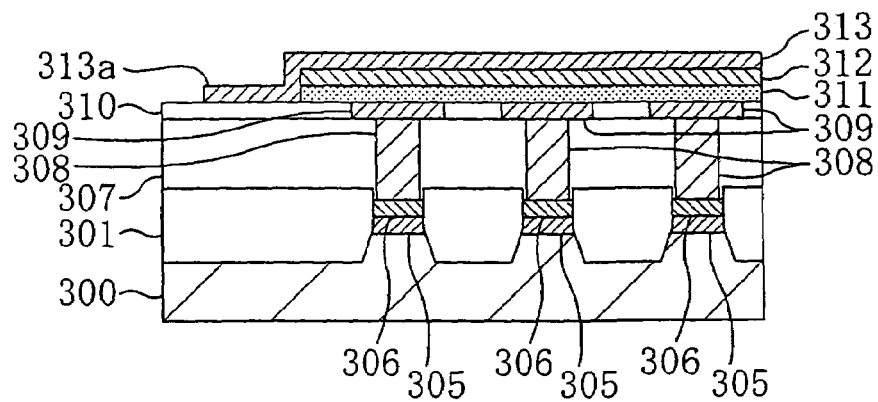
FIG. 23A to FIG. 23C are cross-sectional views each illustrating a step in the method for manufacturing a ferroelectric memory according to the third embodiment of the present invention.
Figure 23B:
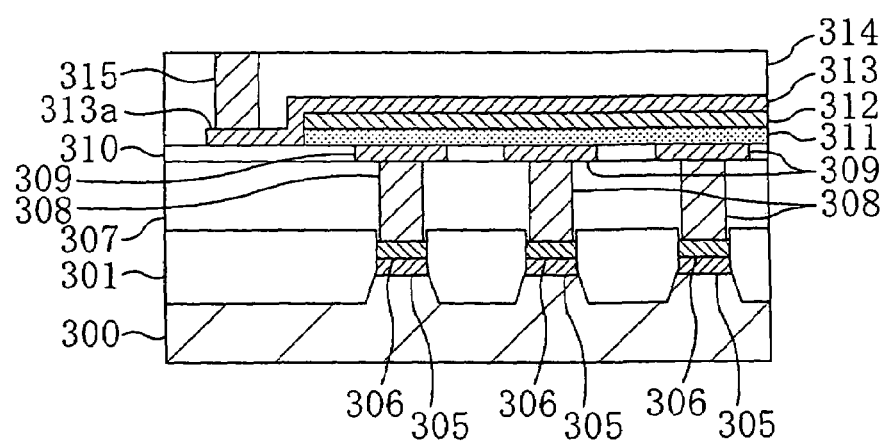
Figure 23C:
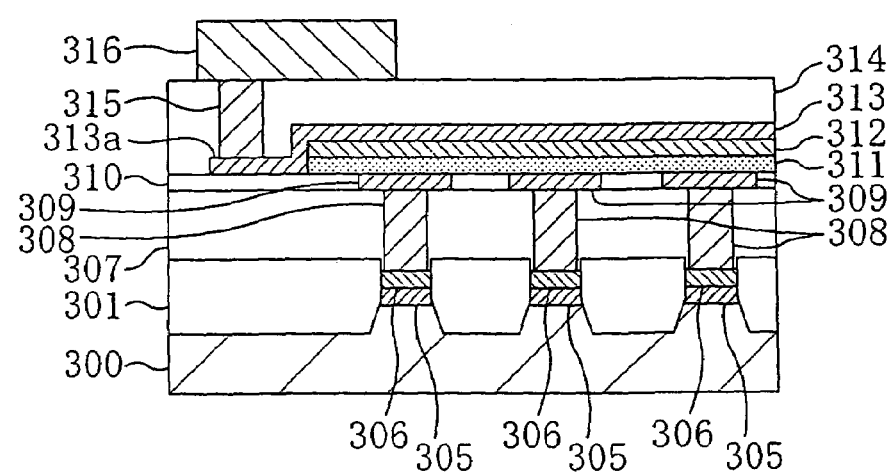
Figure 24A:
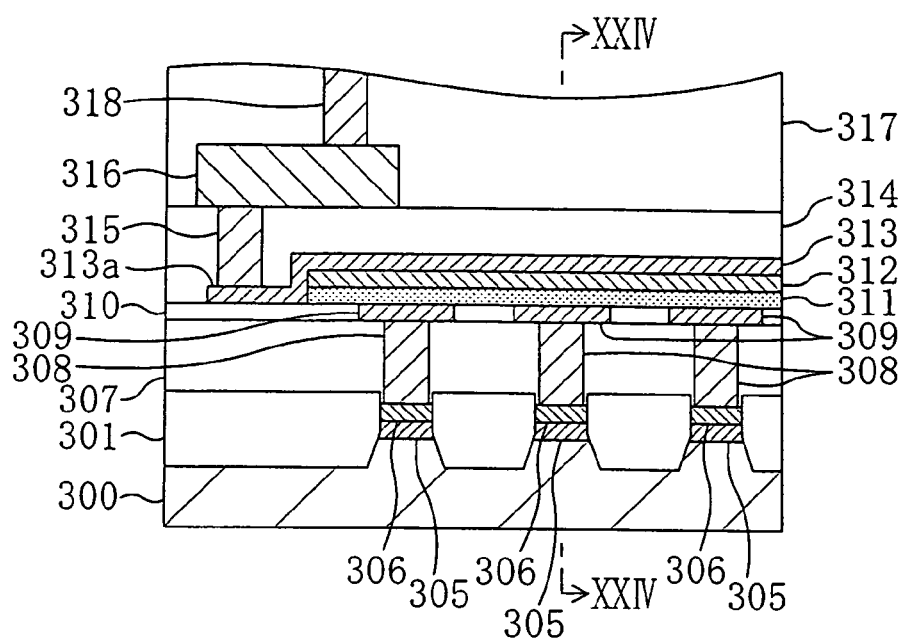
FIG. 24A is a cross-sectional view illustrating a step in the method for manufacturing a ferroelectric memory according to the third embodiment of the present invention.
Figure 24B:
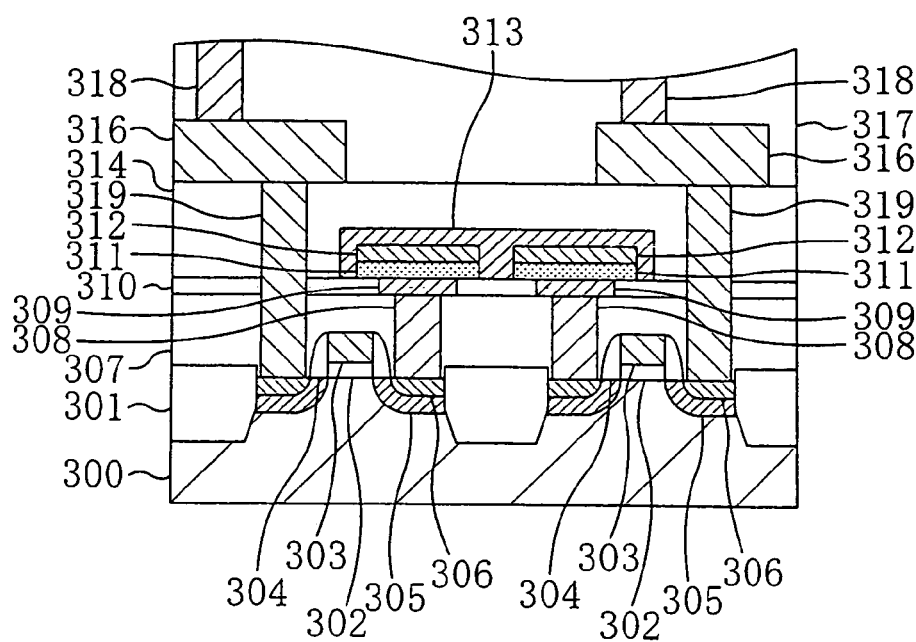
FIG. 24B is a cross-sectional view taken along line XXIV—XXIV in FIG. 24A.

FIG. 21A, FIG. 21B, FIG. 22A, FIG. 22B, FIG. 23A to FIG. 23C, FIG. 24A and FIG. 24B are cross-sectional views each illustrating a step in a method for manufacturing a ferroelectric memory according to the third embodiment. Note that FIG. 21B is a cross-sectional view taken along line XXI—XXI in FIG. 21A, and FIG. 24B is a cross-sectional view taken along line XXIV—XXIV in FIG. 24A.

First, as illustrated in FIG. 21A and FIG. 21B, a device isolation region 301 having an STI structure is formed on the surface of a semiconductor substrate 300. Then, a gate electrode 303 forming a part of a memory cell transistor is formed via a gate insulating film 302 on a memory cell region within each region of the semiconductor substrate 300 surrounded by the device isolation region 301. Then, an insulative side wall 304 is formed on the side surface of the gate electrode 303, and a low-concentration impurity diffusion layer 305 to be the lower layer and a high-concentration impurity diffusion layer 306 to be the upper layer are formed in a surface portion of each memory cell region of the semiconductor substrate 300. The low-concentration impurity diffusion layer 305 and the high-concentration impurity diffusion layer 306 are to be a source region or a drain region of the memory cell transistor. Then, a first interlayer insulating film 307 is formed on the semiconductor substrate 300, on which the memory cell transistor has been formed, and a first plug 308 made of tungsten and connected to the high-concentration impurity diffusion layer 306 (a portion to be a source region) is formed through the first interlayer insulating film 307.

Then, a conductive film having an oxygen barrier property (e.g., an Ir film, an $IrO_2$ film, or the like) is deposited across the entire surface of the first interlayer insulating film 307, and the conductive film is patterned, thereby forming a capacitor lower electrode 309, as illustrated in FIG. 22A. The capacitor lower electrode 309 is made of a conductive film having an oxygen barrier property and covers the upper surface of the first plug 308. Thus, the memory cell transistor and the capacitor lower electrode 309 are connected to each other via the first plug 308. Then, an insulative film 310 is embedded in a region between adjacent capacitor lower electrodes 309 so that the upper surface thereof is coplanar with the upper surface of the capacitor lower electrode 309.

Then, a ferroelectric film made of a PZT type material or an SBT type material, and a conductive film made of Pt or a Pt-containing alloy, are successively deposited across the entire surface of the first interlayer insulating film 307, on which the insulative film 310 has been formed, after which the conductive film and the ferroelectric film are patterned using the same mask pattern (not shown), thereby forming a capacitor insulative film 311 covering the upper surface of the capacitor lower electrode 309, and a capacitor upper electrode 312 covering the upper surface of the capacitor insulative film 311, as illustrated in FIG. 22B. Note that the capacitor lower electrode 309, the capacitor insulative film 311 and the capacitor upper electrode 312 together form a capacitive element.

Then, a conductive film having a hydrogen barrier property, e.g., a Ti film, a Ta film, a Ti-containing alloy film, or a Ta-containing alloy film, is deposited across the entire surface of the first interlayer insulating film 307, on which the capacitive element has been formed, and the conductive film is patterned, thereby forming a conductive hydrogen barrier film 313 covering the capacitive element, as illustrated in FIG. 23A. In this process, the conductive hydrogen barrier film 313 is formed so as to extend beyond the area of the capacitor upper electrode 312. Specifically, the conductive hydrogen barrier film 313 includes an extension 313a covering an area of the insulative film 310 where the capacitor upper electrode 312 is not formed.

Then, as illustrated in FIG. 23B, a second interlayer insulating film 314 is formed on the first interlayer insulating film 307, on which the conductive hydrogen barrier film 313 has been formed. Then, a second plug 315 made of tungsten is formed through the second interlayer insulating film 314 so as to be connected to the extension 313a of the conductive hydrogen barrier film 313, i.e., a portion of the conductive hydrogen barrier film 313 that does not overlap with the capacitor upper electrode 312.

Then, as illustrated in FIG. 23C, a wiring 316 made of aluminum, or the like, is formed on the second interlayer insulating film 314 so as to be connected to the second plug 315. Thus, the capacitor upper electrode 312 and the wiring 316 are connected to each other via the conductive hydrogen barrier film 313 and the second plug 315. Then, as illustrated in FIG. 24A and FIG. 24B, a third interlayer insulating film 317 is formed on the second interlayer insulating film 314 including the wiring 316, and a third plug 318 made of tungsten is formed through the third interlayer insulating film 317 to be connected to the wiring 316. Note that a fourth plug 319 is formed through the first interlayer insulating film 307, the insulative film 310 and the second interlayer insulating film 314, as illustrated in FIG. 24B, whereby the high-concentration impurity diffusion layer 306 (a portion to be a drain region) and the wiring 316 are connected to each other. Then, although not shown, a further interlayer insulating film, a further wiring, a surface protection film, etc., are formed on the third interlayer insulating film 317 to complete the ferroelectric memory.

As described above, according to the third embodiment, the first interlayer insulating film 307 is formed on the semiconductor substrate 300, on which a memory cell transistor has been formed, and the first plug 308 connected to the memory cell transistor is formed through the first interlayer insulating film 307, after which the capacitor lower electrode 309 connected to the first plug 308 is formed on the first interlayer insulating film 307. Then, the capacitor insulative film 311 made of a ferroelectric film and the capacitor upper electrode 312 are formed successively on the capacitor lower electrode 309, and the conductive hydrogen barrier film 313 is formed on the capacitor upper electrode 312. Then, the second interlayer insulating film 314 is formed on the first interlayer insulating film 307 including the conductive hydrogen barrier film 313, and the second plug 315 connecting the wiring 316 on the second interlayer insulating film 314 and the conductive hydrogen barrier film 313 to each other is formed through the second interlayer insulating film 314. Thus, the capacitor upper electrode 312 and the wiring 316 can be electrically connected to each other via the conductive hydrogen barrier film 313 and the second plug 315. Therefore, it is not necessary, after the formation of the capacitor upper electrode 312, to form a contact hole for forming a plug therein that directly connects the capacitor upper electrode 312 and the wiring 316 to each other, thereby preventing the capacitor upper electrode 312 from being exposed to a hydrogen atmosphere or a reducing atmosphere. As a result, even when a Pt film having a strong catalytic function is used as the capacitor upper electrode 312, deterioration of the characteristics of the ferroelectric film forming the capacitor insulative film 311 is prevented, thereby improving the reliability of the ferroelectric memory.

Moreover, according to the third embodiment, the conductive hydrogen barrier film 313 is formed so as to extend beyond the area of the capacitor upper electrode 312, so that the second plug 315 can be formed on a portion of the conductive hydrogen barrier film 313 that does not overlap with the capacitor upper electrode 312 (the extension 313a). Thus, it is possible to reliably avoid a situation where the conductive hydrogen barrier film 313 is removed to expose the capacitor upper electrode 312 due to over-etching during the formation of a contact hole for forming the second plug 315 therein through the second interlayer insulating film 314.

Moreover, according to the third embodiment, the entirety of the capacitive element including the capacitor lower electrode 309, the capacitor insulative film 311 and the capacitor upper electrode 312 is always covered by the conductive hydrogen barrier film 313, thereby improving the reduction resistance of the capacitive element.

Moreover, according to the third embodiment, the upper surface of the first plug 308 is covered by the capacitor lower electrode 309 having an oxygen barrier property, thereby preventing the first plug 308 from being oxidized when sintering the ferroelectric film forming the capacitor insulative film 311 in an oxygen atmosphere.

Moreover, according to the third embodiment, the insulative film 310 is embedded in a region between adjacent capacitor lower electrodes 309 so that the upper surface thereof is coplanar with the upper surface of the capacitor lower electrode 309. Therefore, the step of depositing the capacitor insulative film 311, etc., can be performed on a flat base surface, thereby improving the reliability of the capacitive element, i.e., the reliability of the ferroelectric memory.

Note that while tungsten is used as a material of the first plug 308 or the second plug 315, etc., in the third embodiment, polysilicon, or the like, may alternatively be used.

Moreover, in the third embodiment, it is preferred that the capacitor lower electrode 309 is a layered film including a lower layer film (functioning as an adhesion layer) and an upper layer film, wherein the lower layer film is a TiON film having a low oxygen content, a TiN film, a Ti-containing alloy film, or the like, and the upper layer film is a Pt film or a Pt-containing alloy film that is highly resistant to oxidization, an Ru film or an Ir film whose oxide has an oxygen barrier property and is electrically conductive, an $RuO_2$ film or an $IrO_2$ film, or the like.

Moreover, in the third embodiment, it is preferred that the insulative film 310 embedded between adjacent capacitor lower electrodes 309 is an $SiO_2$ film, an $Si_3N_4$ film, an SiON film, or the like.

Moreover, in the third embodiment, it is preferred that a PZT type material, an SBT type material, or the like, is used as the material of the ferroelectric film forming the capacitor insulative film 311.

Moreover, in the third embodiment, it is preferred that the capacitor upper electrode 312 is at least partially a Pt film or a Pt-containing alloy film that is highly resistant to oxidization, an Ru film or an Ir film whose oxide has an oxygen barrier property and is electrically conductive, an $RuO_2$ film or an $IrO_2$ film, or the like. In this way, it is possible to sufficiently grow the crystal of the ferroelectric film forming the capacitor insulative film 311.

Moreover, in the third embodiment, it is preferred that a Ti film, a Ta film, a TiON film, a TiN film, a TaN film, a TiAlN film, a TiAlON film, or an alloy film containing Ti, Ta, TiON, TiN, TaN, TiAlN, or TiAlON, is used as the conductive hydrogen barrier film 313. In this way, it is possible to utilize the hydrogen occluding nature of Ti or Ta to prevent hydrogen from diffusing into the capacitor upper electrode 312, thereby reliably improving the reduction resistance of the capacitive element. Moreover, since the conductivity of the conductive hydrogen barrier film 313 is reliably ensured, it is also reliably ensured that the capacitor upper electrode 312 and the second plug 315 are electrically connected to each other via the conductive hydrogen barrier film 313.

Moreover, in the third embodiment, the insulative film 310 is embedded in a region between adjacent capacitor lower electrodes 309. Alternatively, the insulative film 310 may be omitted.

Moreover, while the ferroelectric film to be the capacitor insulative film 311 and the conductive film to be the capacitor upper electrode 312 are patterned using the same mask pattern in the third embodiment, the conductive film and the ferroelectric film may alternatively be patterned using different mask patterns.

Moreover, in the third embodiment, it is preferred that a side wall is formed on the side surface of each of the capacitor upper electrode 312 and the capacitor insulative film 311 before the formation of the conductive hydrogen barrier film 313. In this way, the step covering property of the conductive film to be the conductive hydrogen barrier film 313 is improved, and it is possible to prevent disconnection from occurring in the extension 313a of the conductive hydrogen barrier film 313, thereby improving the reliability of the ferroelectric memory.

Figure 25:
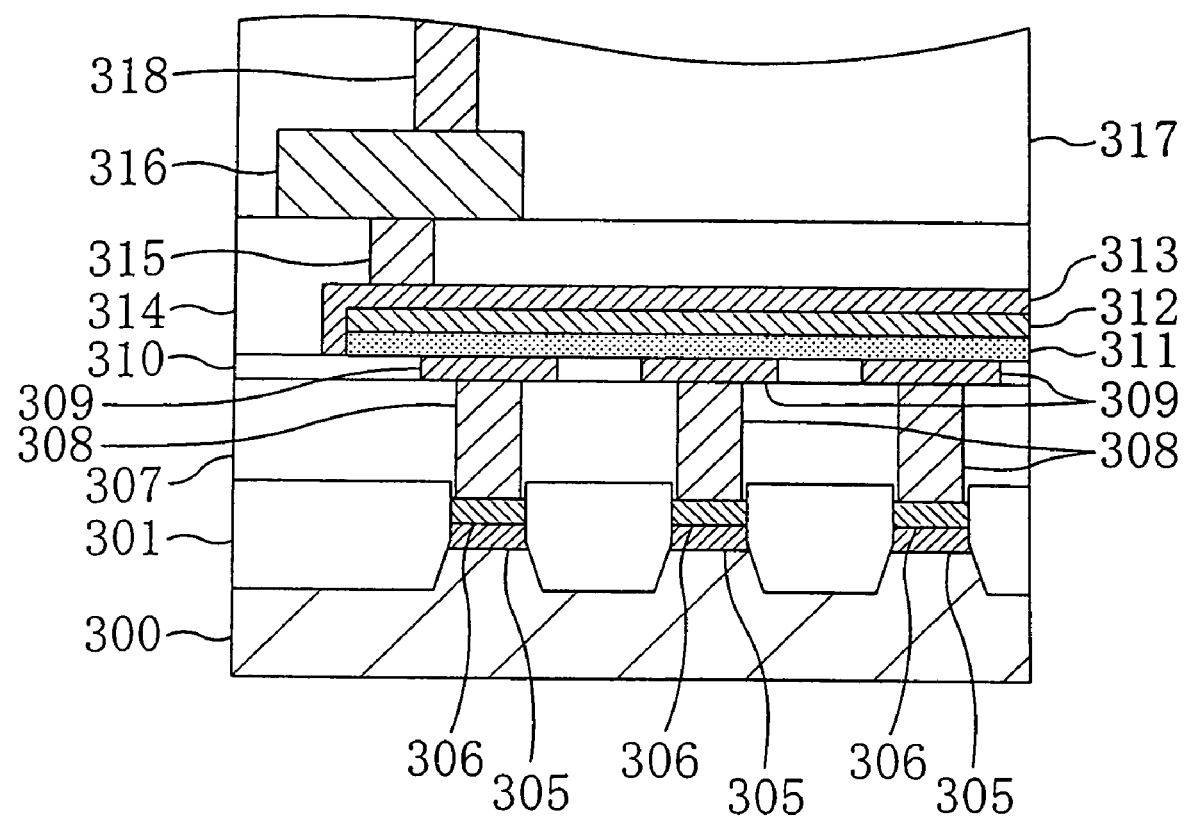
FIG. 25 is a cross-sectional view illustrating an example of a ferroelectric memory according to the third embodiment of the present invention.

Moreover, in the third embodiment, the conductive hydrogen barrier film 313 is formed so as to extend beyond the area of the capacitor upper electrode 312, so that the second plug 315 can be formed on the extension 313a of the conductive hydrogen barrier film 313. Alternatively, the second plug 315 may be formed on a portion of the conductive hydrogen barrier film 313 overlapping with the capacitor upper electrode 312 without forming the extension 313a, as illustrated in FIG. 25, for example. In such a case, it is preferred to employ etching conditions such that the etching selectivity ratio between the conductive hydrogen barrier film 313 and the second interlayer insulating film 314 is high when a contact hole for forming the second plug 315 therein is formed through the second interlayer insulating film 314. In this way, the conductive hydrogen barrier film 313 will not be removed even in a case of over-etching, thereby preventing the capacitor upper electrode 312 from being exposed.

Moreover, the wiring 316 is formed on the second interlayer insulating film 314 so as to be connected to the second plug 315 in the third embodiment, the wiring 316 may alternatively be embedded in the second interlayer insulating film 314 so as to be connected to the second plug 315.

(Fourth Embodiment)

A ferroelectric memory according to a fourth embodiment of the present invention, and a method for manufacturing the same, will now be described with reference to the drawings.

Figure 26A:
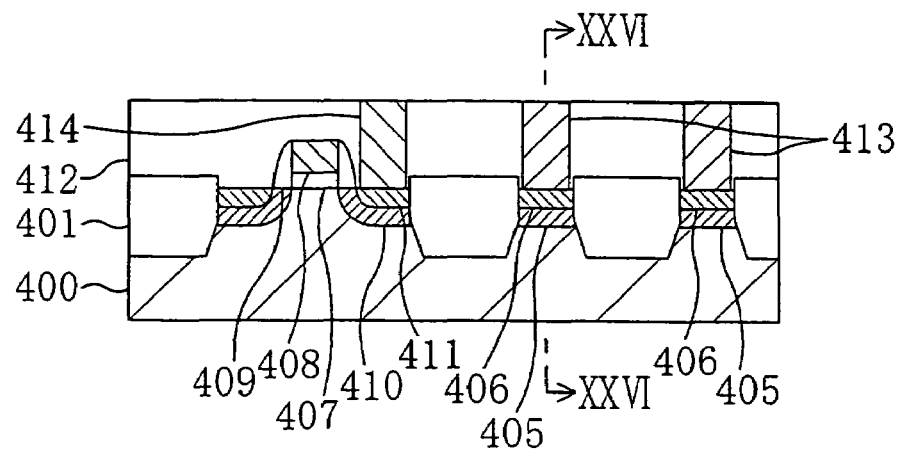
FIG. 26A is a cross-sectional view illustrating a step in a method for manufacturing a ferroelectric memory according to a fourth embodiment of the present invention.
Figure 26B:
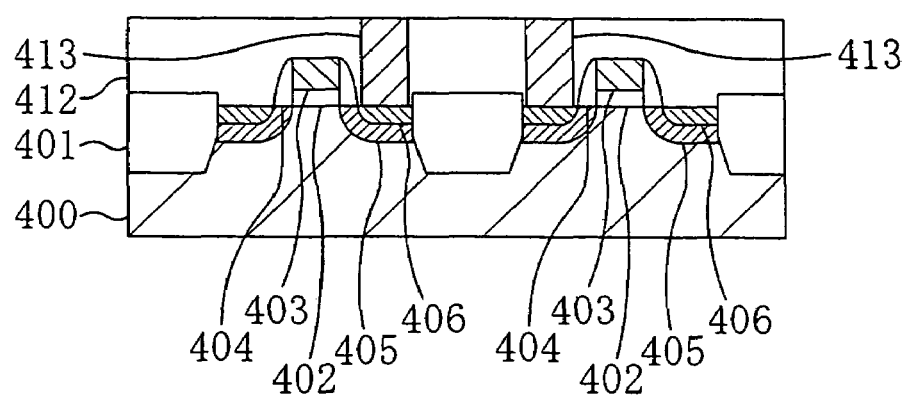
FIG. 26B is a cross-sectional view taken along line XXVI—XXVI in FIG. 26A.
Figure 27A:
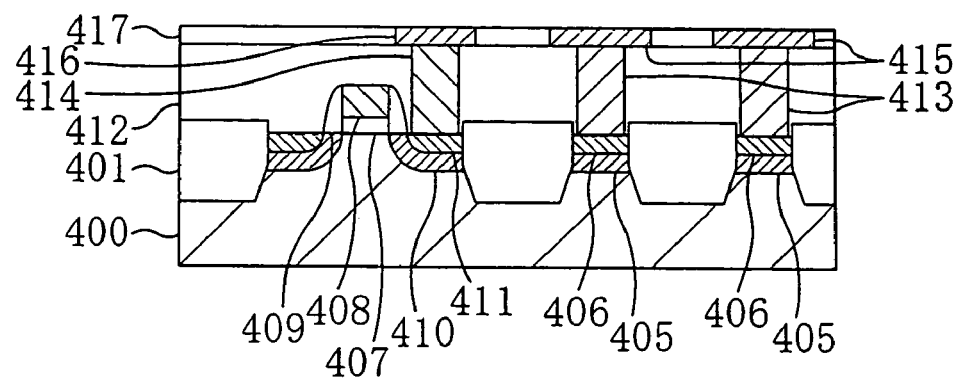
FIG. 27A and FIG. 27B are cross-sectional views each illustrating a step in the method for manufacturing a ferroelectric memory according to the fourth embodiment of the present invention.
Figure 27B:
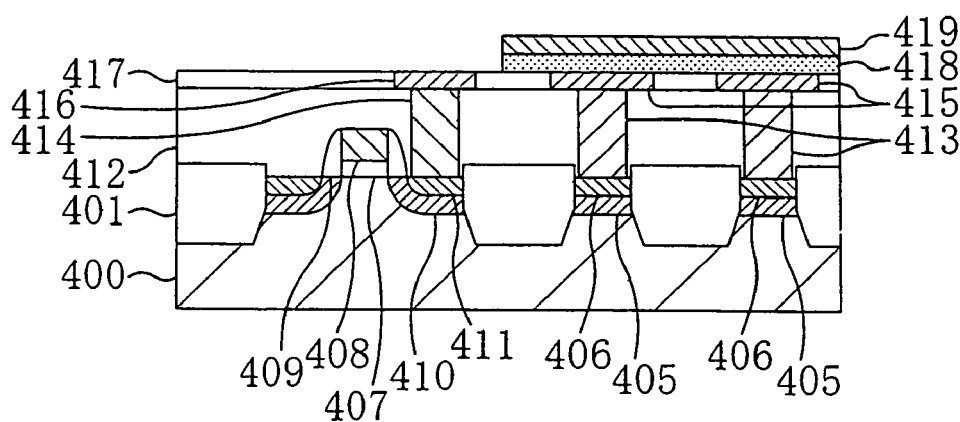
Figure 28A:
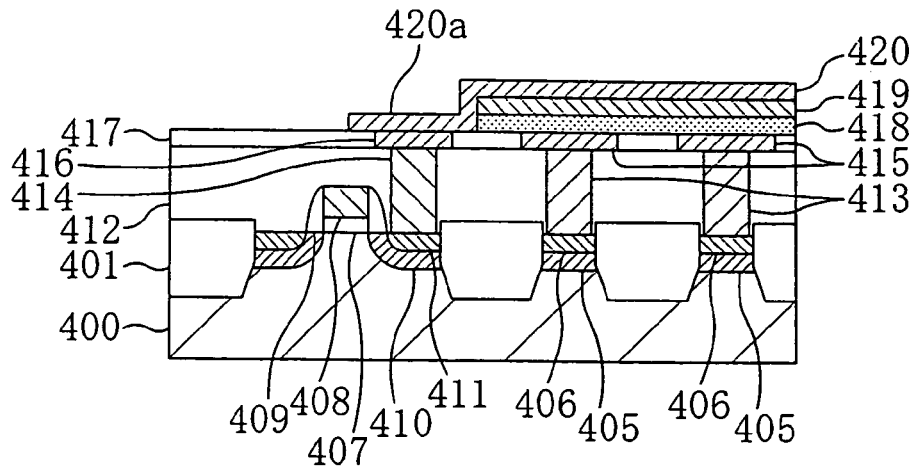
FIG. 28A to FIG. 28C are cross-sectional views each illustrating a step in the method for manufacturing a ferroelectric memory according to the fourth embodiment of the present invention.
Figure 28B:
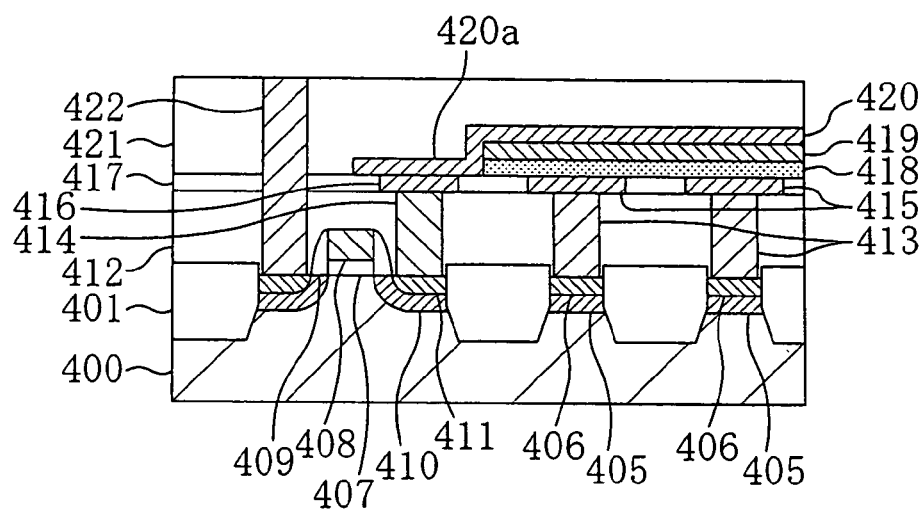
Figure 28C:
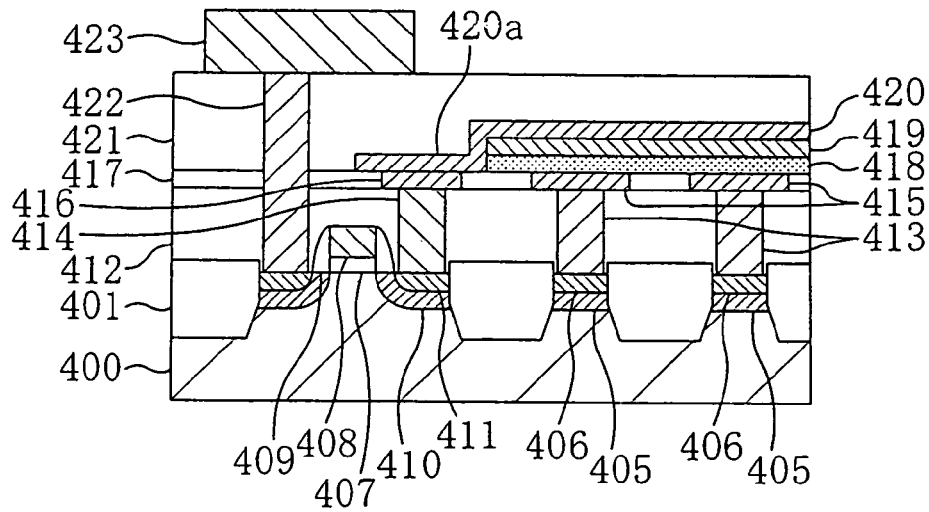
Figure 29A:
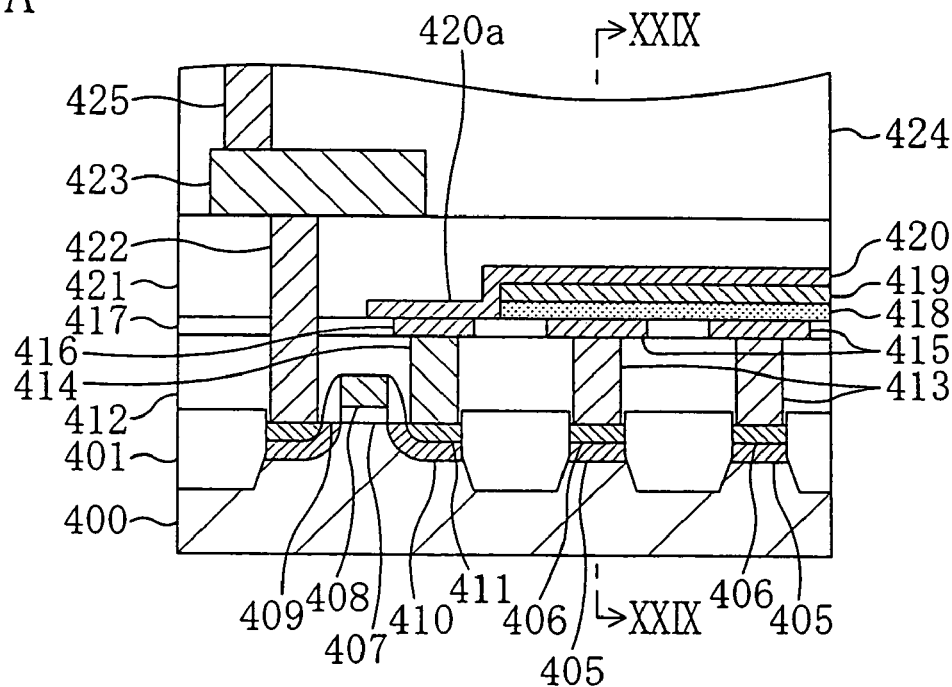
FIG. 29A is a cross-sectional view illustrating a step in the method for manufacturing a ferroelectric memory according to the fourth embodiment of the present invention.
Figure 29B:
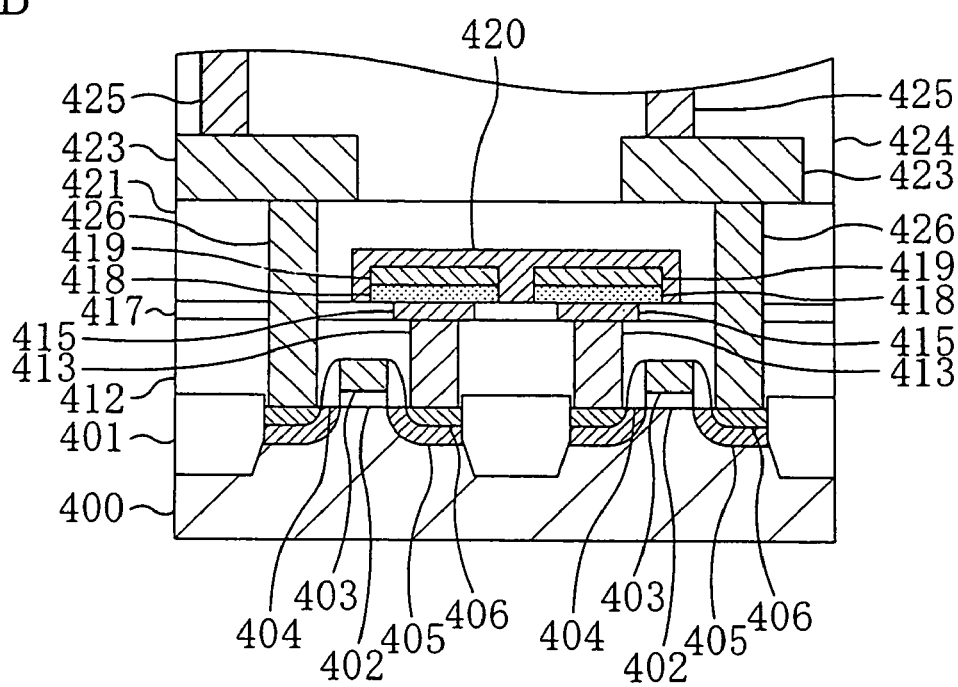
FIG. 29B is a cross-sectional view taken along line XXIX—XXIX in FIG. 29A.

FIG. 26A, FIG. 26B, FIG. 27A, FIG. 27B, FIG. 28A to FIG. 28C, FIG. 29A and FIG. 29B are cross-sectional views each illustrating a step in a method for manufacturing a ferroelectric memory according to the fourth embodiment. Note that FIG. 26B is a cross-sectional view taken along line XXVI—XXVI in FIG. 26A, and FIG. 29B is a cross-sectional view taken along line XXIX—XXIX in FIG. 29A.

First, as illustrated in FIG. 26A and FIG. 26B, a device isolation region 401 having an STI structure is formed on the surface of a semiconductor substrate 400. Then, a first gate electrode 403 forming a part of a memory cell transistor is formed via a first gate insulating film 402 on a memory cell region within each region of the semiconductor substrate 400 surrounded by the device isolation region 401. Then, an insulative first side wall 404 is formed on the side surface of the first gate electrode 403, and a first low-concentration impurity diffusion layer 405 to be the lower layer and a first high-concentration impurity diffusion layer 406 to be the upper layer are formed in a surface portion of each memory cell region of the semiconductor substrate 400. The first low-concentration impurity diffusion layer 405 and the first high-concentration impurity diffusion layer 406 are to be a source region or a drain region of the memory cell transistor.

Moreover, as illustrated in FIG. 26A, a second gate electrode 408 forming a part of a control transistor is formed via a second gate insulating film 407 on a non-memory cell region of the semiconductor substrate 400. Then, an insulative second side wall 409 is formed on the side surface of the second gate electrode 408, and a second low-concentration impurity diffusion layer 410 to be the lower layer and a second high-concentration impurity diffusion layer 411 to be the upper layer are formed in a surface portion of a non-memory cell region of the semiconductor substrate 400. The second low-concentration impurity diffusion layer 410 and the second high-concentration impurity diffusion layer 411 are to be a source region or a drain region of the control transistor.

Note that in the fourth embodiment, each of various elements, e.g., a gate electrode, of the memory cell transistor may be formed simultaneously with its counterpart element of the control transistor.

Then, as illustrated in FIG. 26A and FIG. 26B, a first interlayer insulating film 412 is formed on the semiconductor substrate 400, on which the memory cell transistor and the control transistor have been formed. Then, a first plug 413 made of tungsten and connected to the first high-concentration impurity diffusion layer 406 (a portion to be a source region), and a second plug 414 made of tungsten and connected to the second high-concentration impurity diffusion layer 411 (either a portion to be a source region or a portion to be a drain region), are formed through the first interlayer insulating film 412.

Then, a conductive film having an oxygen barrier property (e.g., an Ir film, an $IrO_2$ film, or the like) is deposited across the entire surface of the first interlayer insulating film 412, and the conductive film is patterned, thereby forming a capacitor lower electrode 415 and a connection pad 416, as illustrated in FIG. 27A. The capacitor lower electrode 415 is made of a conductive film having an oxygen barrier property and covers the upper surface of the first plug 413, and the connection pad 416 is made of a conductive film having an oxygen barrier property and covers the upper surface of the second plug 414. Thus, the memory cell transistor and the capacitor lower electrode 415 are connected to each other via the first plug 413. Then, an insulative film 417 is embedded in a region between adjacent capacitor lower electrodes 415 or a region between the capacitor lower electrode 415 and the connection pad 416 so that the upper surface thereof is coplanar with the upper surfaces of the capacitor lower electrode 415 and the connection pad 416.

Then, a ferroelectric film made of a PZT type material or an SBT type material, and a conductive film made of Pt or a Pt-containing alloy, are successively deposited across the entire surface of the first interlayer insulating film 412, on which the insulative film 417 has been formed, after which the conductive film and the ferroelectric film are patterned using the same mask pattern (not shown), thereby forming a capacitor insulative film 418 covering the upper surface of the capacitor lower electrode 415, and a capacitor upper electrode 419 covering the upper surface of the capacitor insulative film 418, as illustrated in FIG. 27B. Note that the capacitor lower electrode 415, the capacitor insulative film 418 and the capacitor upper electrode 419 together form a capacitive element.

Then, a conductive film having a hydrogen barrier property, e.g., a Ti film, a Ta film, a Ti-containing alloy film, or a Ta-containing alloy film, is deposited across the entire surface of the first interlayer insulating film 412, on which the capacitive element has been formed, and the conductive film is patterned, thereby forming a conductive hydrogen barrier film 420 covering the capacitive element and extending beyond the area of the capacitor upper electrode 419, as illustrated in FIG. 28A. Specifically, the conductive hydrogen barrier film 420 includes an extension 420a covering at least a portion of the upper surface of the connection pad 416, and the extension 420a is formed when patterning the conductive film to be the conductive hydrogen barrier film 420. Thus, the conductive hydrogen barrier film 420 and the second plug 414 are connected to each other via the connection pad 416, whereby the conductive hydrogen barrier film 420 and the second high-concentration impurity diffusion layer 411 are electrically connected to each other via the second plug 414.

Then, as illustrated in FIG. 28B, a second interlayer insulating film 421 is formed on the first interlayer insulating film 412, on which the conductive hydrogen barrier film 420 has been formed. Then, a third plug 422 made of tungsten is formed through the first interlayer insulating film 412, the insulative film 417 and the second interlayer insulating film 421 so as to be connected to the second high-concentration impurity diffusion layer 411 (one of a portion to be a source region and a portion to be a drain region to which the second plug 414 is not connected).

Then, as illustrated in FIG. 28C, a wiring 423 made of aluminum, or the like, is formed on the second interlayer insulating film 421 so as to be connected to the third plug 422. Thus, the wiring 423 and the second high-concentration impurity diffusion layer 411 are connected to each other via the third plug 422. Then, as illustrated in FIG. 29A and FIG. 29B, a third interlayer insulating film 424 is formed on the second interlayer insulating film 421 including the wiring 423, and a fourth plug 425 made of tungsten is formed through the third interlayer insulating film 424 so as to be connected to the wiring 423. Note that a fifth plug 426 is formed through the first interlayer insulating film 412, the insulative film 417 and the second interlayer insulating film 421, as illustrated in FIG. 29B, whereby the first high-concentration impurity diffusion layer 406 (a portion to be a drain region) and the wiring 423 are connected to each other. Then, although not shown, a further interlayer insulating film, a further wiring, a surface protection film, etc., are formed on the third interlayer insulating film 424 to complete the ferroelectric memory.

As described above, according to the fourth embodiment, the first interlayer insulating film 412 is formed on the semiconductor substrate 400, on which a memory cell transistor and a control transistor including the second high-concentration impurity diffusion layer 411 have been formed, and the first plug 413 connected to the memory cell transistor and the second plug 414 connected to the second high-concentration impurity diffusion layer 411 are formed through the first interlayer insulating film 412. Then, the capacitor lower electrode 415 connected to the first plug 413 is formed on the first interlayer insulating film 412, and the capacitor insulative film 418 made of a ferroelectric film and the capacitor upper electrode 419 are formed successively on the capacitor lower electrode 415, after which the conductive hydrogen barrier film 420 extending beyond the area of the capacitor upper electrode 419 and electrically connected to the second plug 414 is formed on the capacitor upper electrode 419. Then, the second interlayer insulating film 421 is formed on the first interlayer insulating film 412 including the conductive hydrogen barrier film 420, and the third plug 422 connecting the second high-concentration impurity diffusion layer 411 and the wiring 423 on the second interlayer insulating film 421 to each other is formed through the first interlayer insulating film 412 and the second interlayer insulating film 421. Therefore, before the formation of the capacitor upper electrode 419, more specifically, simultaneously with the formation of the first plug 413 connecting the memory cell transistor and the capacitor lower electrode 415 to each other, the second plug 414 connecting the conductive hydrogen barrier film 420 and the second high-concentration impurity diffusion layer 411 to each other can be formed through the first interlayer insulating film 412. Thus, the capacitor upper electrode 419 and the wiring 423 can be electrically connected to each other via the conductive hydrogen barrier film 420, the second plug 414, the second high-concentration impurity diffusion layer 411 and the third plug 422. In other words, the capacitor upper electrode 419 and the wiring 423 can be electrically connected to each other by using the second plug 414 and the second high-concentration impurity diffusion layer 411, which are formed in advance below the capacitive element. Therefore, it is not necessary, after the formation of the capacitor upper electrode 419, to form a contact hole for forming a plug therein that directly connects the capacitor upper electrode 419 and the wiring 423 to each other, thereby preventing the capacitor upper electrode 419 from being exposed to a hydrogen atmosphere or a reducing atmosphere. As a result, even when a Pt film having a strong catalytic function is used as the capacitor upper electrode 419, deterioration of the characteristics of the ferroelectric film forming the capacitor insulative film 418 is prevented, thereby improving the reliability of the ferroelectric memory.

Moreover, according to the fourth embodiment, the entirety of the capacitive element including the capacitor lower electrode 415, the capacitor insulative film 418 and the capacitor upper electrode 419 is always covered by the conductive hydrogen barrier film 420, thereby improving the reduction resistance of the capacitive element.

Moreover, according to the fourth embodiment, the capacitor lower electrode 415 having an oxygen barrier property covers the upper surface of the first plug 413, while the connection pad 416 having an oxygen barrier property covers the upper surface of the second plug 414. Thus, it is possible to prevent the first plug 413 and the second plug 414 from being oxidized when sintering the ferroelectric film forming the capacitor insulative film 418 in an oxygen atmosphere.

Moreover, according to the fourth embodiment, the connection pad 416 is formed simultaneously with the formation of the capacitor lower electrode 415 by patterning a conductive film used as a material of the capacitor lower electrode 415 and having an oxygen barrier property so as to cover the entire upper surface of the second plug 414, thereby preventing the second plug 414 from being oxidized, without increasing the number of manufacturing steps. Moreover, since the conductive hydrogen barrier film 420 is formed so as to be connected to the connection pad 416, the conductive hydrogen barrier film 420 and the second plug 414 can be connected to each other via the connection pad 416.

Moreover, according to the fourth embodiment, the insulative film 417 is embedded in a region between adjacent capacitor lower electrodes 415 or a region between the capacitor lower electrode 415 and the connection pad 416 so that the upper surface thereof is coplanar with the upper surfaces of the capacitor lower electrode 415 and the connection pad 416. Therefore, the step of depositing the capacitor insulative film 418, etc., can be performed on a flat base surface, thereby improving the reliability of the capacitive element, i.e., the reliability of the ferroelectric memory.

Moreover, in the fourth embodiment, if a surface portion of the second high-concentration impurity diffusion layer 411 is silicified into a silicide layer, and the silicide layer is used as the conductive layer connecting the second plug 414 and the third plug 422 to each other, the following effect can be obtained. That is, the resistance of the conductive layer can be reduced as compared to a case where a polysilicon layer formed on the semiconductor substrate 400, or the like, is used as the conductive layer connecting the second plug 414 and the third plug 422 to each other.

Note that while tungsten is used as a material of the first plug 413, the second plug 414 or the third plug 422, etc., in the fourth embodiment, polysilicon, or the like, may alternatively be used.

Moreover, in the fourth embodiment, it is preferred that the capacitor lower electrode 415 is a layered film including a lower layer film (functioning as an adhesion layer) and an upper layer film, wherein the lower layer film is a TiON film having a low oxygen content, a TiN film, a Ti-containing alloy film, or the like, and the upper layer film is a Pt film or a Pt-containing alloy film that is highly resistant to oxidization, an Ru film or an Ir film whose oxide has an oxygen barrier property and is electrically conductive, an $RuO_2$ film or an $IrO_2$ film, or the like.

Moreover, in the fourth embodiment, it is preferred that the insulative film 417 embedded between adjacent capacitor lower electrodes 415 is an $SiO_2$ film, an $Si_3N_4$ film, an SiON film, or the like.

Moreover, in the fourth embodiment, it is preferred that a PZT type material, an SBT type material, or the like, is used as the material of the ferroelectric film forming the capacitor insulative film 418.

Moreover, in the fourth embodiment, it is preferred that the capacitor upper electrode 419 is at least partially a Pt film or a Pt-containing alloy film that is highly resistant to oxidization, an Ru film or an Ir film whose oxide has an oxygen barrier property and is electrically conductive, an $RuO_2$ film or an $IrO_2$ film, or the like. In this way, it is possible to sufficiently grow the crystal of the ferroelectric film forming the capacitor insulative film 418.

Moreover, in the fourth embodiment, it is preferred that a Ti film, a Ta film, a TiON film, a TiN film, a TaN film, a TiAlN film, a TiAlON film, or an alloy film containing Ti, Ta, TiON, TiN, TaN, TiAlN, or TiAlON, is used as the conductive hydrogen barrier film 420. In this way, it is possible to utilize the hydrogen occluding nature of Ti or Ta to prevent hydrogen from diffusing into the capacitor upper electrode 419, thereby reliably improving the reduction resistance of the capacitive element. Moreover, since the conductivity of the conductive hydrogen barrier film 420 is reliably ensured, it is also reliably ensured that the capacitor upper electrode 419 and the second plug 414 are electrically connected to each other via the conductive hydrogen barrier film 420.

Figure 30:
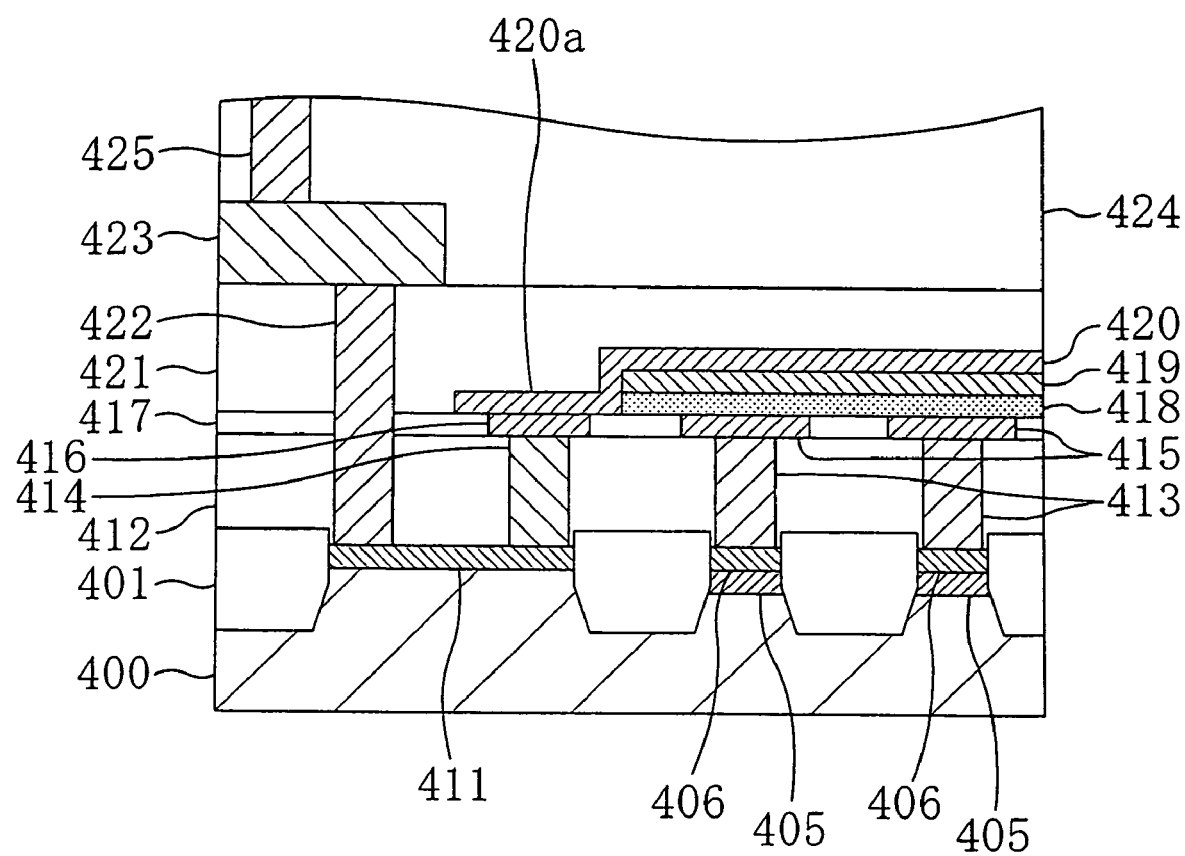
FIG. 30 is a cross-sectional view illustrating an example of a ferroelectric memory according to the fourth embodiment of the present invention.

Moreover, in the fourth embodiment, a control transistor including the second gate electrode 408, etc., (having a function as a driver for turning ON/OFF the capacitor upper electrode 419, i.e., a memory cell plate) is formed in a non-memory cell region on the semiconductor substrate 400. Thus, in the fourth embodiment, the capacitor upper electrode 419 and the wiring 423 are electrically connected to each other via the conductive hydrogen barrier film 420, the second plug 414, the second high-concentration impurity diffusion layer 411 (i.e., a source region or a drain region of the control transistor) and the third plug 422 only when the control transistor is ON. In contrast, in a ferroelectric memory whose circuit configuration does not require a control transistor, only the second high-concentration impurity diffusion layer 411 may be formed in the non-memory cell region on the semiconductor substrate 400, as illustrated in FIG. 30, for example. In such a case, the capacitor upper electrode 419 and the wiring 423 are always electrically connected to each other via the conductive hydrogen barrier film 420, the second plug 414, the second high-concentration impurity diffusion layer 411 and the third plug 422. Moreover, in such a case, a silicide layer may be formed in a surface portion of the second high-concentration impurity diffusion layer 411.

Figure 31:
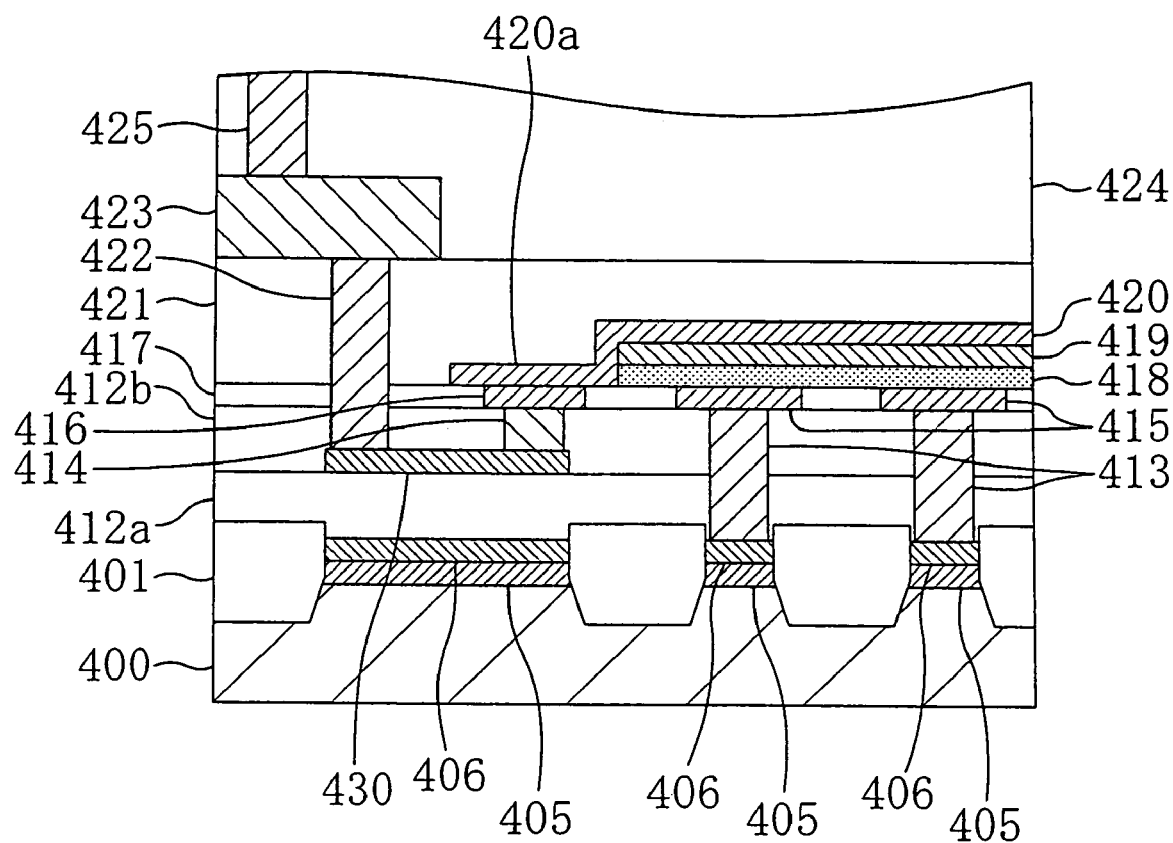
FIG. 31 is a cross-sectional view illustrating an example of a ferroelectric memory according to the fourth embodiment of the present invention.
Figure 32:
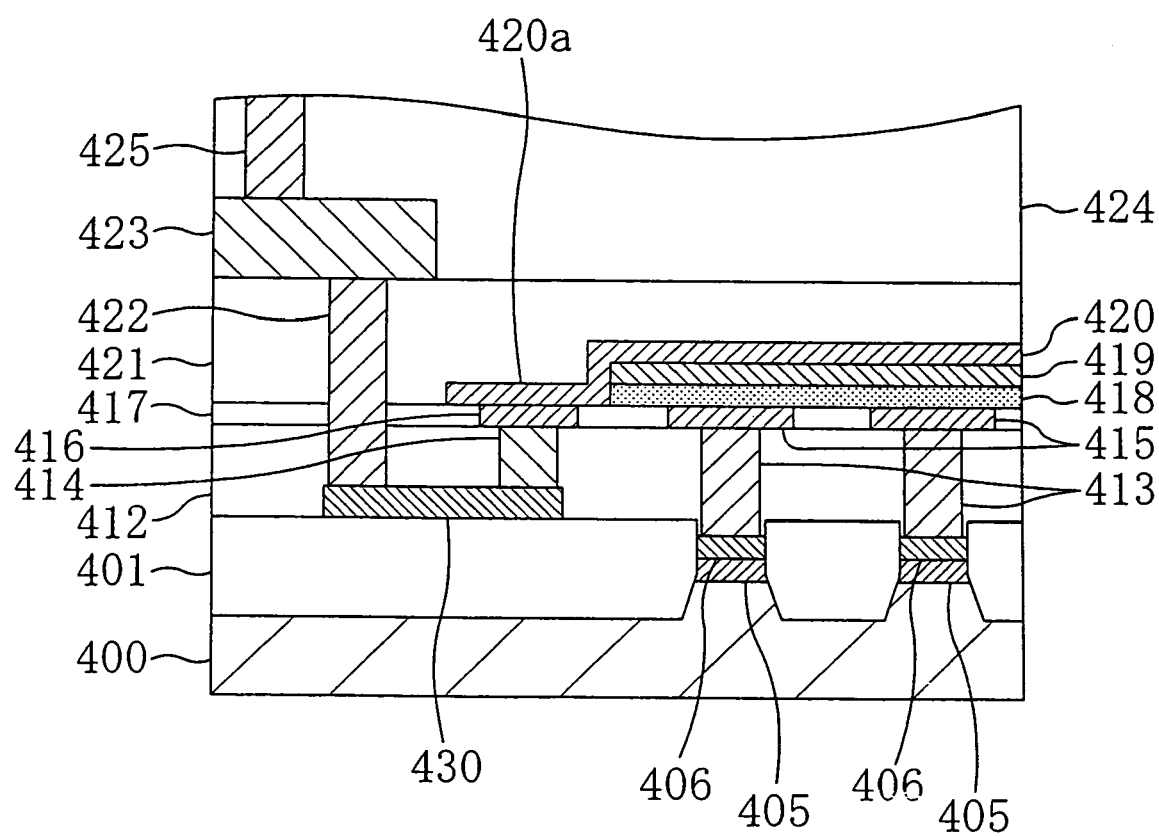
FIG. 32 is a cross-sectional view illustrating an example of a ferroelectric memory according to the fourth embodiment of the present invention.

Moreover, while the second high-concentration impurity diffusion layer 411 is used as a conductive layer connecting the second plug 414 and the third plug 422 to each other in the fourth embodiment, a conductive layer 430 formed between a lower layer film 412a and an upper layer film 412b of the first interlayer insulating film 412 may alternatively be used, as illustrated in FIG. 31, for example. A primary difference between a method for forming the device structure illustrated in FIG. 31 (for details, see the second variation of the first embodiment) and the method of the present embodiment is as follows. The lower layer film 412a of the first interlayer insulating film 412 is formed on the semiconductor substrate 400, on which a memory cell transistor has been formed, and the conductive layer 430 is formed on the lower layer film 412a in a non-memory cell region, after which the upper layer film 412b of the first interlayer insulating film 412 is formed. Then, the first plug 413 connected to the memory cell transistor and the second plug 414 connected to the conductive layer 430 are formed through the first interlayer insulating film 412. While the material of the conductive layer 430 is not limited to any particular material, it is preferred to use a low resistance material, e.g., polysilicon, silicide, tungsten, or the like, as the material of the conductive layer 430, in view of the fact that the conductive layer 430 is used as an extraction line for the capacitor upper electrode 419. Moreover, a wiring layer below the ferroelectric capacitor (a capacitive element including the capacitor lower electrode 415, the capacitor insulative film 418 and the capacitor upper electrode 419), e.g., a wiring layer used as a bit line, may be used as the conductive layer 430. Alternatively, a wiring layer formed on the semiconductor substrate 400 with no interlayer insulating film therebetween, e.g., a wiring layer that is formed simultaneously with the gate electrode of a memory cell transistor or a control transistor, may be used as the conductive layer 430, as illustrated in FIG. 32, for example. In such a case, the wiring layer may be formed on the device isolation region 401 or on a region of the semiconductor substrate 400 where the device isolation region 401 is not formed.

Moreover, in the fourth embodiment, the upper surface of the second plug 414 is covered by the connection pad 416 having an oxygen barrier property. Alternatively, the connection pad 416 may be omitted when, for example, the second plug 414 is made of a material having an oxygen barrier property. In this way, the degree of integration of the ferroelectric memory can be improved. In such a case, it is preferred that the extension 420a of the conductive hydrogen barrier film 420 covers at least a portion of the upper surface of the second plug 414.

Moreover, in the fourth embodiment, the insulative film 417 is embedded in a region between adjacent capacitor lower electrodes 415 or a region between the capacitor lower electrode 415 and the connection pad 416. Alternatively, the insulative film 417 may be omitted.

Moreover, while the ferroelectric film to be the capacitor insulative film 418 and the conductive film to be the capacitor upper electrode 419 are patterned using the same mask pattern in the fourth embodiment, the conductive film and the ferroelectric film may alternatively be patterned using different mask patterns.

Moreover, in the fourth embodiment, it is preferred that a side wall is formed on the side surface of each of the capacitor upper electrode 419 and the capacitor insulative film 418 before the formation of the conductive hydrogen barrier film 420. In this way, the step covering property of the conductive film to be the conductive hydrogen barrier film 420 is improved, and it is possible to prevent disconnection from occurring in the extension 420a of the conductive hydrogen barrier film 420, thereby improving the reliability of the ferroelectric memory.

Moreover, in the fourth embodiment, the wiring 423 is formed on the second interlayer insulating film 421 so as to be connected to the third plug 422. Alternatively, the wiring 423 may be embedded in the second interlayer insulating film 421 so as to be connected to the third plug 422.

(Variation Of Fourth Embodiment)

A ferroelectric memory according to a variation of the fourth embodiment of the present invention, and a method for manufacturing the same, will now be described with reference to the drawings.

FIG. 33A to FIG. 33C, FIG. 34A, FIG. 34B, FIG. 35A and FIG. 35B are cross-sectional views each illustrating a step in a method for manufacturing a ferroelectric memory according to the variation of the fourth embodiment.

Figure 33A:
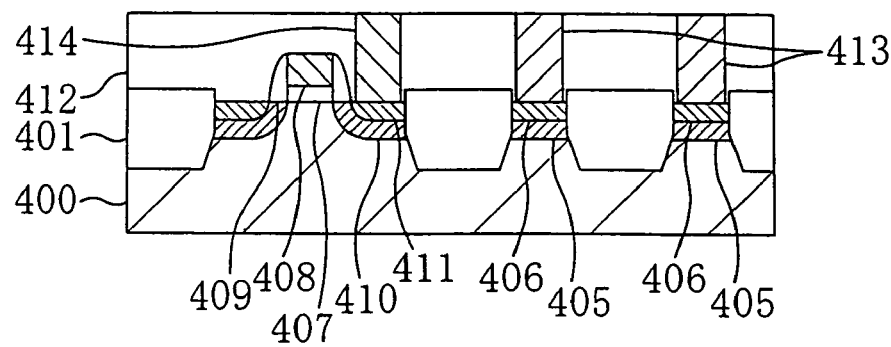
FIG. 33A to FIG. 33C are cross-sectional views each illustrating a step in a method for manufacturing a ferroelectric memory according to a variation of the fourth embodiment of the present invention.

First, as illustrated in FIG. 33A, a device isolation region 401 having an STI structure is formed on the surface of a semiconductor substrate 400. Then, in a surface portion of a memory cell region within each region of the semiconductor substrate 400 surrounded by the device isolation region 401, a first low-concentration impurity diffusion layer 405 to be the lower layer and a first high-concentration impurity diffusion layer 406 to be the upper layer are formed. The first low-concentration impurity diffusion layer 405 and the first high-concentration impurity diffusion layer 406 are to be a source region or a drain region of the memory cell transistor (the gate electrode, etc., are not shown).

Moreover, as illustrated in FIG. 33A, on a non-memory cell region of the semiconductor substrate 400, a second gate electrode 408 forming a part of a control transistor is formed via a second gate insulating film 407. Then, an insulative second side wall 409 is formed on the side surface of the second gate electrode 408, and a second low-concentration impurity diffusion layer 410 to be the lower layer and a second high-concentration impurity diffusion layer 411 to be the upper layer are formed in a surface portion of a non-memory cell region of the semiconductor substrate 400. The second low-concentration impurity diffusion layer 410 and the second high-concentration impurity diffusion layer 411 are to be a source region or a drain region of the control transistor.

Note that in the variation of the fourth embodiment, each of various elements, e.g., a gate electrode, of the memory cell transistor may be formed simultaneously with its counterpart element of the control transistor.

Then, as illustrated in FIG. 33A, a first interlayer insulating film 412 is formed on the semiconductor substrate 400, on which the memory cell transistor and the control transistor have been formed. Then, a first plug 413 made of tungsten and connected to the first high-concentration impurity diffusion layer 406 (a portion to be a source region), and a second plug 414 made of tungsten and connected to the second high-concentration impurity diffusion layer 411 (either a portion to be a source region or a portion to be a drain region), are formed through the first interlayer insulating film 412.

Figure 33B:
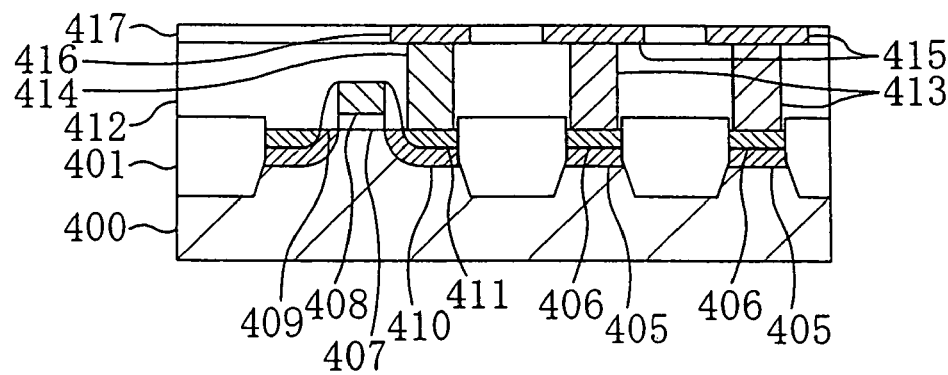

Then, a conductive film having an oxygen barrier property (e.g., an Ir film, an IrO₂ film, or the like) is deposited across the entire surface of the first interlayer insulating film 412, and the conductive film is patterned, thereby forming a capacitor lower electrode 415 and a connection pad 416, as illustrated in FIG. 33B. The capacitor lower electrode 415 is made of a conductive film having an oxygen barrier property and covers the upper surface of the first plug 413, and the connection pad 416 is made of a conductive film having an oxygen barrier property and covers the upper surface of the second plug 414. Thus, the memory cell transistor and the capacitor lower electrode 415 are connected to each other via the first plug 413. Then, an insulative film 417 is embedded in a region between adjacent capacitor lower electrodes 415 or a region between the capacitor lower electrode 415 and the connection pad 416 so that the upper surface thereof is coplanar with the upper surfaces of the capacitor lower electrode 415 and the connection pad 416.

Figure 33C:
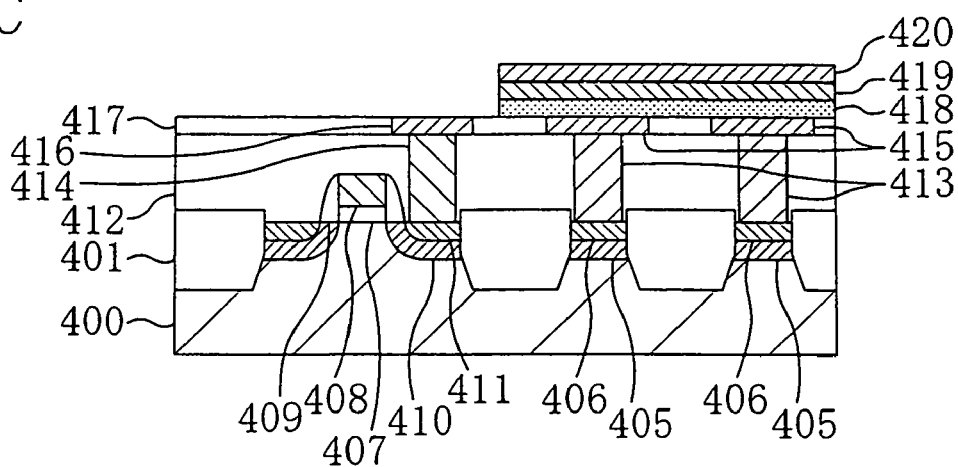

Then, a ferroelectric film made of a PZT type material or an SBT type material, a first conductive film made of Pt or a Pt-containing alloy, and a second conductive film having a hydrogen barrier property (e.g., a Ti film, a Ta film, a Ti-containing alloy film, or a Ta-containing alloy film), are successively deposited across the entire surface of the first interlayer insulating film 412, on which the insulative film 417 has been formed, after which the second conductive film, the first conductive film and the ferroelectric film are patterned using the same mask pattern (not shown). Thus, a capacitor insulative film 418 covering the upper surface of the capacitor lower electrode 415, a capacitor upper electrode 419 covering the upper surface of the capacitor insulative film 418, and a conductive hydrogen barrier film 420 covering the upper surface of the capacitor upper electrode 419, are formed as illustrated in FIG. 33C. Note that the capacitor lower electrode 415, the capacitor insulative film 418 and the capacitor upper electrode 419 together form a capacitive element.

Figure 34A:
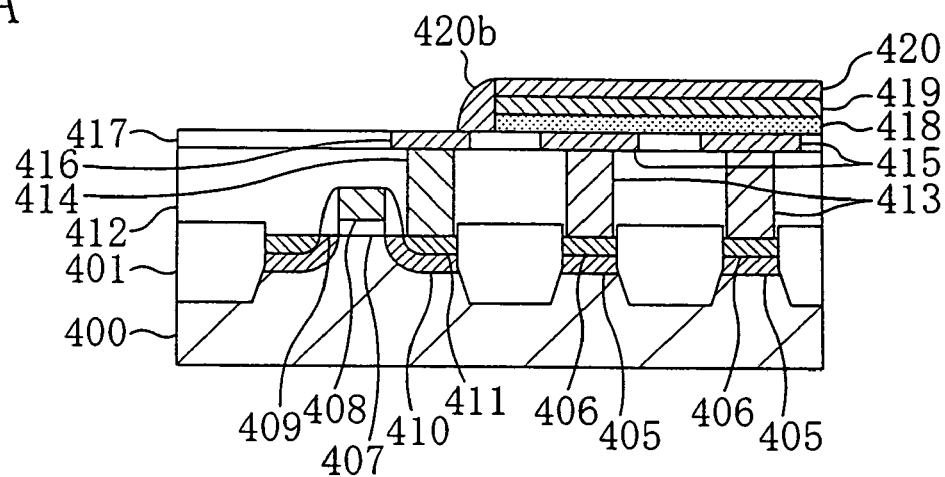
FIG. 34A and FIG. 34B are cross-sectional views each illustrating a step in the method for manufacturing a ferroelectric memory according to the variation of the fourth embodiment of the present invention.

Then, a conductive film (not shown) is deposited across the entire surface of the first interlayer insulating film 412, on which the conductive hydrogen barrier film 420 has been formed, and the conductive film is etched back to form a conductive third side wall 420b on the side surface of the conductive hydrogen barrier film 420 so that the conductive third side wall 420b is connected to the connection pad 416, as illustrated in FIG. 34A. Thus, the conductive hydrogen barrier film 420 and the second plug 414 are connected to each other via the third side wall 420b and the connection pad 416.

Figure 34B:
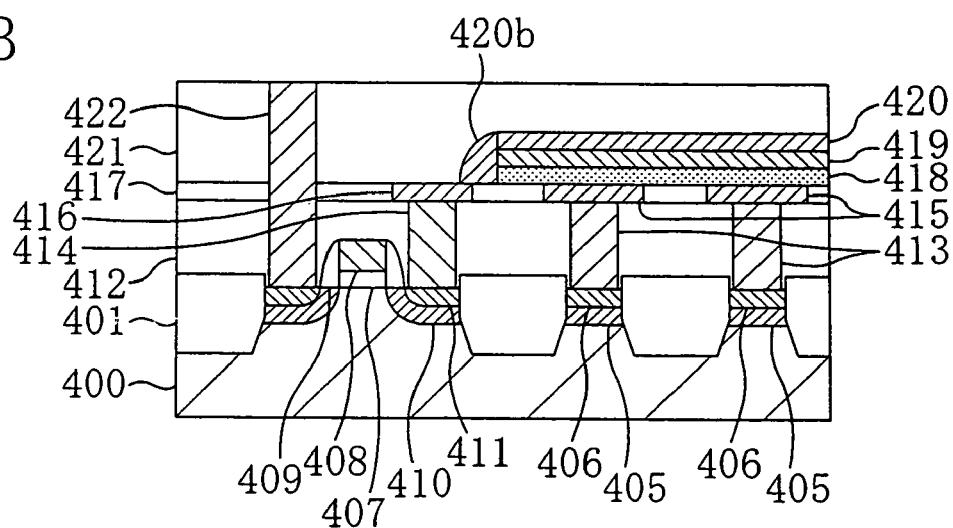

Then, as illustrated in FIG. 34B, a second interlayer insulating film 421 is formed on the first interlayer insulating film 412, on which the capacitive element has been formed. Then, a third plug 422 made of tungsten is formed through the first interlayer insulating film 412, the insulative film 417 and the second interlayer insulating film 421 so as to be connected to the second high-concentration impurity diffusion layer 411 (one of a portion to be a source region and a portion to be a drain region to which the second plug 414 is not connected).

Figure 35A:
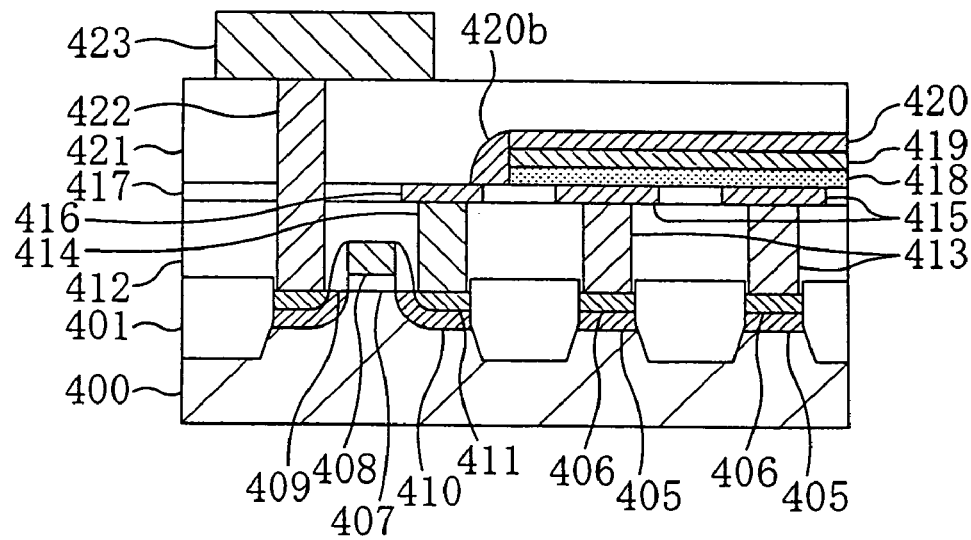
FIG. 35A and FIG. 35B are cross-sectional views each illustrating a step in the method for manufacturing a ferroelectric memory according to the variation of the fourth embodiment of the present invention.
Figure 35B:
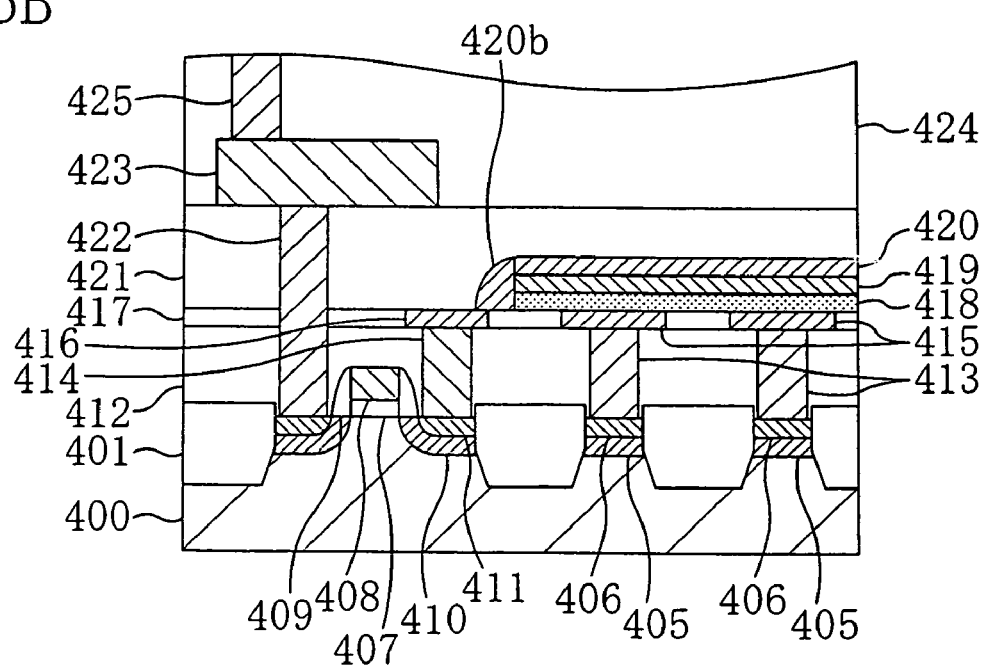
Figure 36:
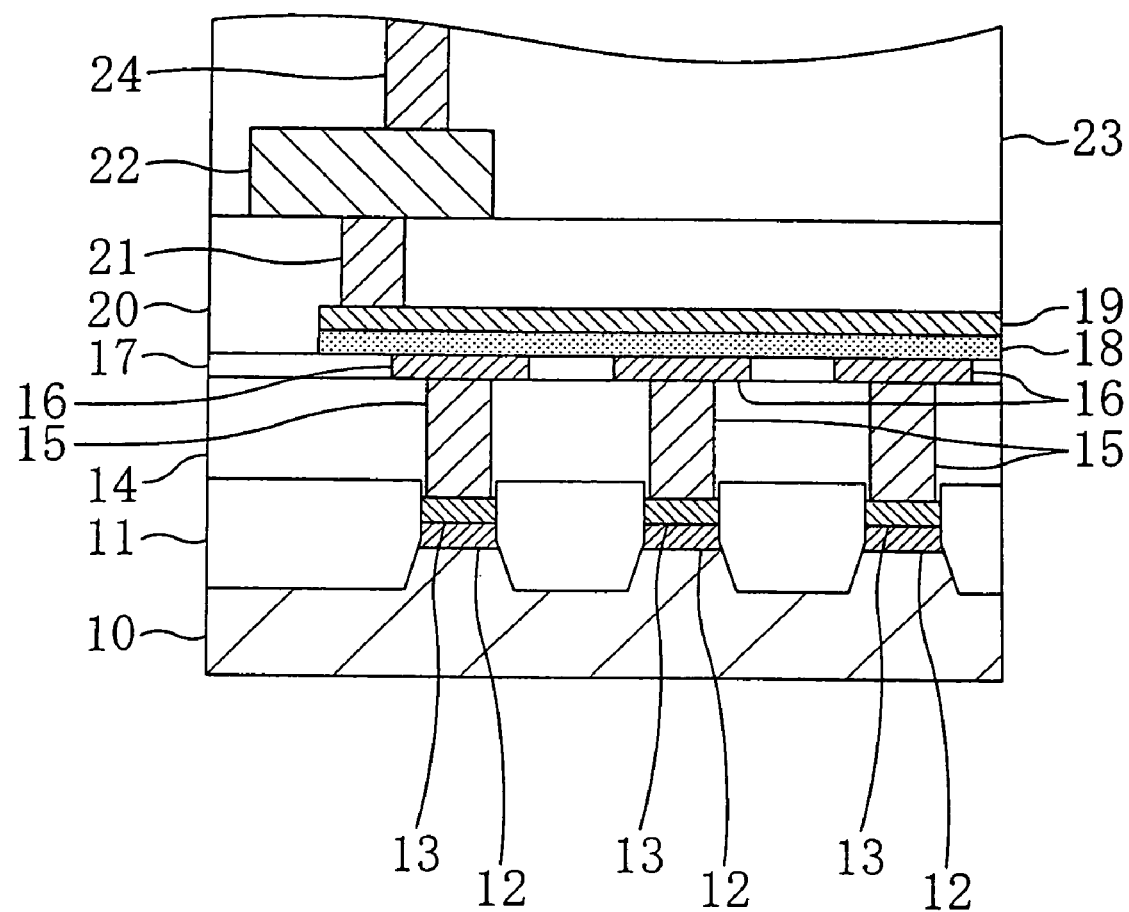
FIG. 36 is a cross-sectional view illustrating a ferroelectric memory according to a first conventional example.
Figure 37:
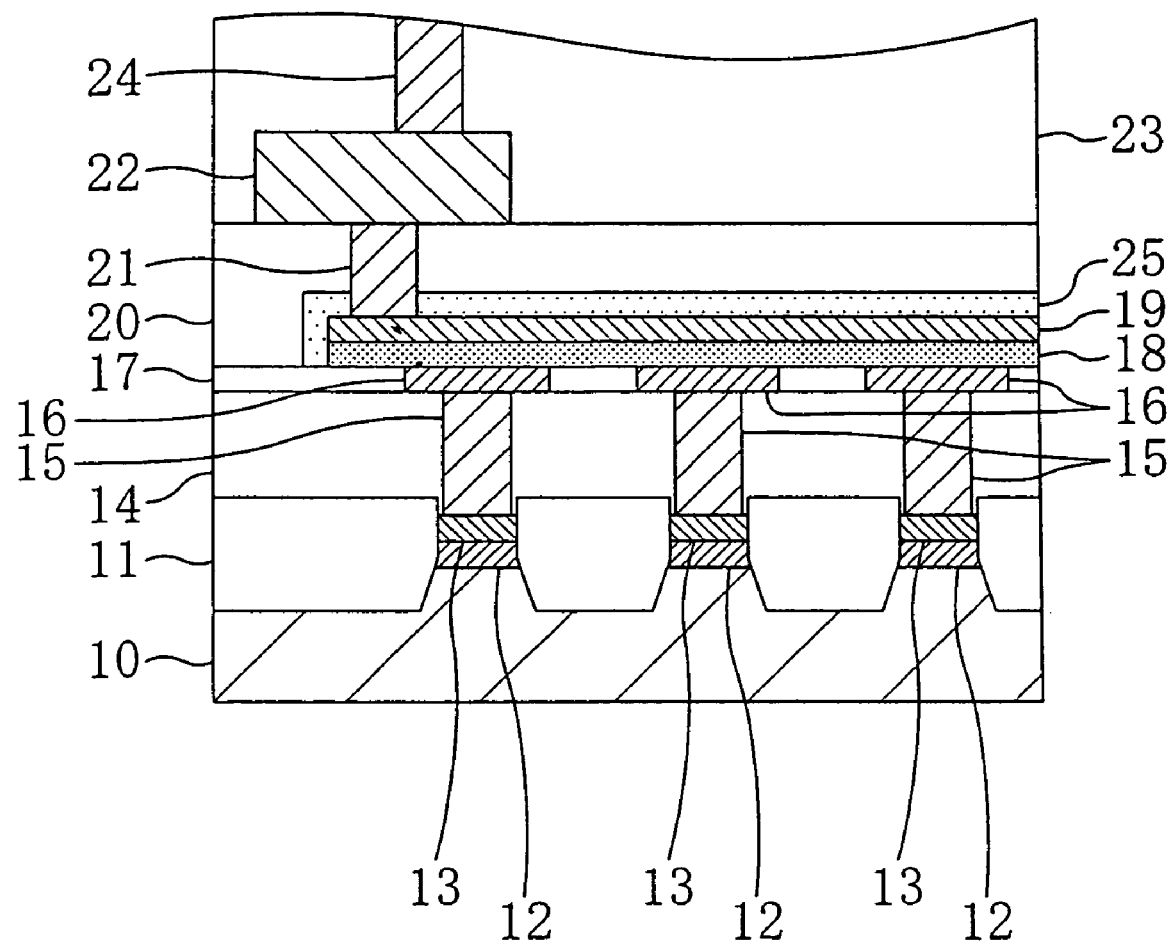
FIG. 37 is a cross-sectional view illustrating a ferroelectric memory according to a second conventional example.

Then, as illustrated in FIG. 35A, a wiring 423 made of aluminum, or the like, is formed on the second interlayer insulating film 421 so as to be connected to the third plug 422. Thus, the wiring 423 and the second high-concentration impurity diffusion layer 411 are connected to each other via the third plug 422. Then, as illustrated in FIG. 35B, a third interlayer insulating film 424 is formed on the second interlayer insulating film 421 including the wiring 423, and a fourth plug 425 made of tungsten is formed through the third interlayer insulating film 424 so as to be connected to the wiring 423. Then, although not shown, a further interlayer insulating film, a further wiring, a surface protection film, etc., are formed on the third interlayer insulating film 424 to complete the ferroelectric memory.

As described above, according to the variation of the fourth embodiment, the first interlayer insulating film 412 is formed on the semiconductor substrate 400, on which a memory cell transistor and a control transistor including the second high-concentration impurity diffusion layer 411 have been formed, and the first plug 413 connected to the memory cell transistor and the second plug 414 connected to the second high-concentration impurity diffusion layer 411 are formed through the first interlayer insulating film 412. Then, the capacitor lower electrode 415 connected to the first plug 413 is formed on the first interlayer insulating film 412, after which the ferroelectric film to be the capacitor insulative film 418, the first conductive film to be the capacitor upper electrode 419 and the second conductive film to be the conductive hydrogen barrier film 420 are patterned using the same mask pattern. Thus, the capacitor insulative film 418 covering the upper surface of the capacitor lower electrode 415, the capacitor upper electrode 419 covering the upper surface of the capacitor insulative film 418, and the conductive hydrogen barrier film 420 covering the upper surface of the capacitor upper electrode 419, are formed. Then, the conductive third side wall 420b is formed on the side surface of the conductive hydrogen barrier film 420 so as to be electrically connected to the second plug 414. Then, the second interlayer insulating film 421 is formed on the first interlayer insulating film 412 including the conductive hydrogen barrier film 420, and the third plug 422 connecting the second high-concentration impurity diffusion layer 411 and the wiring 423 on the second interlayer insulating film 421 to each other is formed through the first interlayer insulating film 412 and the second interlayer insulating film 421. Therefore, before the formation of the capacitor upper electrode 419, more specifically, simultaneously with the formation of the first plug 413 connecting the memory cell transistor and the capacitor lower electrode 415 to each other, the second plug 414 connecting the conductive hydrogen barrier film 420 and the second high-concentration impurity diffusion layer 411 to each other via the third side wall 420b can be formed through the first interlayer insulating film 412. Thus, the capacitor upper electrode 419 and the wiring 423 can be electrically connected to each other via the conductive hydrogen barrier film 420, the second plug 414, the second high-concentration impurity diffusion layer 411 and the third plug 422. In other words, the capacitor upper electrode 419 and the wiring 423 can be electrically connected to each other by using the second plug 414 and the second high-concentration impurity diffusion layer 411, which are formed in advance below the capacitive element. Therefore, it is not necessary, after the formation of the capacitor upper electrode 419, to form a contact hole for forming a plug therein that directly connects the capacitor upper electrode 419 and the wiring 423 to each other, thereby preventing the capacitor upper electrode 419 from being exposed to a hydrogen atmosphere or a reducing atmosphere. As a result, even when a Pt film having a strong catalytic function is used as the capacitor upper electrode 419, deterioration of the characteristics of the ferroelectric film forming the capacitor insulative film 418 is prevented, thereby improving the reliability of the ferroelectric memory.

Moreover, according to the variation of the fourth embodiment, the capacitive element including the capacitor lower electrode 415, the capacitor insulative film 418 and the capacitor upper electrode 419 is always covered by the conductive hydrogen barrier film 420, thereby improving the reduction resistance of the capacitive element.

Moreover, according to the variation of the fourth embodiment, the capacitor lower electrode 415 having an oxygen barrier property covers the upper surface of the first plug 413, while the connection pad 416 having an oxygen barrier property covers the upper surface of the second plug 414. Thus, it is possible to prevent the first plug 413 and the second plug 414 from being oxidized when sintering the ferroelectric film forming the capacitor insulative film 418 in an oxygen atmosphere.

Moreover, according to the variation of the fourth embodiment, the connection pad 416 is formed simultaneously with the formation of the capacitor lower electrode 415 by patterning a conductive film used as a material of the capacitor lower electrode 415 and having an oxygen barrier property so as to cover the entire upper surface of the second plug 414, thereby preventing the second-plug 414 from being oxidized, without increasing the number of manufacturing steps. Moreover, since the conductive third side wall 420b is formed on the side surface of the conductive hydrogen barrier film 420 so as to be connected to the connection pad 416, the conductive hydrogen barrier film 420 and the second plug 414 can be connected to each other via the third side wall 420b and the connection pad 416.

Moreover, according to the variation of the fourth embodiment, the second conductive film to be the conductive hydrogen barrier film 420 is patterned using the same mask pattern that is used for patterning the insulative film to be the capacitor insulative film 418 and the first conductive film to be the capacitor upper electrode 419, thereby reducing the number of mask patterns to be used in the manufacturing process.

Moreover, according to the variation of the fourth embodiment, the insulative film 417 is embedded in a region between adjacent capacitor lower electrodes 415 or a region between the capacitor lower electrode 415 and the connection pad 416 so that the upper surface thereof is coplanar with the upper surfaces of the capacitor lower electrode 415 and the connection pad 416. Therefore, the step of depositing the capacitor insulative film 418, etc., can be performed on a flat base surface, thereby improving the reliability of the capacitive element, i.e., the reliability of the ferroelectric memory.

Moreover, in the variation of the fourth embodiment, if a surface portion of the second high-concentration impurity diffusion layer 411 is silicified into a silicide layer, and the silicide layer is used as the conductive layer connecting the second plug 414 and the third plug 422 to each other, the following effect can be obtained. That is, the resistance of the conductive layer can be reduced as compared to a case where a polysilicon layer formed on the semiconductor substrate 400, or the like, is used as the conductive layer connecting the second plug 414 and the third plug 422 to each other.

Note that in the variation of the fourth embodiment, it is preferred that the third side wall 420b has a hydrogen barrier property. In this way, the entirety of the capacitive element including the capacitor lower electrode 415, the capacitor insulative film 418 and the capacitor upper electrode 419 can be reliably covered by the hydrogen barrier film, thereby improving the reduction resistance of the capacitive element. Moreover, in a case where the same material as the conductive hydrogen barrier film 420 is used as a material of the third side wall 420b, it is preferred that the second conductive film to be the conductive hydrogen barrier film 420 is deposited to a large thickness.

Moreover, while tungsten is used as a material of the first plug 413, the second plug 414 or the third plug 422, etc., in the variation of the fourth embodiment, polysilicon, or the like, may alternatively be used.

Moreover, in the variation of the fourth embodiment, it is preferred that the capacitor lower electrode 415 is a layered film including a lower layer film (functioning as an adhesion layer) and an upper layer film, wherein the lower layer film is a TiON film having a low oxygen content, a TiN film, a Ti-containing alloy film, or the like, and the upper layer film is a Pt film or a Pt-containing alloy film that is highly resistant to oxidization, an Ru film or an Ir film whose oxide has an oxygen barrier property and is electrically conductive, an $RuO_2$ film or an $IrO_2$ film, or the like.

Moreover, in the variation of the fourth embodiment, it is preferred that the insulative film 417 embedded between adjacent capacitor lower electrodes 415 is an $SiO_2$ film, an $Si_3N_4$ film, an SiON film, or the like.

Moreover, in the variation of the fourth embodiment, it is preferred that a PZT type material, an SBT type material, or the like, is used as the material of the ferroelectric film forming the capacitor insulative film 418.

Moreover, in the variation of the fourth embodiment, it is preferred that the capacitor upper electrode 419 is at least partially a Pt film or a Pt-containing alloy film that is highly resistant to oxidization, an Ru film or an Ir film whose oxide has an oxygen barrier property and is electrically conductive, an $RuO_2$ film or an $IrO_2$ film, or the like. In this way, it is possible to sufficiently grow the crystal of the ferroelectric film forming the capacitor insulative film 418.

Moreover, in the variation of the fourth embodiment, it is preferred that a Ti film, a Ta film, a TiON film, a TiN film, a TaN film, a TiAlN film, a TiAlON film, or an alloy film containing Ti, Ta, TiON, TiN, TaN, TiAlN, or TiAlON, is used as the conductive hydrogen barrier film 420. In this way, it is possible to utilize the hydrogen occluding nature of Ti or Ta to prevent hydrogen from diffusing into the capacitor upper electrode 419, thereby reliably improving the reduction resistance of the capacitive element. Moreover, since the conductivity of the conductive hydrogen barrier film 420 is reliably ensured, it is also reliably ensured that the capacitor upper electrode 419 and the second plug 414 are electrically connected to each other via the conductive hydrogen barrier film 420.

Moreover, in the variation of the fourth embodiment, a control transistor including the second gate electrode 408, etc., is formed in a non-memory cell region on the semiconductor substrate 400. However, in a ferroelectric memory whose circuit configuration does not require a control transistor, only the second high-concentration impurity diffusion layer 411 may be formed in the non-memory cell region on the semiconductor substrate 400. In such a case, a silicide layer may be formed in a surface portion of the second high-concentration impurity diffusion layer 411.

Moreover, in the variation of the fourth embodiment, the upper surface of the second plug 414 is covered by the connection pad 416 having an oxygen barrier property. Alternatively, the connection pad 416 may be omitted when, for example, the second plug 414 is made of a material having an oxygen barrier property. In this way, the degree of integration of the ferroelectric memory can be improved. In such a case, it is preferred that the third side wall 420b covers at least a portion of the upper surface of the second plug 414.

Moreover, in the variation of the fourth embodiment, the insulative film 417 is embedded in a region between adjacent capacitor lower electrodes 415 or a region between the capacitor lower electrode 415 and the connection pad 416. Alternatively, the insulative film 417 may be omitted.

Moreover, while the ferroelectric film to be the capacitor insulative film 418, the first conductive film to be the capacitor upper electrode 419 and the second conductive film to be the conductive hydrogen barrier film 420 are patterned using the same mask pattern in the variation of the fourth embodiment, the conductive films and the ferroelectric film may alternatively be patterned using different mask patterns.

Moreover, in the variation of the fourth embodiment, the capacitor insulative film 418 is formed so as to cover the upper surface of the capacitor lower electrode 415 but not to reach the area of the connection pad 416. Alternatively, the capacitor insulative film 418 may be formed so that the edge thereof is located within the area of the connection pad 416. In this way, it is possible to form the capacitor insulative film 418 while preventing step formation due to over-etching, by using, as the material of the connection pad 416, a conductive film having a large etching selectivity ratio with respect to the insulative film to be the capacitor insulative film 418, and patterning the insulative film using the connection pad 416 as an etching stopper.

Moreover, in the variation of the fourth embodiment, the wiring 423 is formed on the second interlayer insulating film 421 so as to be connected to the third plug 422. Alternatively, the wiring 423 may be embedded in the second interlayer insulating film 421 so as to be connected to the third plug 422.

What is claimed is:

1. A ferroelectric memory, comprising:
    a transistor formed in one region on a semiconductor substrate;
    a conductive layer formed in another region on the semiconductor substrate;
    a first interlayer insulating film formed on the semiconductor substrate including the transistor and the conductive layer;
    a capacitor lower electrode formed on the first interlayer insulating film;
    a capacitor insulative film made of a ferroelectric film and formed on the capacitor lower electrode;
    a capacitor upper electrode formed on the capacitor insulative film;
    a conductive hydrogen barrier film formed on the capacitor upper electrode so as to extend beyond an area of the capacitor upper electrode;
    a second interlayer insulating film formed on the first interlayer insulating film including the conductive hydrogen barrier film;
    a wiring formed on the second interlayer insulating film;
    a first plug formed through the first interlayer insulating film so as to connect the transistor and the capacitor lower electrode to each other;
    a second plug formed through the first interlayer insulating film so as to electrically connect the conductive layer and the conductive hydrogen barrier film to each other; and
    a third plug formed through the first interlayer insulating film and the second interlayer insulating film so as to connect the conductive layer and the wiring to each other.

2. The ferroelectric memory of claim 1, wherein the conductive layer is an impurity diffusion layer formed in a surface portion of the semiconductor substrate, or a silicide layer formed in a surface portion of the impurity diffusion layer.

3. The ferroelectric memory of claim 1, wherein:
    the first interlayer insulating film includes a lower layer film and an upper layer film formed on the lower layer film; and
    the conductive layer is formed between the lower layer film and the upper layer film.

4. The ferroelectric memory of claim 1, wherein at least a portion of the capacitor upper electrode is made of a Pt film or a Pt-containing alloy film.

5. The ferroelectric memory of claim 1, wherein the conductive hydrogen barrier film is made of a Ti film, a Ta film, a TiON film, a TiN film a TaN film, a TiAln film, a TiAlON film, or an alloy film containing Ti, Ta, TiON, TiN, TaN, TiAlN, or TiAlON.

* * * * *